(12) United States Patent
Sasaki et al.

(10) Patent No.: US 7,820,361 B2
(45) Date of Patent: Oct. 26, 2010

(54) LITHOGRAPHIC PRINTING PLATE PRECURSOR AND METHOD FOR PREPARATION OF LITHOGRAPHIC PRINTING PLATE

(75) Inventors: Tomoya Sasaki, Haibara-gun (JP); Hidekazu Oohashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 236 days.

(21) Appl. No.: 11/845,350

(22) Filed: Aug. 27, 2007

(65) Prior Publication Data

US 2008/0070158 A1 Mar. 20, 2008

(30) Foreign Application Priority Data

Aug. 25, 2006 (JP) .............................. 2006-229244

(51) Int. Cl.
G03F 7/36 (2006.01)
G03F 7/11 (2006.01)
G03F 7/033 (2006.01)

(52) U.S. Cl. .............. 430/271.1; 430/276.1; 430/281.1; 430/285.1; 430/288.1; 430/910; 430/302; 430/286.1; 430/287.1; 430/283.1

(58) Field of Classification Search ................ 430/276.1
See application file for complete search history.

(56) References Cited

U.S. PATENT DOCUMENTS

| 5,073,477 | A | * | 12/1991 | Kusuda et al. ........... 430/287.1 |
| 5,230,987 | A | * | 7/1993 | Kawanami et al. ....... 430/284.1 |
| 5,861,232 | A | * | 1/1999 | Kanda et al. ............. 430/281.1 |
| 2004/0013968 | A1 | | 1/2004 | Teng |
| 2006/0150846 | A1 | * | 7/2006 | Sonokawa ............... 101/450.1 |
| 2006/0166137 | A1 | * | 7/2006 | Mitsumoto et al. ....... 430/270.1 |
| 2007/0072116 | A1 | * | 3/2007 | Yamasaki et al. ........ 430/270.1 |

FOREIGN PATENT DOCUMENTS

| EP | 1-630-618 A2 | 3/2006 |
| EP | 1-674-928 A2 | 6/2006 |
| EP | 1-767-352 A2 | 3/2007 |
| EP | 1767352 A2 * | 3/2007 |
| EP | 1-798-031 A2 | 6/2007 |
| JP | 2002-365789 A | 12/2002 |
| JP | 2006-039468 A | 2/2006 |
| JP | 2006-078999 A | 3/2006 |
| JP | 2006-239860 A | 9/2006 |
| WO | 2005-111727 A1 | 11/2005 |
| WO | WO 2005/111727 A1 * | 11/2005 |

* cited by examiner

Primary Examiner—Cynthia Hamilton
(74) Attorney, Agent, or Firm—Sughrue Mion, PLLC

(57) ABSTRACT

A lithographic printing plate precursor includes: a support; and a photosensitive layer containing (A) an initiator compound, (B) a polymerizable compound and (C) a binder, wherein the photosensitive layer or other layer in contact with the support contains as (D) a component different from the component (C), a copolymer containing (a1) a repeating unit having at least one ethylenically unsaturated bond introduced through an ion pair and (a2) a repeating unit having at least one functional group capable of interacting with a surface of the support.

10 Claims, 1 Drawing Sheet

LITHOGRAPHIC PRINTING PLATE PRECURSOR AND METHOD FOR PREPARATION OF LITHOGRAPHIC PRINTING PLATE

FIELD OF THE INVENTION

The present invention relates to a lithographic printing plate precursor and a method for preparation of a lithographic printing plate.

BACKGROUND OF THE INVENTION

In general, a lithographic printing plate has a surface composed of an oleophilic image area and a hydrophilic non-image area. Lithographic printing is a printing method comprising supplying alternately dampening water and oily ink on the surface of lithographic printing plate, making the hydrophilic non-image area a dampening water-receptive area (ink unreceptive area) and depositing the oily ink only to the oleophilic image area by utilizing the nature of the dampening water and oily ink to repel with each other, and then transferring the ink to a printing material, for example, paper.

In order to produce the lithographic printing plate, a lithographic printing plate precursor (PS plate) comprising a hydrophilic support having provided thereon an oleophilic photosensitive layer (image-recording layer) has heretofore been broadly used. Ordinarily, a lithographic printing plat is obtained by conducting plate making by a method of exposing the lithographic printing plate precursor through an original, for example, a lith film and then treating the exposed lithographic printing plate precursor to remove the image-recording layer in the unnecessary non-image area by dissolving with a an alkaline developer or an organic solvent thereby revealing a surface of the hydrophilic support to form the non-image area while leaving the image-recording layer in the image area.

In the hitherto known plate-making process of lithographic printing plate precursor, after the exposure, the step of removing the unnecessary image-recording layer by dissolving, for example, with a developer is required. However, it is one of the subjects to simplify such an additional wet treatment described above. As one means for the simplification, it has been desired to conduct the development with a nearly neutral aqueous solution or simply with water.

On the other hand, digitalized technique of electronically processing, accumulating and outputting image information using a computer has been popularized in recent years, and various new image outputting systems responding to the digitalized technique have been put into practical use. Correspondingly, attention has been drawn to a computer-to-plate technique of carrying the digitalized image information on highly converging radiation, for example, laser light and conducting scanning exposure of a lithographic printing plate precursor with the light thereby directly preparing a lithographic printing plate without using a lith film. Thus, it is one of the important technical subjects to obtain a lithographic printing plate precursor adaptable to the technique described above.

Based on the background described above, adaptation of plate making operation to both simplification and digitization has been demanded strongly more and more than ever before.

In response to such a demand, for instance, it is described in JP-A-2002-365789 (the term "JP-A" as used herein means an "unexamined published Japanese patent application") that by incorporating a compound having an ethylene oxide chain into an image-forming layer of a lithographic printing plate precursor comprising a hydrophilic support and the image-forming layer containing a hydrophobic precursor a hydrophilic resin and a light to heat converting agent the lithographic printing plate precursor enables printing after conducting exposure and wet development processing using as a developer, water or an appropriate aqueous solution, besides on-machine development.

Also, a processing method of lithographic printing plate precursor is described in U.S. Patent Publication No. 2004/0013968 which comprises preparing a lithographic printing plate precursor comp g (i) a hydrophilic support and (ii) an oleophilic heat-sensitive layer which contains a radical-polymerizable ethylenically unsaturated monomer, a radical polymerization initiator and an infrared absorbing dye, is hardened with infrared laser exposure and is developable with an aqueous developer containing 60% by weight or more of water and hang pH of 2.0 to 10.0, exposing imagewise the lithographic printing plate precursor with an infrared laser, and removing the unhardened region of the heat-sensitive layer with the aqueous developer.

Also, it is described in JP-A-2006-78999 that a lithographic printing plate precursor which has high sensitivity and good printing durability and is excellent in stain resistance in the non-image area is obtained by incorporating a binder having an ethylenically unsaturated bond and a functional group capable of interacting with a surface of support into an image-recording layer containing a polymerization initiator, a polymerizable compound and a binder which is soluble or swellable in water or an aqueous a solution or other layer, under conditions using an alkali developer. Further, in JP-A-2006-39468, a method for preparation of a lithographic printing plate is described which comprises imagewise exposure of a lithographic printing plate precursor having an image-recording layer on a support, and then a development step wherein the recording surface of the exposed lithographic printing plate precursor is rubbed with a rubbing member in the presence of a developer having pH of 2 to 10 in a development processing portion equipped with the rubbing member to remove an unexposed area of the image-recording layer. Moreover, in WO 2005/111727, a method for preparation of a printing plate is described which comprises providing a photopolymerizable layer on a hydrophilic support, exposing the photopolymerizable layer, and then a removing step of the unexposed area of the photopolymerizable layer with a gumming solution.

SUMMARY OF THE INVENTION

In order to maintain the developing property in an aqueous developer having pH of 2 to 10, however, although it is necessary for the photosensitive layer to be hydrophilic or highly water-permeable, the photosensitive layer cored with the imagewise exposure is insufficient in the water-resistance and film strength and has a low adhesion property to a support and consequently, printing durability is still insufficient. When the hydrophilicity of the unexposed photosensitive layer is lowered or the adhesion property to a support is increases in order to improve the printing durability, problems occur in that the developing property decreases or stain resistance in the non-image area is degraded. The present invention is intended to solve these problems.

Specifically, an object of the invention is to provide a lithographic printing plate precursor which is especially developable with an aqueous developer having pH of 2 to 10, is prevented from the occurrence of stain in the non-image area and is excellent in the printing durability and a method for preparation of a lithographic printing plate using the lithographic printing plate precursor.

The inventors have found that the above-described objects can be achieved by incorporating a specific copolymer into a photosensitive layer or other layer. Specifically, the invention includes the following constructions.

(1) A lithographic printing plate precursor comprising a support and a photosensitive layer containing at least (A) an initiator compound, (B) a polymerizable compound and (C) a binder, wherein the photosensitive layer or other layer in contact with the support contains as (D) a component different from the component (C), a copolymer containing (a1) a repeating unit having at least one ethylenically unsaturated bond introduced through an ion pair and (a2) a repeating unit having at least one functional group capable of interacting with a surface of the support.

(2) The lithographic printing plate precursor as described in (1) above, wherein the other layer is an undercoat layer provided between the support and the photosensitive layer.

(3) The lithographic printing plate precursor as described in (1) or (2) above, wherein at least one of structures including the ethylenically unsaturated bond in the repeating unit (a1) is a (meth)acrylic acid ester group, a (meth)acrylic amido group, an aromatic vinyl group or an allyl group.

(4) The lithographic printing plate precursor as described in any one of (1) to (3) above, wherein at least one of the functional groups capable of interacting with a surface of the support is a sulfonic acid group or a salt thereof, a phosphoric ester group or a salt thereof or a phosphonic acid or a salt thereof.

(5) The lithographic printing plate precursor as described in any one of (1) to (4) above, wherein at least one of the ion pairs in the repeating unit (a1) is a combination of an anion of a group selected from a sulfonic acid group, a phosphoric acid group or a phosphoric acid group with an ammonium cation.

(6) The lithographic printing plate precursor as described in any one of (1) to (5) above, wherein the component (D) further contains (a3) a repeating unit having at least one hydrophilic group other than the repeating unit (a1).

(7) The lithographic printing plate precursor as described in any one of (1) to (6) above, wherein the photosensitive layer fierier contains (E) a sensing dye having an absorption maximum in a wavelength range of 350 to 450 nm.

(8) T11 lithographic printing plate precursor as described in any one of (1) to (6) above, wherein an acid value of the binder (C) is 0.3 meq/g or less.

(9) A method for preparation of a lithographic printing plate comprising exposing the lithographic printing plate precursor as described in (8) above using an exposure apparatus equipped with a light source having an oscillation wavelength in a range of 350 to 450 nm and then rubbing a surface of the exposed lithographic printing plate precursor with a robing member in the presence of a developer having pH of 2 to 10 in an automatic processor equipped with the rubbing member to remove an unexposed area of the photosensitive layer.

The invention also includes the following preferable embodiments.

(10) The lithographic printing plate precursor as described in any one of (1) to (8) above wherein at least one of the functional groups capable of interacting with a Lace of the support in the repeating unit (a2) is an ammonium group, a sulfonic acid group or a salt thereof, a phosphoric ester group or a salt thereof, a phosphonic acid group or a salt thereof, a boric acid group or a β-diketone group.

(11) The lithographic printing plate precursor as described in (5) above, wherein any atom directly connected to the nitrogen atom of the ammonium cation in the repeating unit (a1) is not a hydrogen atom.

(12) The lithographic printing plate precursor as described in any one of (1) to (8) above, wherein the binder (C) is at least one member selected from a (meth)acryl copolymer having a crosslinkable group in its side chain and a polyurethane on having a crosslinkable group in its side chain.

(13) The method for preparation of a lithographic printing plate as described in (9) above, wherein the pH of the developer is from 3 to 8.

According to the present invention, a lithographic printing plate precursor which is especially developable with an aqueous developer having pH of 2.0 to 10.0, is prevented from the occurrence of stain in the non-image area and is excellent in the printing durability, and a method for preparation of a lithographic printing plate using the lithographic printing plate precursor can be provided.

DESCRIPTION OF REFERENCE NUMERALS AND SIGNS

Figure 1:
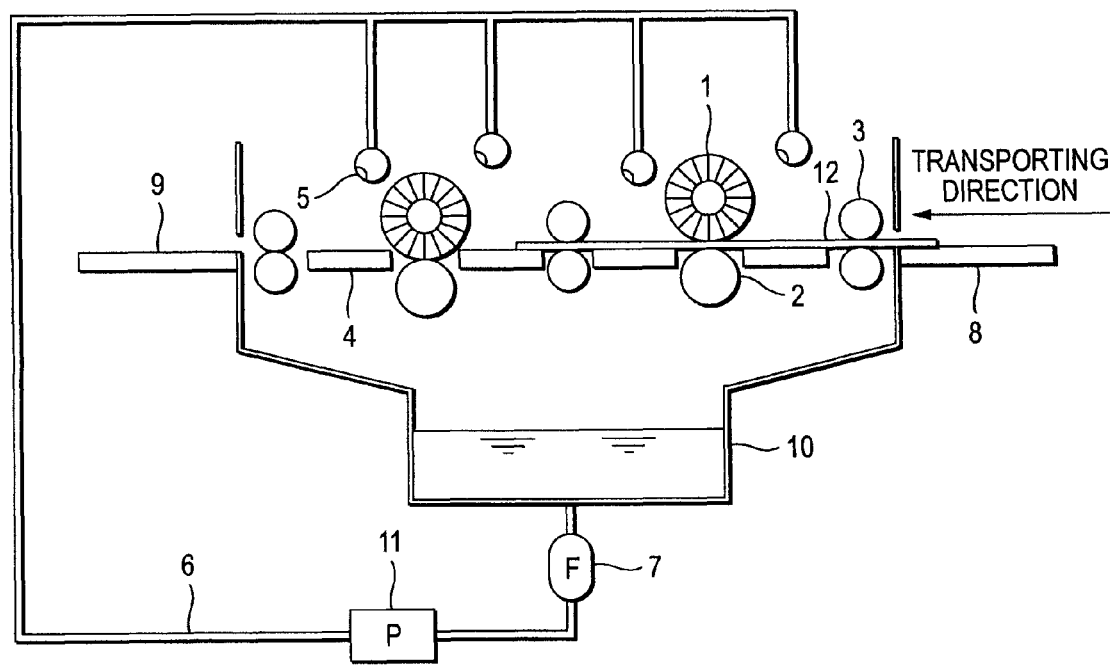
FIG. 1 shows a squire of an automatic development processor.

1: Rotating brush roller
2: Backing roller
3: Transport roller
4: Transport guide plate
5: Spray pipe
6: Pipe line
7: Filter
8: Plate supply table
9: Plate discharge table
10: Developer tank
11: Circulating pump
12: Plate

DETAILED DESCRIPTION OF THE INVENTION

[Lithographic Printing Plate Precursor]

<Photosensitive Layers>

The photosensitive layer of the lithographic printing plate precursor according to the invention contains (A) an initiator compound, (B) a polymerizable compound, (C) a binder, and as a component different from the component (C), (D) a copolymer containing (a1) a repeating unit having at least one ethylenically unsaturated bond introduced through an ion pair and (a2) a repeating unit having at least one functional group capable of interacting with a surface of the support. In the case wherein as the other layer, for example, an undercoat layer described hereinafter is provided between the support and the photosensitive layer, the photosensitive layer does not contain the component (D) but the component (D) may be incorporated into the undercoat layer. The photosensitive layer according to the invention may further contain other components, if desired. The constituting components of the photosensitive layer are described in more devil below.

(A) Initiator Compound

The initiator compound (polymerization initiator) for use in the invention is a compound which generates a radical with light energy or heat energy to initiate or accelerate polymerization of a compound having a polymerizable unsaturated group. The initiator compound according to the invention is appropriately selected to use, for example, from know polymerization initiators and compounds containing a bond having small bond dissociation energy.

The initiator compounds include, for example, organic halogen compounds, carbonyl compounds, organic peroxides, azo compounds, azido compounds, metallocene compounds, hexaarylbiimidazole compounds, organic boron compounds, disulfone compounds, oxime ester compounds and onium salt compounds.

The organic halogen compounds described above specifically include, for example, compounds described in Wakabayashi et al., *Bull. Chem. Soc. Japan*, 42, 2924 (1969), U.S. Pat. No. 3,905,815, JP-B46-405 (the term "JP-B" as used herein means an "examined Japanese patent publication"), JP-A48-3628, JP-A-53-133428, JP-A-55-32070, JP-A-60-239736, JP-A-61-169835, JP-A61-169837, JP-A-62-58241, JP-A-62-212401, JP-A-63-70243, JP-A63-298339 and M. P. Hutt, *Journal of Heterocyclic Chemistry* 1, No. 3 (1970). Among them, oxazole compounds and s-azine compounds each substituted with a trihalomethyl group are preferable.

More preferably, s-triazine derivatives in which at least one of mono-, di-or tri-halogen substituted methyl group is connected to the s-triazine ring and oxazole derivatives in which at least one of mono-, di-or tri-halogen substituted methyl group is connected to the oxazole ring are exemplified. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-(3,4-epoxyphenyl)-4,6-bis(trichloromethyl)-s-triazine, 2-[1-p-methoxyphenyl)-2,4-butadienyl]-4,6-bis(trichloromethyl)-s-triazine, 2-styryl-4,6-bis(trichloromethyl)-s-triazine, 2-(p-methoxystyryl-4,6-bis(trichloromethyl)-s-triazine, 2-(p-isopropyloxystyryl-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribomomethyl)-s-triazine and compounds shown below.

(I)-1

(I)-2

-continued (I)-3

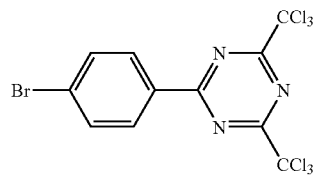

(I)-4

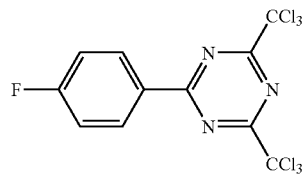

(I)-5

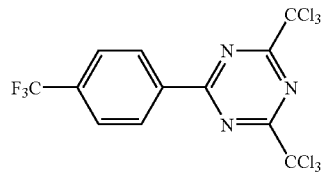

(I)-6

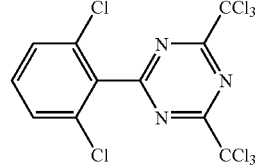

(I)-7

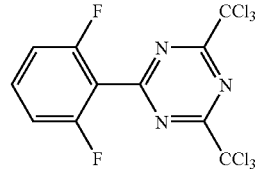

(I)-8

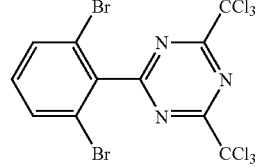

(I)-9

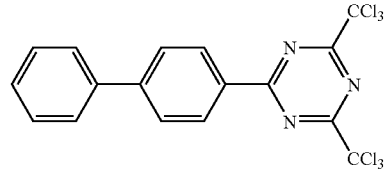

(I)-10

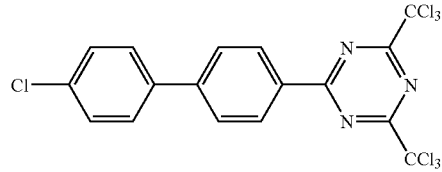

-continued

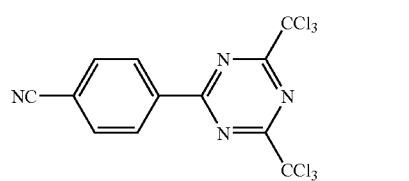
(I)-11

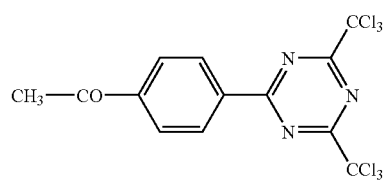
(I)-12

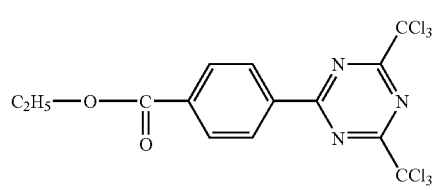
(I)-13

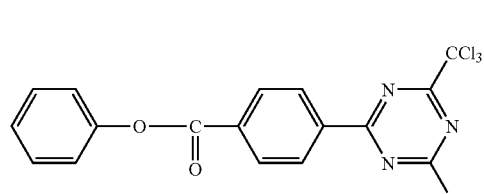
(I)-14

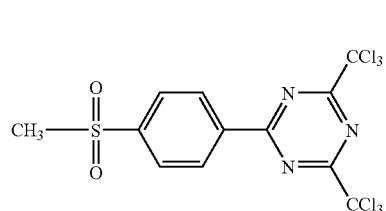
(I)-15

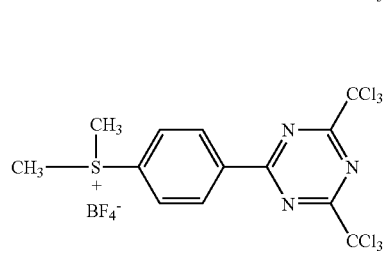
(I)-16

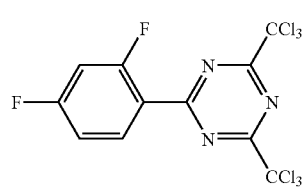
(I)-17

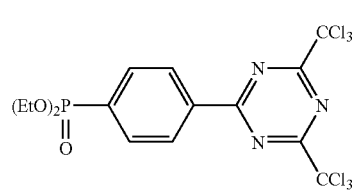
(I)-18

-continued

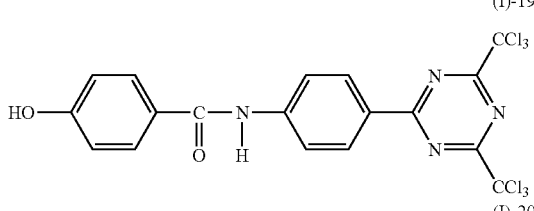
(I)-19

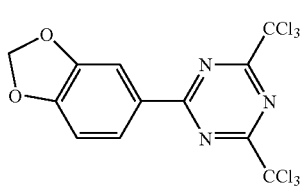
(I)-20

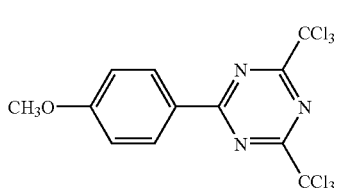
(I)-21

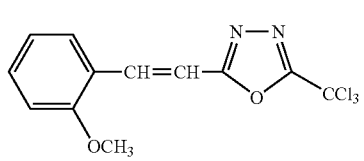
(I)-22

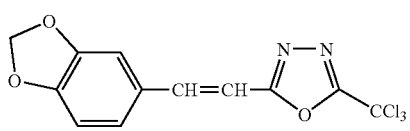
(I)-23

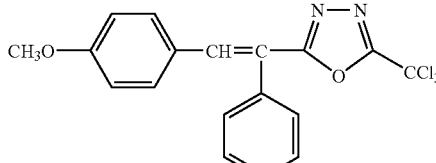
(I)-24

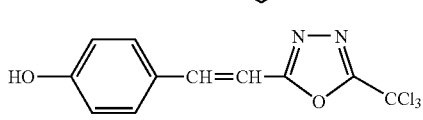
(I)-25

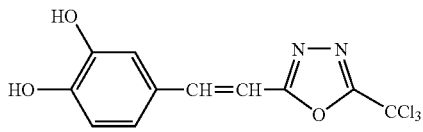
(I)-26

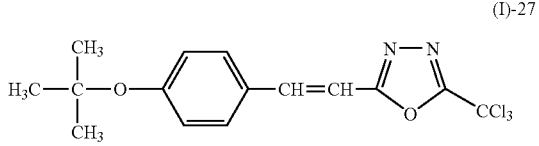
(I)-27

The carbonyl compounds described above include, for example, benzophenone derivatives, e.g., benzophenone, Michler's ketone, 2-methylbenzophenone, 3-methylbenzophenone, 4-methylbenzophenone, 2-chlorobenzophenone, 4-bromobenzophenone or 2-carboxybenzophenone, acetophenone derivatives, e.g., 2,2-dimethoxy-2-phenylacetophenone, 2,2-diethoxyacetophenone, 1-hydroxycyclohexylphenylketone, α-hydroxy-2-methylphenylpropane, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propane or 1,1,1-trichloromethyl-(p-butylphenyl)ketone, thioxantone derivatives, e.g., thioxantone, 2-ethylthioxantone, 2-isopropylthioxantone, 2-chlorothioxantone, 2,4-dimethylthioxantone, 2,4-dietylthioxantone or 2,4 diisopropylthioxantone, and benzoic acid ester derivatives, e.g., ethyl p-diethylaminobenzoate or ethyl p-diethylaminobenzoate.

The azo compounds described above include, for example, azo compounds described in JP-A-8-108621.

The organic peroxides described above include, for example, trimethyloyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butylhydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, peroxy succinic acid, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy dicarbonate, di(3-methyl-3-methoxybutyl)peroxy dicarbonate, tert-butylperoxy acetate, tert-butylperoxy pivalate, tert-butylperoxy neodecanoate, tert-butylperoxy octanoate-butylperoxy laurate, tersyl carbonate, 3,3',4,4'-tetra(tert-butylperoxycarbonyl)benzophenone, 3,3',4,4'-tetra(tert-hexylperoxycarbonyl)benzophenone, 3,3',4,4'-tetra(p-isopropylcumylperoxycarbonyl) benzophenone, carbonyl di(tert-butylperoxydihydrogen diphthalate) and carbonyl di(tert-hexylperoxydihydrogen diphthalate).

The metallocene compounds described above include, for example, various titanocene compounds described in JP-A-59-152396, JP-A-61-151197, JP-A-63-41484, JP-A-2-249, JP-A-2-4705 and JP-A-5-83588, for example, dicyclopentadienyl-Ti-bisphenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-triafluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl dimethylcyclopentadienyl-Ti-bis-2,4,6-tetrafluorophen-1-yl, dimethylcyclopentadienyl-Ti-bis-2,3,5,6-pentafluorophen-1-yl, dimethylcyclopentadienyl-Ti-bis-2,3,4,5,6-pentafluorophen-1-yl, or bis(cyclopentadienyl)-bis(2,6-difluoro-3-(pyr-1-yl)phenyl) titanium and iron-arene complexes described in JP-A-1-304453 and JP-A-1-152109.

The hexaarylbiimidazole compounds described above include, for example, various compounds described in JP-6-29285 and U.S. Pat. Nos. 3,479,185, 4,311,783 and 4,622,286, specifically, for example, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2-bis(o-methylphenyl)-4,4',5,5'-tetraphenylbiimidazole and 2,2'-bis(o-trifluoromethylphenyl)-4,4', 5,5'-tetraphenylbiimidazole.

The organic boron compounds described above include, for example, organic boric acid salts described in JP-A-62-143044, JP-A62-150242, JP-A-9-188685, JP-A-9-188686, IP-A-9-188710, JP-A-2000-131837, JP-A-2002-107916, Japanese Patent 2764769, JP-A-2002-116539 and Martin Kunz, Rad Tech '98, Proceeding, April 19-22 (1998), Chicago, organic boron sulfonium complexes or organic boron oxosulfonium complexes described in JP-A-6-157623, JP-A6-175564 and JP-A-6-175561, organic boron iodonium complexes described in JP-A-6-175554 and JP-A-6-175553, organic boron phosphonium complexes described in JP-A-9-188710, and organic boron transition metal coordination complexes described in JP-A-348011, JP-A-7-128785, JP-A-7-140589, JP-A-7-306527 and JP-A-7-292014.

The disulfone compounds described above include, for example, compounds described in JP-A-61-166544 and JP-A-2002-328465.

The oxime ester compounds described above include, for example, compounds described in J. C. S. Perkin II, 1653-1660 (1979), J. C. S. Perkin II, 156-162 (1979), Journal of Photopolymer Science and Technology, 202-232 (1995) and JP-A-2000-66385, and compounds described in JP-A-2000-80068. Specific examples thereof include compounds represented by the following structural formulae:

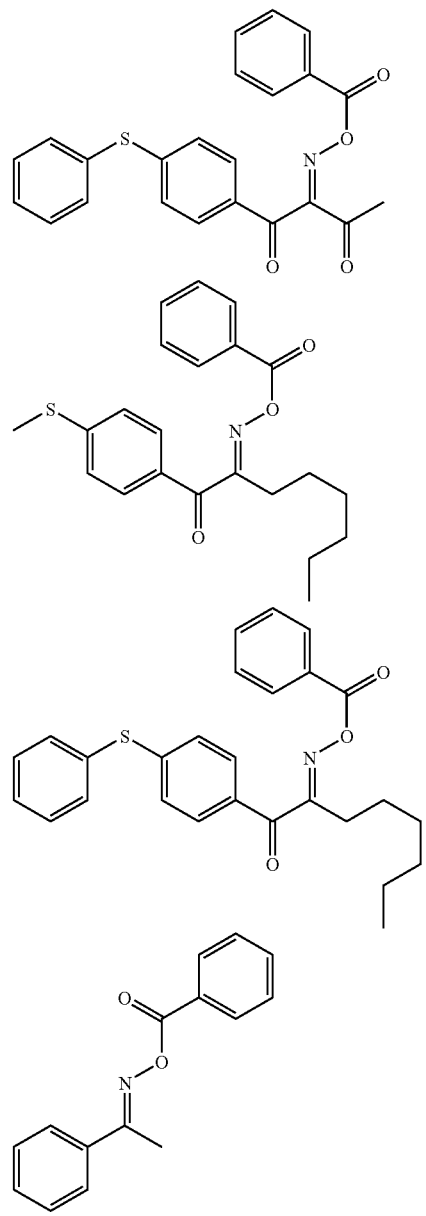

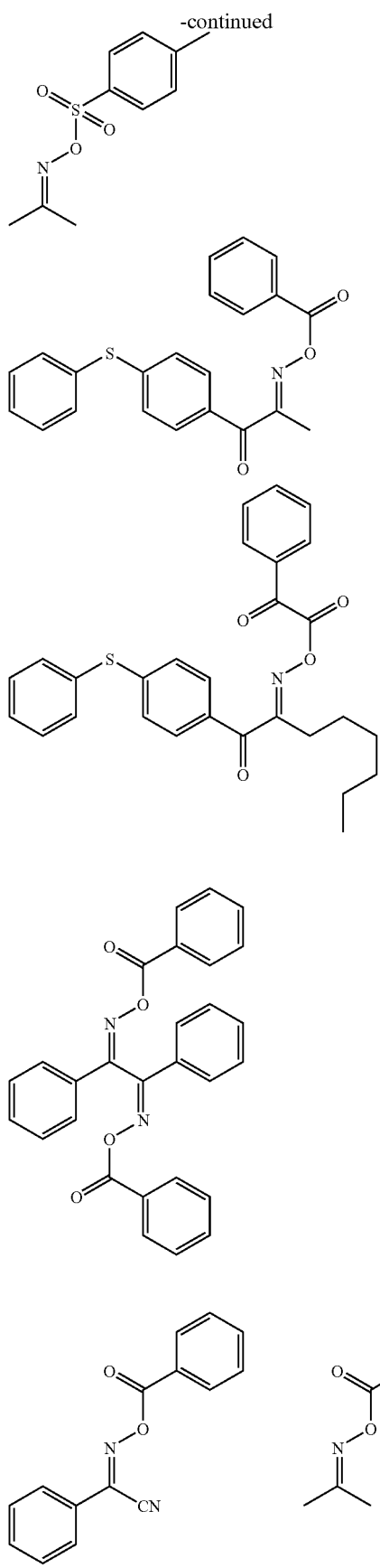

-continued

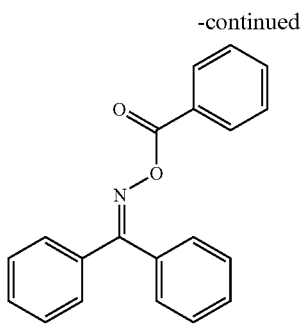

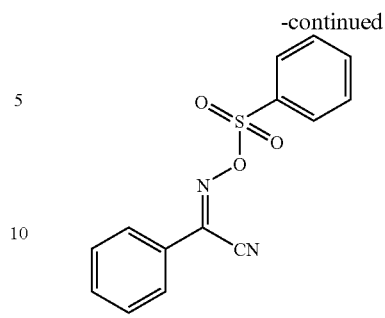

The onium salt compounds described above include onium salts, for example, diazonium salts described in S. I. Schlesinger, *Photogr. Sci. Eng.* 18, 387 (1974) and T. S. Bal et al., *Polymer*, 21, 423 (1980), ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Pat. Nos. 339,049 and 410,201, JP-A-150848 and JP-A-2-296514, sulfonium salts described in European Patents 370, 693, 390,214, 233,567, 297,443 and 297,442, U.S. Pat. Nos. 4,933,377, 161,811, 410,201, 339,049, 4,760,013, 4,734,444 and 2,833,827 and German Patents 2,904,626, 3,604,580 and 3,604,581, selenonium salts described in J. V. Crivello et al., *Macromolecules*, 10 (6), 1307 (977) and J. V. Crivello et al., *J. Polymer Sci. Polymer Chem. Ed.*, 17, 1047 (1979), and arsonium salts described in C. S. Wen et al., *Teh Proc. Conf. Rad. Curing ASIA*, p. 478, Tokyo, October (1988).

In the invention, the onium salt functions not as an acid generator, but as an ionic radical polymerization initiator.

The onium salts preferably used in the invention include onium salts represented by the following formulae (RI-I) to (RI-III):

(RI-I)

(RI-II)

(RI-III)

In formula (RI-I), $Ar_{11}$ represents an aryl group having 20 or less carbon atoms, which may have 1 to 6 substituents. Preferable examples of the substituent include an allyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylimino group having from 1 to 12 carbon atoms, an alkylamido group or arylamido having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z_{11}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thosulfonate ion and a sulfate ion. Among them, a perchlorate ion, a hexafluorophosphate ion, a tetrafluoroborate ion, a sulfonate ion and a sulfinate ion are preferred in view of stability.

In the formula (RI-II), $Ar_{21}$ and $Ar_{22}$ each independently represents an aryl group having 20 or less carbon atoms, which may have 1 to 6 substituents. Preferable examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group laving from 1 to 12 carbon atoms, an aryloxy group having from 1 to 12 carbon atoms, a halogen atom, an alkylamino group having from 1 to 12 carbon atoms, a dialkylimino group having from 1 to 12 carbon atoms, an alkylamido group or arylamido group having from 1 to 12=bon atoms, a carbonyl group, a carboxyl group, a cyano group, a sulfonyl group, an thioalkyl group having from 1 to 12 carbon atoms and an thioaryl group having from 1 to 12 carbon atoms. $Z_{21}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thosulfonate ion, a sulfate ion and a carboxylate ion. Among them, a perchlorate ion, a hexafluorophosphate ion, a tetrafluoroborate ion, a sulfonate ion, a sulfinate ion and a carboxylate ion are preferred in view of stability and reactivity.

In the formula (RI-II), $R_{31}$, $R_{32}$ and $R_{33}$ each independently represents an aryl group having 20 or less carbon atoms, which may have 1 to 6 substituents, an alkyl group, an alkenyl group or an alkynyl group. Among them, the aryl group is preferred in view of reactivity and stability. Preferable examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylimino group having from 1 to 12 carbon atoms, an alkylamido group or arylamido group having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z_{31}^-$ presents a monovalent anion. Specific examples of the monovalent anion include a halogen ion, a perchlorate ion, a hexafluorophosphate ion, a tetrafluoroborate ion, a sulfonate ion, a sulfinate ion, a thosulfonate ion, a sulfate ion and a carboxylate ion. Among them, a perchlorate ion, a hexafluorophosphate ion, a tetrafluoroborate ion, a sulfonate ion, a sulfinate ion and a carboxylate ion are preferred in view of stability and reactivity. Carboxylate ions described in JP-A-2001-343742 are more preferable, and carboxylate ions described in JP-A-2002-148790 are particularly preferable.

Specific examples of the onium sat are set forth below, but the invention should not be construed as being limited thereto.

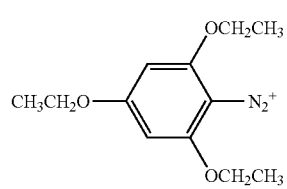

(N-1)

-continued

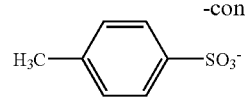

$PF_6^-$ (N-2)

(N-3)

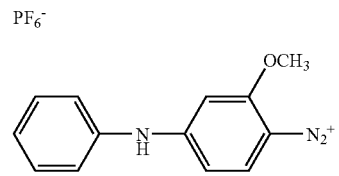

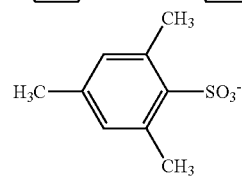

$ClO_4^-$ (N-4)

$PF_6^-$ (N-5)

(N-6)

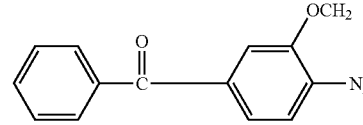  $CF_3SO_3^-$ $BF_4^-$ (N-7)

(N-8)

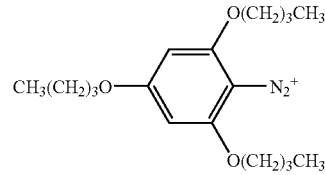

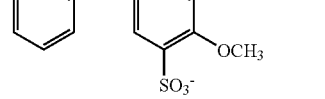

$ClO_4^-$ (N-9)

(N-10)

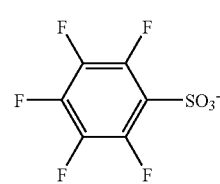

(N-11)

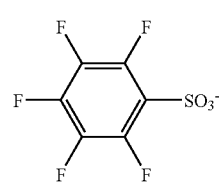

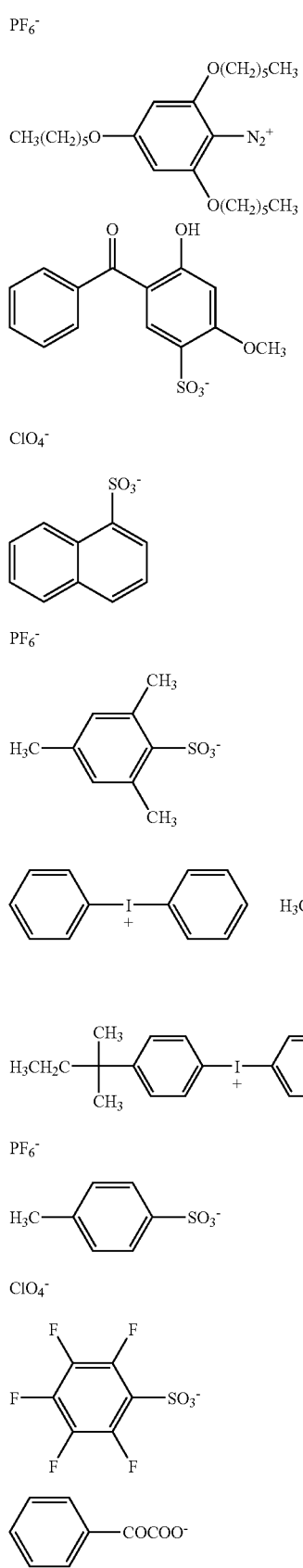

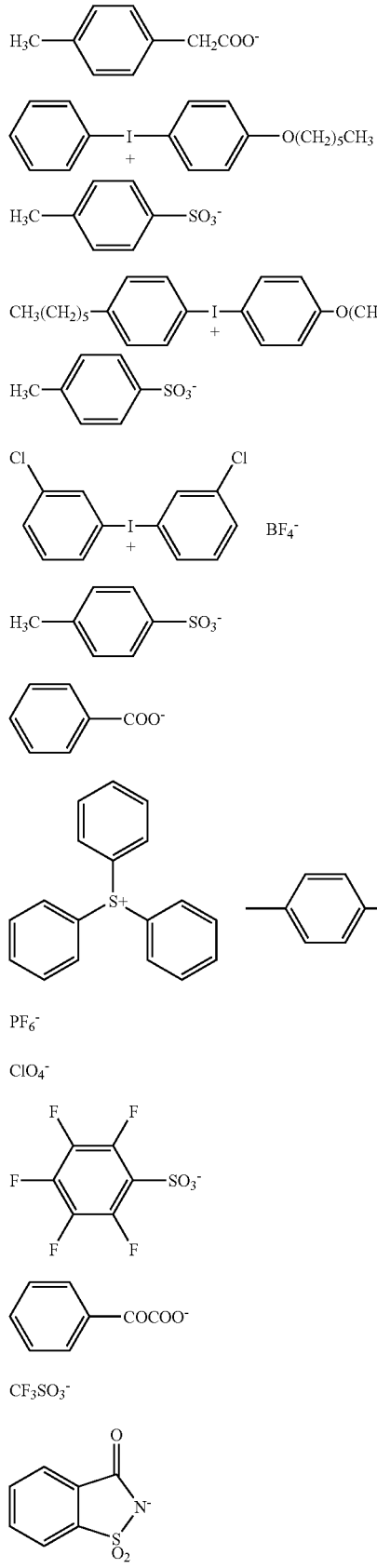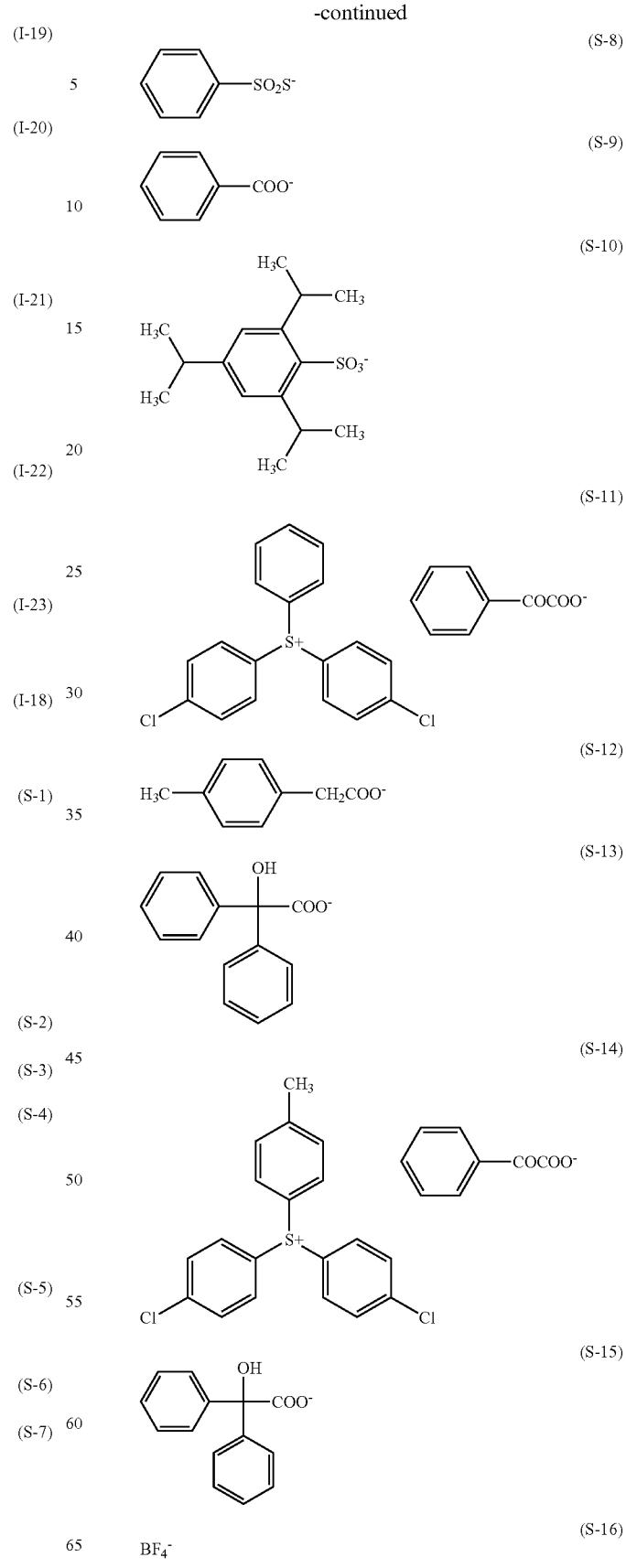

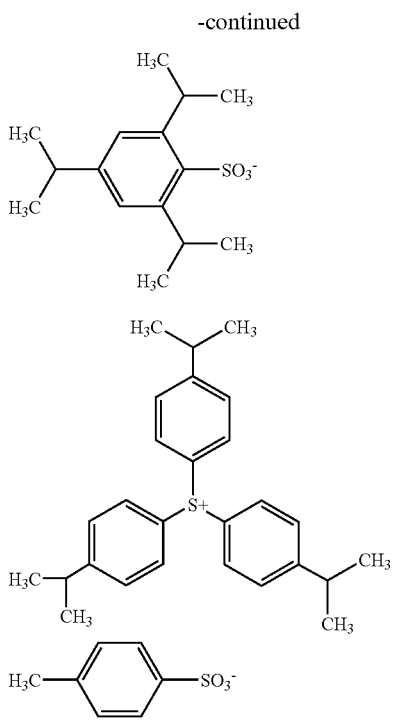

The polymerization initiator is not limited to those described above. In particular, the triazine type initiators, organic halogen compounds, oxime ester compounds, metallocene compounds, hexaarylbiimidazole compounds, organic boron compounds, diazonium salts, iodonium salts and sulfonium salts are more preferable from the standpoint of reactivity and stability The polymerization initiators may be used individually or in combination of two or more thereof. Further, the polymerization intiator may be added together with other components to one layer or may be added to a different layer separately provided. The polymerization initiator can be added preferably in an amount from 0.1 to 50% by weight more preferably from 0.5 to 30% by weight, particularly preferably from 0.8 to 20% by weight, based on the total solid content of the photosensitive layer.

(B) Polymerizable Compound

The polymerizable compound for use in the photosensitive layer according to the invention is an addition-polymerizable compound having at least one ethylenically unsaturated double bond, and it is selected from compounds having at least one, preferably two or more, terminal ethylenically unsaturated double bonds. Such compounds are widely known in the art and they can be used in the invention without any particular limitation. The compound has a chemical form, for example, a monomer, a prepolymer, specifically, a dimer, a trimer or an oligomer, or a copolymer thereof, or at hereof Examples of the monomer and copolymer thereof include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with an aliphatic polyhydric alcohol compound and amides of an unsaturated carboxylic acid with an aliphatic polyvalent amine compound are used. An addition reaction on product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of the unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol amine or thiol is also preferably used. In addition, compounds in which the unsaturated carboxylic acid described above is replaced by an unsaturated phosphonic acid, styrene, vinyl ether or the like can also be used.

Specific examples of the monomer, which is an ester of an aliphatic polyhydric alcohol compound with an unsaturated carboxylic acid, include acrylic acid esters, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, isocyanuric acid ethylene oxide (EO) modified triacrylate or polyester acrylate oligomer;

methacrylic acid esters, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl] dimethylmethane or bis[p-(methacryloxyethoxy)phenyl] dimethylmethane; itaconic acid esters, for example, ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate;

crotonic acid esters, for example, ethylene glycol dicrotonate, tetramethylene glycol dicrotonate, pentaerythritol dicrotonate or sorbitol tetracrotonate, isocrotonic acid esters, for example, ethylene glycol diisocrotonate, pentaerythritol diisocrotonate or sorbitol tetraisocrotonate;

and maleic acid esters, for example, ethylene glycol dimaleate, triethylene glycol dimaleate, pentaerythritol dimaleate and sorbitol tetramaleate.

Other examples of the ester, which can be preferably used, include aliphatic alcohol esters described in JP-B5147334 and JP-A-57-196231, esters having an aromatic skeleton described in JP-A-59-5240, JP-A-59-5241 and JP-A-2-226149, and esters containing an amino group described in JP-A-1-165613.

The above-described ester monomers can also be used as a mixture,

Specific examples of the monomer, which is an amide of an aliphatic polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide. Other preferred examples of the amide monomer include amides having a cyclohexylene structure described in JP-B-54-21726.

Urethane type addition-polymerizable compounds produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B-48-41708.

$$CH_2=C(R_4)COOCH_2CH(R_5)OH \quad (A)$$

wherein $R_4$ and $R_5$ each independently represents H or $CH_3$.

Also, urethane acrylates described in JP-A-51-37193, JP-B-2-32293 and JP-B-2-16765, and urethane compounds having an ethylene oxide skeleton described in JP-B-58-4986, JP-B-56-17654, JP-B-62-39417 and JP-B-62-39418 are preferably used. Further, a photosensitive composition having remarkably excellent photo-speed can be obtained by using an addition polymerizable compound having an amino structure or a sulfide structure in its molecule, described in JP-A63-277653, JP-A-3-260909 and JP-A-1-105238.

Other examples include polyfunctional acrylates and methacrylates, for example, polyester acrylates and epoxy acrylates obtained by reacting an epoxy resin with (meth) acrylic acid, described in JP-A48-64183, JP-B-49-43191 and JP-B-52-30490. Specific unsaturated compounds described in JP-B-4643946, JP-B-140337 and JP-B1-40336, and vinylphosphonic acid type compounds described in JP-A-2-25493 can also be exemplified. In some cases, structure containing a perfluoroalkyl group de bed in JP-A61-22048 can be preferably used. Moreover, photocurable monomers or oligomers described in *Nippon Secchaku Kyokaishi* (*Journal of Japan Adhesion Society*), Vol 20, No. 7, pages 300 to 308 (1984) can also be used.

Details of the method of using the polymerizable compound, for example, selection of the structure, individual or combination use or an amount added, can be appropriately determined in accordance with the characteristic design of the final lithographic printing plate precursor. For instance, the compound is selected from the following standpoints.

In view of the sensitivity, a structure having a large content of unsaturated group per molecule is preferred and in many cases, a difunctional or more functional compound is preferred. Also, in order to increase the strength of the image are, that is, hardened layer, a trifunctional or more functional compound is preferred. A combination use of compounds different in the functional number or in the kind of polymerizable group (for example, an acrylic acid ester, a methacylic acid ester, a styrene compound or a vinyl ether compound) is an effective method for controlling both the sensitivity and the strength.

The selection and use method of the polymerizable compound are also important factors for the compatibility and dispersibility with other components (for example, a binder polymer, a polymerization intiator or a coloring agent) in the photosensitive layer. For instance, the compatibility may be improved in some cases by using the compound of low purity or using two or more kinds of the compounds in combination. A specific structure may be selected for the purpose of improving an adhesion property to a support, a protective layer or the like described hereinafter. In addition, with respect to the method of using the polymerizable compound, the structure, blend and amount added can be appropriately selected by taking account of the degree of polymerization inhibition due to oxygen, resolution, fogging property, change in refractive index, surface tackiness and tee like. Further, depending on the case, a layer construction, for example, an undercoat layer or an overcoat layer, and a coating method, may also be considered.

The polymerizable compound is used preferably in a range of 5 to 75% by weight, more preferably in a range of 25 to 70% by weight, particularly preferably in a range of 30 to 60% by weight, based on the total solid content of the photosensitive layer.

(C) Binder

The binder for use in the photosensitive layer according to the invention is not particularly restricted and a binder having an acid value (acid content per g of polymer, indicated by the chemical equivalent number) of 0.3 meq/g or less is preferably used. The acid value of the binder is more preferably 0.1 meq/g or less. When the acid value exceeds 0.3 meq/g, problems, for example, deterioration of developing property (occurrence of residual layer) or decrease in printing durability due to increase in hydrophilicity may occur in some cases.

It is also preferred that the binder for use in the invention is substantially insoluble in water and an aqueous solution having pH of 10 or more. The solubility (polymer concentration at the sa ton dissolution) of the binder in water is preferably 1.0% by weight or less. The temperature for measurement of the above-described solubility is 25° C. which is temperature during conventional plate-making development.

By using such a binder, the film strength, water resistance and ink receptivity of the photosensitive layer are improved and increase in the printing durability can be achieved while maintaining good developing property in an aqueous developer.

As for the binder, conventionally known binders having the characteristics within the above-described ranges can be used without limitation as long as the performance of the lithographic printing plate precursor of the invention is not impaired, and a linear organic polymer having film-forming property is preferred.

Preferable examples of such a binder include a polymer selected from an acrylic resins a methacrylic resin, a styrene-based resin, a polyvinyl acetal resin, a polyurethane resin, a polyamide resin, an epoxy resin and a polyester resin. Among them, a vinyl copolymer, for example, an acrylic resin, a (meth)acrylic resin or a styrene-based resin is more preferable.

Such a vinyl copolymer can be obtained using known vinyl monomers by adjusting the kind and ratio of the monomers so as to fulfill the above-described characteristics (for example, acid value or solubility). As the vinyl monomer, for example (meth)acrylic acid esters, crotonic acid esters, vinyl esters, maleic acid diesters, fumaric acid diesters, itaconic acid diesters, (meth)acrylamides, vinyl ethers, styrenes and (meth)acrylonitriles are preferably used. Specific examples of the vinyl monomer include the following compounds.

Examples of the (meth)acrylic acid ester include methyl (meth)acrylate, ethyl (meth)acrylate, n-propyl (meth)acrylate, isopropyl (meth)acrylate, n-butyl (meth)acrylate, isobutyl (meth)acrylate, tert-butyl (meth)acrylate, n-hexyl (meth) acrylate, 2-ethylhexyl (meth)acrylate, acetoxyethyl (meth) acrylate, phenyl (meth)acrylate, 2 hydroxyethyl (meth) acrylate, 2-hydroxypropyl (meth)acrylate, 4-hydroxybutyl (meth)acrylate, 2-methoxyethyl (meth)acrylate, 2-ethoxyethyl (meth)acrylate, 2-(2-methoxyethoxy)ethyl (met)acrylate, cyclohexyl (meth)acrylate, benzyl (meth)acrylate, diethylene glycol mono methyl ether (meth)acrylate, diethylene glycol mono ethyl ether (meth)acrylate, diethylene glycol mono phenyl ether (meth)acrylate, triethylene glycol mono methyl ether (meth)acrylate, triethylene glycol mono ethyl ether (meth)acrylate, dipropylene glycol mono methyl ether (meth)acrylate, polyethylene glycol mono methyl ether (meth)acrylate, polypropylene glycol mono methyl ether (meth)acrylate, mono methyl ether (meth)acrylate of a copolymer of ethylene glycol and propylene glycol, N,N-dimethylaminoethyl (meth)acrylate, N,N-diethylaminoethyl (meth)acrylate and N,N-dimethylaminopropyl (meth)acrylate.

Specific examples of the crotonic acid ester include butyl crotonate and hexyl crotonate. Specific examples of the vinyl ester include vinyl acetate, vinyl propionate, vinyl butyrate, vinyl methoxyacetate and vinyl benzoate.

Specific examples of the maleic acid diester include dimethyl maleate, diethyl maleate and dibutyl maleate. Specific examples of the fumaric acid diester include dimethyl fumarate, diethyl fumarate and dibutyl fumarate. Specific examples of the itaconic acid diester include dimethyl itaconate, diethyl itaconate and dibutyl itaconate.

Specific examples of the (meth)acrylamide include (meth)acrylamide, N-methyl(meth)acrylamide, N-ethyl(meth)acrylamide, N-propyl(meth)acrylamide, N-n-butyl(meth)acrylamide, N-tert-butyl(meth)acrylamide, N-cyclohexyl(meth)acrylamide, N-(2-methoxyethyl)(meth)acrylamide, N,N-dimethyl(meth)acrylamide, N,N-diethyl(meth)acrylamide, N-phenyl(meth)acrylamide, N-benzyl(meth)acrylamide and (meth)acryloyl morpholine.

Specific examples of the vinyl ether include methyl vinyl ether, butyl vinyl ether, hexyl vinyl ether and methoxyethyl vinyl ether.

Specific examples of the styrene include styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethylstyrene, methyl vinylbenzoate and α-methylstyrene.

In addition, vinyl pyridine, vinyl pyrrolidone, vinyl carbazole and (meth)acrylonitrile can also be used.

Further, a vinyl monomer having a urethane group or a urea group can also be used. As such a vinyl monomer, for example, the compounds set forth below are exemplified.

M-1
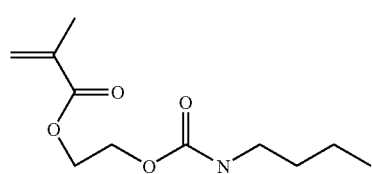

M-2
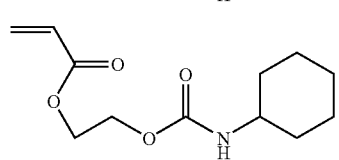

M-3
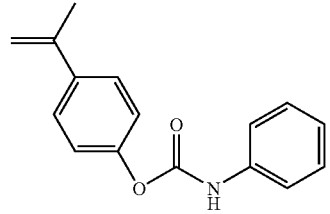

M-4
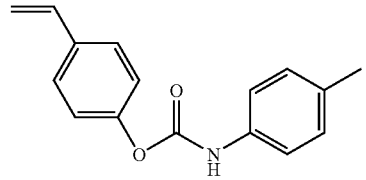

M-5
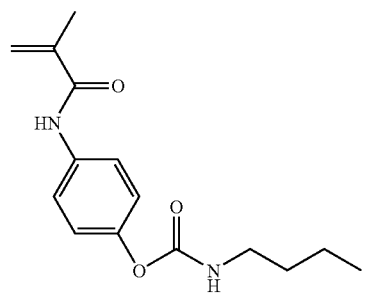

M-6
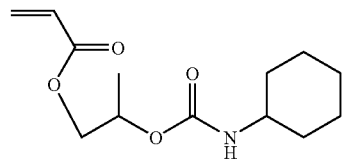

M-7
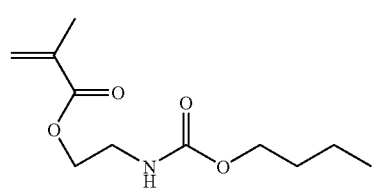

M-8
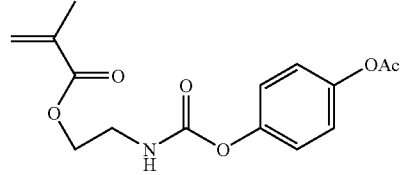

M-9
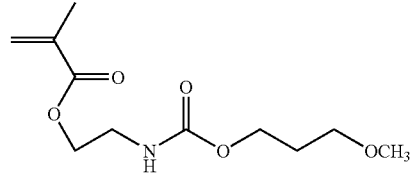

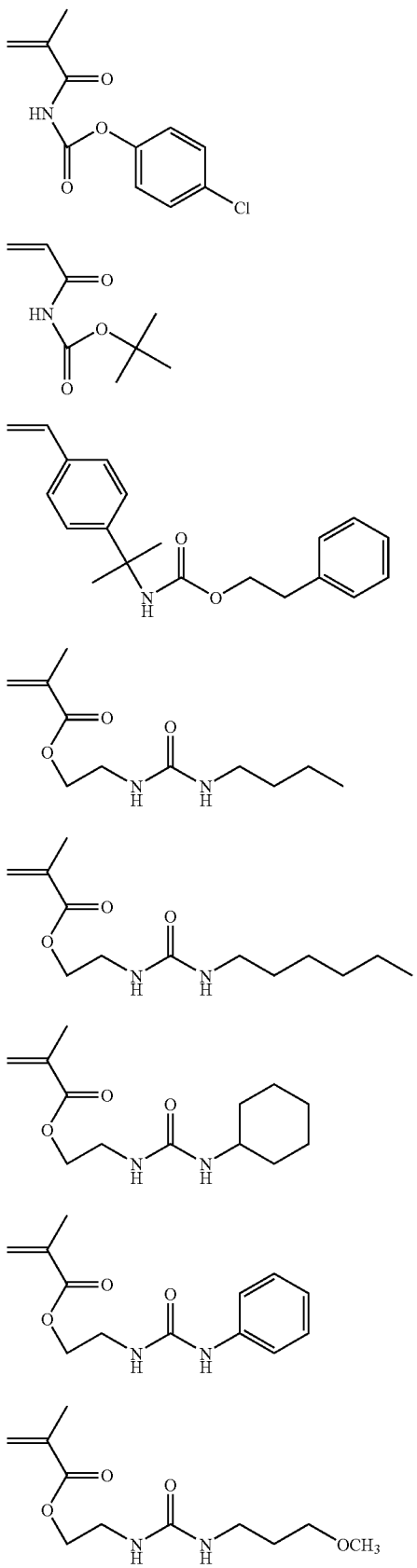
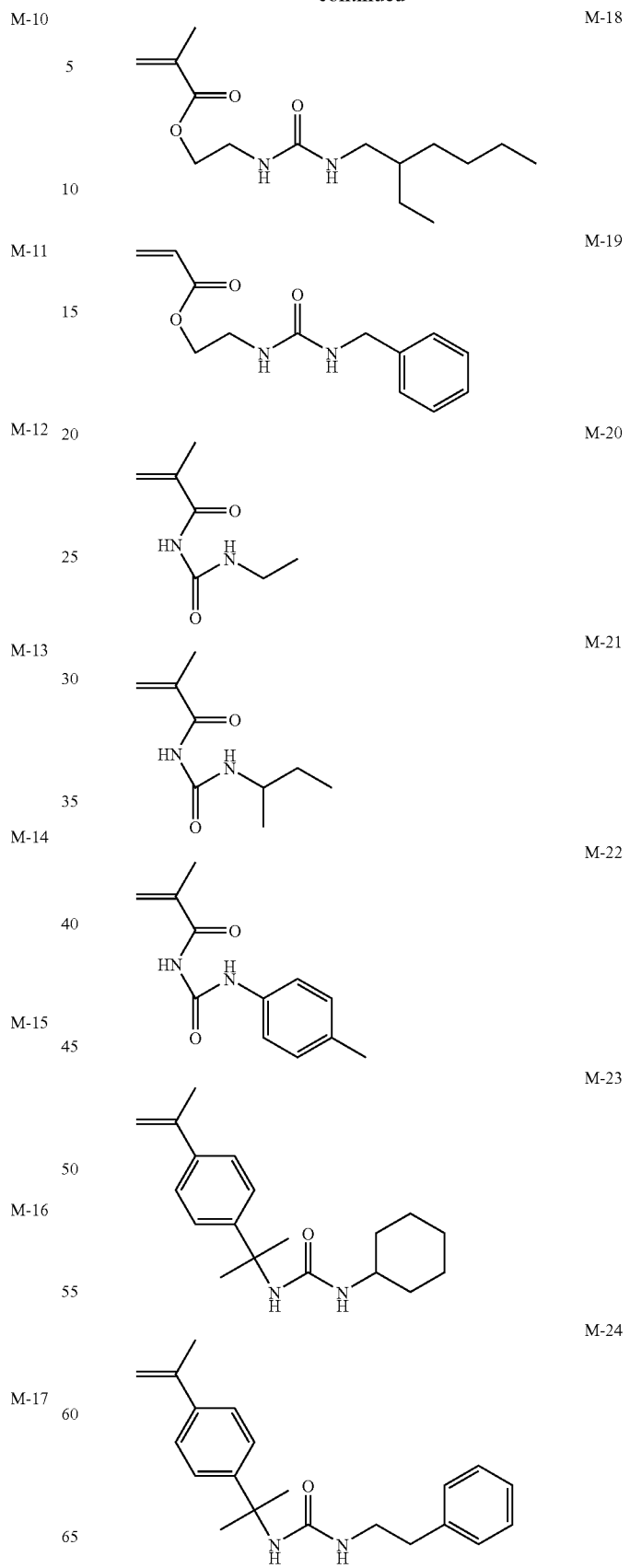

-continued

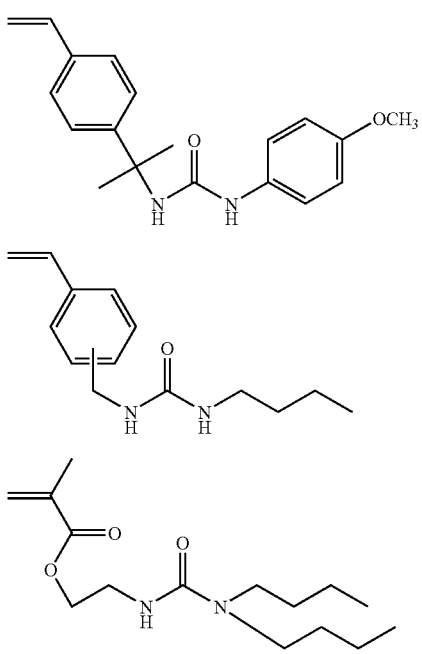

In order to perform image formation using the binder having an acid value of 0.3 meq/g or less with a developer having pH of 2 to 10, it is preferred to use a vinyl monomer having a nonacidic hydrophilic group as a part of the hinder component.

The hydrophilic group includes, for example, a hydroxy group, a carboxylate group, a hydroxyethyl groups an ethyleneoxy group, a hydroxypropyl group, an amino groups an aminoethyl group, an aminopropyl group, an ammonium group, an amido group, a carboxymethyl group and a polyether group (for example, diethylene oxide, triethylene oxide, polyethylene oxide, dipropylene oxide, tripropylene oxide, polypropylene oxide, ditetramethylene oxide, tritetramethylene oxide, polytetramethylene oxide or a combination thereof). The vinyl monomer having such a hydrophilic group is preferably used.

More specifically, a copolymer containing a least one kind of a (meth)acrylic acid ester including a —$CH_2CH_2O$— unit, a —$CH_2CH(CH_3)O$— unit or a —$CH_2CH_2NH$— unit in R of the ester residue (—COOR) thereof, a (meth)acrylic acid ester having a hydroxy group and a meth(acrylamide) is particularly preferable. The ratio of the vinyl monomer having a hydrophilic group in the binder according to the invention is preferably from 5 to 70% by mole, more preferably from 10 to 60% by mole, and particularly preferably from 15 to 50% by mole. When the ratio of the vinyl monomer having a hydrophilic group is less 5% by mole, the developing property may deteriorate in some cases. On the other hand, when it exceeds 70% by mole, the printing durability may decrease in some cases.

Further, as the binder for the photosensitive layer, a polyurethane resin is also preferably used. The polyurethane resin can be obtained by a polyaddition reaction of a known diisocyanate compound and a known diol compound, while appropriately adjusting the kind and ratio of the diisocyanate compound and diol compound so as to fulfill the above-described characteristics (for example, acid value or solubility).

1) Diisocyanate Compound

Diisocyanate compound includes the following compounds. Preferable examples of the diisocyanate compound include diisocyanate compounds represented by the following formula (6):

In formula (6), $L^1$ represents a divalent aliphatic or aromatic hydrocarbon group which may have a substituent. If desired, $L^1$ may contain other functional group which does not react with the isocyanate group, for example, an ester group, a urethane group, an amido group or a ureido group.

Specific examples of the diisocyanate compound represented by formula (6) include the following compounds.

Specifically, an aromatic diisocyanate compound, for example, 2,4-tolylene diisocyanate, dimer of 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate or 3,3'-dimethylbiphenyl-4,4'-diisocyanate; an aliphatic diisocyanate compound, for example, hexamethylene diisocyanate, trimethylhexamethylene diisocyanate, lysine diisocyanate or dimeric acid diisocyanate; an alicyclic diisocyanate compound, for example, isophorone diisocyanate, 4,4'-methylenebis(cyclohexyl isocyanate), methylcyclohexane-2,4(or 2,6)-diisocyanate or 1,3-(isocyanatomethyl)cyclohexane; and a diisocyanate compound which is a reaction product of a diol with a diisocyanate, for example, an adduct of 1 mole of 1,3-butylene glycol and 2 moles of tolylene diisocyanate.

2) Diol Compound

The diol compound includes, for example, a polyetherdiol compound, a polyesterdiol compound and polycarbonatediol compound.

Examples of the polyetherdiol compound include compounds represented by formulae (7), (8, (9), (10) and (11) shown below and a random copolymer of ethylene oxide and propylene oxide having a hydroxy group at the terminal thereof.

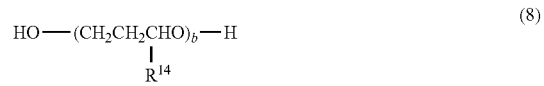

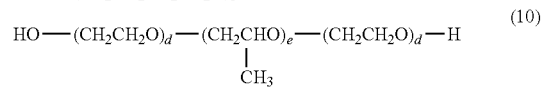

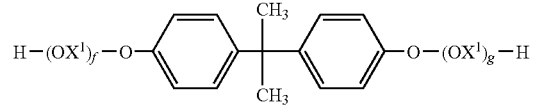

In the formulae (7) to (11), $R^{14}$ represents a hydrogen atom or a methyl group. $X^1$ represents a group shown below. a, b, c, d, e, f and g each represents a integer of 2 or more, and preferably an integer of 2 to 100.

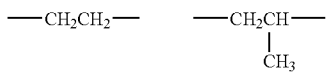

Specific examples of the polyetherdiol compound represented by formula (7) or (8) include the following compounds.

Specifically, diethylene glycol, triethylene glycol, tetraethylene glycol, pentaethylene glycol, hexaethylene glycol, heptaetylene glycol, octaethylene glycol, di-1,2-propylene glycol, tri-1,2-propylene glycol, tetra-1,2-propylene glycol, hexa-1,2-propylene glycol di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycol having a weight average molecular weight of 1,000, polyethylene glycol having a weight average molecular weight of 1,500, polyethylene glycol having a weight average molecular weight of 2,000, polyethylene glycol having a weight average molecular weight of 3,000, polyethylene glycol having a weight average molecular weight of 7,500, polypropylene glycol having a weight average molecular weight of 400, polypropylene glycol having a weight average molecular weight of 700, polypropylene glycol having a weight average molecular weight of 1,000, polypropylene glycol having a weight average molecular weight of 2,000, polypropylene glycol having a weight average molecular weight of 3,000 and polypropylene glycol having a weight average molecular weight of 4,000 are exemplified.

Specific examples of the polyetherdiol compound represented by formula (9) include the following compounds.

Specifically, PTMG650, PTMG1000, PTMG2000 and PTMG3000 (trade name, produced by Sanyo Chemical Industries, Ltd.) are exemplified.

Specific examples of the polyetherdiol compound represented by formula (10) include the following compounds.

Specifically, Newpol PE-61, Newpol PE-62, Newpol PE-64, Newpol PE-68, Newpol PE-71, Newpol PE-74, Newpol PE-75, Newpol PE-78 Newpol PE-108, Newpol PE-128 and Newpol PE-61 (trade name, produced by Sanyo Chemical Industries, Ltd.) are exemplified.

Specific examples of the polyetherdiol compound represented by formula (11) include the following compounds.

Specifically, Newpol BP-20, Newpol BPE-20F, Newpol BPE-2ONK, Newpol BPE-20T, Newpol BPE-20G, Newpol BPE-40, Newpol BPE-60, Newpol BPE-100, Newpol BPE-180, Newpol BPE-2P, Newpol BPE-23P, Newpol BPE-3P and Newpol BPE-5P (trade name, produced by Sanyo Chemical Industries, Ltd.).

Specific examples of the random copolymer of ethylene oxide and propylene oxide having a hydroxy group at the terminal thereof include the following compounds.

Specifically, Newpol 50FIB-100, Newpol 50HB-260, Newpol 50HB-400, Newpol 50B-660, Newpol 50HB-2000 and Newpol 50HB-5100 (trade name, produced by Sanyo Chemical Industries, Ltd).

Examples of the polyesterdiol compound include compounds represented by formulae (12) and (13) shown below.

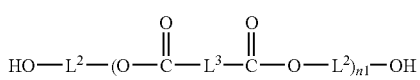
(12)

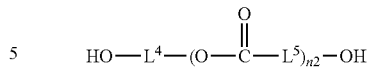
(13)

In formulae (12) and (13), $L^2$, $L^3$ and $L^4$, which may be the same or different, each represents a divalent aliphatic or aromatic hydrocarbon group, and $L^5$ represents a divalent aliphatic hydrocarbon group. Preferably, $L^2$, $L^3$ and $L^4$ each represents an alkylene group, an alkenylene group, an alkynylene group or an arylene group, and $L^5$ represents an alkylene group. Also, $L^2$, $L^3$, $L^4$ and $L^5$ each may have other functional group which does not react with the isocyanate group, for example, an ether group, a carbonyl group, an ester group, a cyano group, an olefin group, a urethane group, an amido group, a ureido group or a halogen atom. n1 and n2 each represents an integer of 2 or more, and preferably an integer of 2 to 100.

Examples of the polycarbonatediol compound include compounds represented by formula (14) shown below.

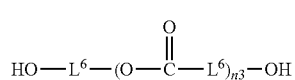
(14)

In formula (14), $L^6$, which may be the same or different, each represents a divalent aliphatic or aromatic hydrocarbon group. Preferably, $L^6$ represents an alkylene group, an alkenylene group, an alkynylene group or an arylene group. Also, $L^6$ may have other functional group which does not react with the isocyanate group, for example, an ether group, a carbonyl group, an ester group, a cyano group, an olefin group, a urethane group, an amido group, a ureido group or a halogen atom. n3 represents an integer of 2 or more, and preferably an integer of 2 to 100.

Specific examples of the diol compound represented by formula (12), (13) or (14) include Compound No. 1 to Compound No. 18 set forth below. In the specific examples, n represents an integer of 2 or more.

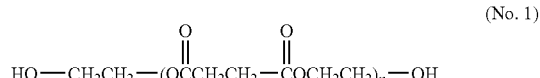
(No. 1)

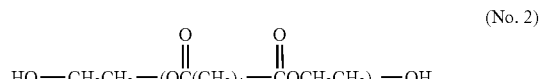
(No. 2)

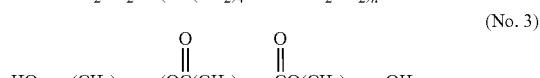
(No. 3)

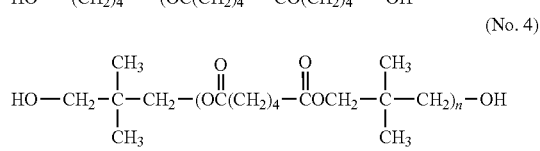
(No. 4)

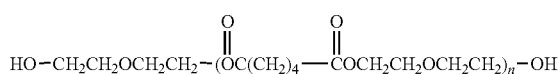
(No. 5)

-continued (No. 6)
HO—CH$_2$—⟨C$_6$H$_4$⟩—CH$_2$—[OC(CH$_2$)$_4$—COCH$_2$—⟨C$_6$H$_4$⟩—CH$_2$]$_n$—OH
              O      O
              ‖      ‖

(No. 7)
HO—(CH$_2$)$_4$—[OC—⟨C$_6$H$_4$⟩—CO—(CH$_2$)$_4$]$_n$—OH
           O                O
           ‖                ‖

(No. 8)
HO—CH$_2$CH$_2$—(OC(CH$_2$)$_5$)$_n$—OH
              O
              ‖

(No. 9)
HO—(CH$_2$)$_6$—(OCO(CH$_2$)$_6$)$_n$—OH
              O
              ‖

(No. 10)
HO—(CH$_2$)$_5$—(OCO(CH$_2$)$_5$)$_n$—OH
              O
              ‖

(No. 11)
HO—(CH$_2$)$_4$—(OCO(CH$_2$)$_4$)$_n$—OH
              O
              ‖

(No. 12)
HO—⟨C$_6$H$_4$⟩—(OCO—⟨C$_6$H$_4$⟩)$_n$—OH
              O
              ‖

(No. 13)
HO—CH$_2$CH=CHCH$_2$—[OC(CH$_2$)$_4$CO—CH$_2$CH=CHCH$_2$O]$_n$—H
                  ‖            ‖
                  O            O (No. 14)
HO—CH$_2$CH$_2$—[OCCH=CHCO—CH$_2$CH$_2$O]$_n$—H
             ‖       ‖
             O       O (No. 15)
HO—CH$_2$CH=CHCH$_2$—[OCCH=CHCO—CH$_2$CH=CHCH$_2$O]$_n$—H
                 ‖      ‖
                 O      O (No. 16)
HO—CH$_2$—C(CH$_3$)(CH$_2$OCH$_2$CH=CH$_2$)—CH$_2$—[OC(CH$_2$)$_4$CO—CH$_2$—C(CH$_3$)(CH$_2$OCH$_2$CH=CH$_2$)—CH$_2$O]$_n$—H
                                     ‖         ‖
                                     O         O (No. 17)
HO—CH$_2$C=CCH$_2$—[OC(CH$_2$)$_4$CO—CH$_2$C=CCH$_2$O]$_n$—H
              ‖         ‖
              O         O (No. 18)
HO—(CH$_2$)$_m$—[OC(CH$_2$)$_4$CO—(CH$_2$)$_m$O]$_n$—H
             ‖        ‖
             O        O m = 2, 4

Also, in the synthesis of the polyurethane resin, a diol compound having a substituent which does not react with the isocyanate group in addition to the above-described diol compound can be used. Such a diol compound includes compounds represented by formulae (15) and (16) shown below, $$HO\text{-}L^7\text{—}O\text{—}CO\text{-}L^8\text{—}CO\text{—}O\text{-}L^7\text{—}OH \qquad (15)$$

$$HO\text{-}L^8\text{—}CO\text{—}O\text{-}L^7\text{—}OH \qquad (16)$$

In formulae (15) and (16), $L^7$ and $L^8$, which may be the same or different, each represents a divalent aliphatic hydrocarbon group, aromatic hydrocarbon group or heterocyclic group, each of which may have a substituent (for example, an allyl group, an aralkyl group, an aryl group, an alkoxy group, an aryloxy group or a halogen atom (e.g., —F, —Cl, —Br or —I)). $L^7$ and $L^8$ each may have other functional group which does not react with the isocyanate group, for example, a carbonyl group, an ester group, a urethane group, an amido group or a ureido group, if desired. Alternatively, $L^7$ and $L^8$ may be combined with each other to form a ring.

The binder may be imparted with a crosslinking property in order to increase the film strength of the image area.

In order to impart the crosslinking property to the binder polymer, a crosslinkable functional group, for example, an ethylenically unsaturated bond is introduced into the main chan or side chain of the polymer. The crosslinkable functional group may be introduced by copolymer on or may be introduced by a polymer reaction.

The term "crosslinkable group" as used herein means a group capable of crosslinking the binder in the process of a radical polymerization reaction which is caused in the photosensitive layer, when the lithographic printing plate precursor is exposed to light. The crosslinkable group is not particularly restricted as long as it has such a function and includes, for example, an ethylenically unsaturated bonding group, an amino group or an epoxy group as a functional group capable of conducting an addition polymerization reaction. Also, a functional group capable of forming a radical upon irradiation with light may be used and such a crosslinkable group includes, for example, a thiol group, a halogen atom and an onium salt structure. Among them, the ethylenically unsaturated bonding group is preferable, and functional groups represented by formulae (1) to (3) shown below are particularly preferable.

(1)

$$-\text{X}-\overset{\overset{\displaystyle O}{\|}}{\text{C}}-\underset{R^1}{\overset{\displaystyle}{\text{C}}}=\underset{R^2}{\overset{\displaystyle R^3}{\text{C}}}$$

In formula (1), $R^1$ to $R^3$ each independently represents a hydrogen atom or a monovalent organic group. $R^1$ preferably includes, for example, a hydrogen atom or an alkyl group which may have a substituent. Among them, a hydrogen atom or a methyl group is preferable because of high radical reactivity. $R^2$ and $R^3$ each independently preferably includes, for example, a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable because of high radical reactivity.

X represents an oxygen atom, a sulfur atom or —N($R^{12}$)—, and $R^{12}$ represents a hydrogen atom or a monovalent organic group. The monovalent organic group represented by $R^{12}$ includes, or example, an allot group which may have a substituent $R^{12}$ is preferably a hydrogen atom, a methyl group, an ethyl group or an isopropyl group because of high radical reactivity.

Examples of the substituent introduced include an allyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amido group, an alkysulfonyl group and an arylsulfonyl group.

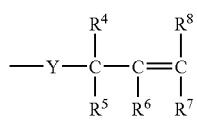

(2)

In formula (2), $R^4$ to $R^8$ each independently represents a hydrogen atom or a monovalent organic group. $R^4$ to $R^8$ each independently preferably includes, for example, a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable.

Examples of the substituent introduced include those described in Formula (1). Y represents an oxygen atom, a sulfur atom or —N($R^{12}$)— and $R^{12}$ has the same meaning as $R^{12}$ defined in Formula (1). Preferred examples for $R^{12}$ are also same as those described in Formula (1).

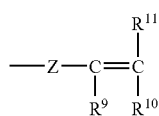

(3)

In formula (3), $R^9$ represents a hydrogen atom or a monovalent organic group, and preferably represents a hydrogen atom or an alkyl group which may have a substituent. Among them, a hydrogen atom or a methyl group is preferable because of high radical reactivity. $R^{10}$ and $R^{11}$ each independently represents, for example, a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent Among them, a hydrogen atom, a carboxyl group, an alkoxycarbonyl group, an alkyl group which may have a substituent or an aryl group which may have a substituent is preferable because of high radical reactivity.

Examples of the substituent introduced include those described in Formula (1). Z represents an oxygen atom, a sulfur atom, —N($R^{13}$)— or a phenylene group which may have a substituent. $R^{13}$ preferably includes, for example, an alkyl group which may have a substituent. Among them, a methyl group, an ethyl group or an isopropyl group is preferable because of high radical reactivity.

Of the binders described above, the (meth)acrylic copolymer having a crosslinkable group in its side chain and the polyurethane resin having a crosslinkable group in its side chain are more preferable.

In the binder having the crosslinking property, for example, a free radical (a polymerization initiating radical or a propagating radical in the process of polymerization of the polymerizable compound) is added to the crosslinkable functional group to cause an addition-polymerization between the binders directly or through a polymerization chain of the polymerizable compound, as a result, crosslinkage is formed between the binder molecules to effect curing. Alternatively, an atom (for example, a hydrogen atom on the carbon atom adjacent to the functional crosslinkable group) in the binder is withdrawn by a free radical to produce a polymer radical and the polymer radicals combine with each other to form crosslinkage between the binder molecules to effect curing.

The content of the crosslinkable group (content of radical-polymerizable unsaturated double bond determined by iodine titration) in the binder is preferably from 0.1 to 10.0 mmol, more preferably from 1.0 to 7.0 mmol, most preferably from 2.0 to 5.5 mmol, per g of the binder.

The glass transition temperature (Tg) of the binder according to the invention is preferably from 0 to 150° C., more preferably from 20 to 120° C., and particularly preferably from 30 to 100° C. When the lass transition temperature is lower than 0° C., the printing durability may decrease in some cases. On the other hand, when the glass transition temperature exceeds 150° C., the developing property may deteriorate in some cases.

The binder preferably has a weight average molecular weight of 5,000 or more, more preferably from 10,000 to 300,000, and a number average molecular weight of 1,000 or more, more preferably from 2,000 to 250,000. The polydispersity (weight average molecular weight/number average molecular weight) is preferably from 1.1 to 10.

The binder may be any of a random polymer, a block polymer, a graft polymer and the like.

The binders may be used individually or in combination of two or more thereof.

From the standpoint of preferable strength of the image area and good image-forming property, the content of the binder is preferably from 5 to 75% by weight, more preferably from 10 to 60% by weight, particularly preferably from 20 to 50% by weighs based on the total solid content of the photosensitive layer.

(D) Copolymer

According to the invention, the photosensitive layer or other layer, for example, an undercoat layer, in contact with the support contain as (D) a copolymer containing (a1) a repeating unit having at least one ethylenically unsaturated bond introduced through an ion pair and (a2) a repeating unit having at least one functional group capable of interacting with a surface of the support. By incorporating the component (D) into the photosensitive layer or undercoat layer, good stain resistance in the non-image area and good printing durability are achieved.

As the copolymer, a copolymer including repeating units represented by formula (D1) shown below is preferable.

Formula (D1):

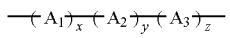

In formula (D1), $A_1$ represents the repeating unit (a1) having at least one ethylenically unsaturated bond introduced through an ion pair, $A_2$ represents the repeating unit (a2) having at least one functional group capable of interacting with a surface of the support, and A3 represents a repeating it (a3) having at least one hydrophilic group other than the repeating unit (a1). x, y and z each represents a copolymerization ratio.

The repeating unit (a1) having at least one ethylenically u bond introduced trough an ion pair represented by $A_1$ is preferably includes a repeating unit represented by the following formula (A1):

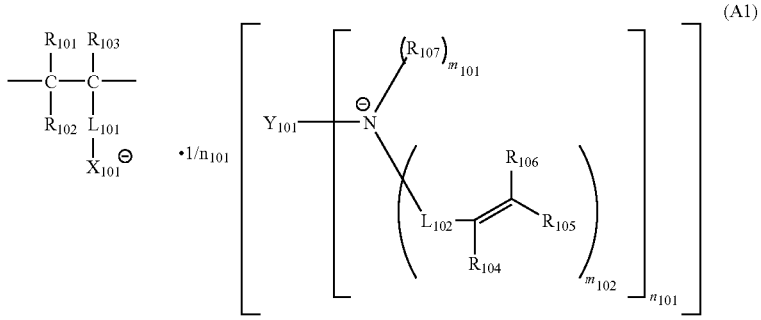

In formula (A1), $R_{101}$ to $R_{103}$ each independently represents a hydrogen atom, an allyl group having from 1 to 6 carbon atoms, $-CH_2-OH$, $-CH_2-OR_{112}$, $-CH_2-O-CO-R_{12}$ or a halogen atom.

$R_{104}$ to $R_{106}$ each independently represents a hydrogen atom, an alkyl group having from 1 to 6 carbon atoms, a halogen atom, $-CH_2-OH$, $-CH_2-OR_{108}$, $-CH_2-O-CO-R_{108}$, $-CO-R_{108}$, $-O-CO-R_{108}$, $-CO-O-R_{108}$ or $-CO-N(R_{109})-R_{108}$. Alternatively, $R_{104}$ and $R_{105}$ or $R_{105}$ and $R_{106}$ may be combined with each other to form a ring.

$R_{107}$ represents a hydrogen atom, an allyl group having from 1 to 10 carbon atoms, an aryl group having from 6 to 10 carbon atoms or an aralkyl group having from 7 to 20 carbon atoms.

$R_{108}$ represents an alkyl group having from 1 to 10 carbon atoms or an aryl group having from 6 to 10 carbon atoms.

$R_{109}$ represents a hydrogen atom, an alkyl group having from 1 to 10 carbon atoms or an aryl group having from 6 to 10 carbon atoms.

$R_{112}$ represents an alkyl group having from 1 to 10 carbon atoms, an aryl group having from 6 to 10 carbon atoms or an aralkyl group having from 7 to 20 carbon atoms.

$L_{101}$ represents a divalent connecting group selected from the group consisting of $-CO-$, $-O-$, $-S-$, $-N(R^{109})-$, $-SO_2-$, a divalent aliphatic group, a divalent aromatic group and a combination thereof.

$L_{102}$ represents a divalent connecting group selected from the group consist of $-CO-$, $-O-$, $-N(R_{109})-$ a divalent aliphatic group, a divalent aromatic group and a combination thereof.

$m_{101}$ represents an integer of 0 to 3.

$m_{102}$ represents an integer of 1 to 3, provided that $m_{101}+m_{102}=3$.

When $m_{101}$ is 2 or more, plural $R_{107}$s may be the same of different from each other. When $m_{101}$ is 2 or more, plural $R_{104}$s, $R_{105}$s, $R_{106}$s, and $L_{102}$s may be the same of different from each other, respectively.

$X_{101}^-$ represents $-CO_2^-$, $-PO_3H^-$, $-O-PO_3H^-$, $-SO_3^-$ or $O-SO_3^-$.

$Y_{101}$ represents a $n_{101}$-valent connecting group.

$n_{101}$ represents an integer of 1 to 10, provided that $m_{102} \times n_{101}$ is not 0.

More preferable embodiments of formula (A1) are described below.

$R_{101}$ or $R_{102}$ preferably represents a hydrogen atom, a methyl group or an ethyl group, and more preferably a hydrogen atom.

$R_{103}$ preferably represents a hydrogen atom, a methyl group, $-CH-OH$ or $-CH_2-O-CO-$(C1 to C4 alkyl), and more preferably a hydrogen atom, a methyl group, $CH_2-OH$ or $CH_2-O-CO-CH_3$.

$R_{104}$ preferably represents a hydrogen atom, a methyl group, $-CH_2-OH$, $-CH_2-O-CO-$(C1 to C4 alkyl), $-O-O-$(C1 to C4 alkyl) or $-CO-NH-$(C1 to C4 alkyl), and more preferably a hydrogen atom, a methyl group, $-CH_2-OH$, $CH_2-O-CO-CH_3$, $-CO-O-$(C1 to C2 alkyl) or $-C-NH-$(C1 to C2 alkyl).

$R_{105}$ or $R_{106}$ preferably represents a hydrogen atom, a methyl group or an ethyl group, and more preferably a hydrogen atom.

$R_{107}$ preferably represents a hydrogen atom, a C1 to C4 alkyl group, a benzyl group, a (C1 to C4 alkyl substituted) phenylmethyl group, a (C1 to C4 alkoxy substituted)phenylmethyl group, a (C1 to C4 acyloxy substituted)phenylmethyl group or a (C1 to C4 alkoxycarbonyl substituted)phenylmethyl group, and more preferably a methyl group, an ethyl group or a benzyl group.

$R_{108}$ preferably represents a methyl group, an ethyl group, a n-propyl group, an isopropyl group, a n-butyl group or a phenyl group, and more preferably a methyl group, an ethyl group or a n-propyl group.

$R_{109}$ preferably represents a hydrogen atom, a methyl group, an ethyl group, a n-propyl group, an isopropyl group, a n butyl group or a phenyl group, and more preferably a hydrogen atom, a methyl group, an ethyl group or a n-propyl group.

$L_{101}$ preferably represents —CO—O-L0-, O—NH-L0-, CO—NH-L0-, -divalent aromatic group or -divalent aromatic group-L0-, and more preferably —CO—O-L0-or —CO—NH-L0-.

L0 represents a divalent aliphatic group, a divalent aromatic group or a combination thereof.

$L_{102}$ preferably represents any one of Ia to Lq shown below, and more preferably La, Lb, Lf, Lg, Lh, Li, Lo, Lp or Lr. In the formulae shown below, L0 has the same meaning as defined above.

La: -L0—O—CO—
Lb: -L0—NH—CO—
Lc: -L0—O—
Ld: -L0—CO—O—
Le: -L0—O—CO—O—
Lf: -L0—O—$CH_2$—
Lg: -L0—CO—O—$CH_2$—
Lh: -L0—O—CO—O—$CH_2$—
Li: -L0—O—CO—NH-L0-O—CO—
Lj: -L0—O—CO-L0—O—CO—
Lk: -L0—O—CO-L0—NH—CO—
Ll: -L0—CO—O-L0—O—CO—
Lm; -L0—CO—O-L0—NH—CO—
Ln: -L0-divalent aromatic group-
Lo: —O—CO-divalent aromatic group-
Lp: —O—CO-L0-divalent aromatic group-
Lq: —CO—O-divalent aromatic group-
Lr: —CO—O-L0-divalent aromatic group- Although $m_{101}$, $m_{102}$ and $n_{101}$ are not particularly restricted, the numeric number of $m_{102} \times n_{101}$ is preferably from 1 to 6, and more preferably from 1 to 4.

$X_{101}^-$ preferably represents —C2$^-$, —$PO_3H^-$, —O—$PO_3H^-$, —O—$PO_2H^-$ or —$SO_3^-$, and more preferably —$CO_2^-$, —O—$PO_3H^-$ or —$SO_3$—.

$Y_{101}$ ordinarily represents a $n_{101}$-valent hydro on residue, which may include any of aliphatic and aromatic structures and straight-chain, branched and cyclic structures. The cyclic structure may be any of monocyclic and polycyclic structures. Further, the carbon-carbon linkage constituting the hydrocarbon residue may be interrupted with a structure selected from —CO—, —O—, —S—, —N($R_{109}$)—, —$SO_2$— and a combination thereof.

In the repeating unit (a1), it is most preferable that least one of the structures including the ethylenically unsaturated bond is a (meth)acrylic acid ester group, a (meth)acrylamido group, an aromatic vinyl group or an allyl group.

The repeating unit (a2) having at least one functional group capable of interacting with a surface of the support represented by $A_2$ is specifically includes a repeating unit represented by the following formula (A2):

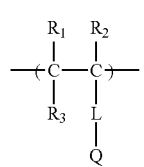
(A2)

In formula (A2), $R_1$ to $R_3$ have the same meanings as $R_{101}$ to $R_{103}$ defined in formula (A1) respectively L represents a divalent connecting group selected from the group consisting of CO—, —O—, —NH—, a divalent aliphatic group, a divalent aromatic group and a combination thereof.

Specific examples of the group represented by L are set forth below. In each of the specific examples shown below, the left side connects to the chain of the copolymer.

L1: —CO—O-divalent aliphatic group-O—
L2: —CO—O-divalent aliphatic group-NH—
L3: —CO—O-divalent aliphatic group-
L4: —CO—O-divalent aromatic group-O—
L5: —CO-divalent aromatic group-NH—
L6: —CO—O-divalent aromatic group-
L7:-divalent aromatic group-O—
L8: -divalent aromatic group-NH—
L9: —CO-divalent aliphatic group-CO—O-divalent aliphatic group-O—
L10: —CO-divalent aliphatic group-O—CO-divalent aliphatic group-O—
L11: —CO-divalent aromatic group-O—CO-divalent aliphatic group-O—
L12: —CO-divalent aromatic group-O—CO-divalent aliphatic group-O—
L13: —CO-divalent aliphatic group-CO—O-divalent aromatic group-O—
L14: —CO-divalent aliphatic group-O—CO-divalent aromatic group-O—
L15: —CO-divalent aromatic group-CO—O-divalent aromatic group-O—
L16: —CO-divalent aromatic group-O—CO-divalent aromatic group-O—
L17: —CO—O-divalent aromatic group-O—CO—NH-divalent aliphatic group-O—
L18: —CO—O-divalent aliphatic group-O—CO—NH-divalent aliphatic group-O—
L19: —CO—NH—
L20: —CO—O—
L21: -divalent aromatic group- The divalent aliphatic group includes an alkylene group, a substituted alkylene group, an alkenylene group, a substituted alkenylene group, an alkinylene group, a substituted alkinylene group and a polyalkyleneoxy group. Among them, an alkylene group, a substituted alkylene group, an alkenylene group and a substituted alkenylene group are preferable, and an alkylene group and a substituted alkylene group are more preferable.

Of the divalent aliphatic groups, a chain structure is more preferable than a cyclic structure, and further a straight-chain structure is more preferable than a branched structure.

A number of carbon atoms included in the divalent aliphatic group is preferably from 1 to 20, more preferably from 1 to 15, still more preferably from 1 to 12, yet still more preferably from 1 to 10, and most preferably from 1 to 8.

Examples of the substituent for the divalent aliphatic group include a halogen atom (e.g., F, Cl, Br or I), a hydroxy group, a carboxyl group, an amino group, a cyano group, an al group, an alkoxy group, an aryloxy group, an acyl group, an alkoxycarbonyl group, an aryloxycarbonyl group, an acyloxy group, a monoalkylamino group, a dialkylamino group, a monoarylamino group and a diarylamino group.

The divalent aromatic group includes an arylene group and a substituted arylene group. It preferably includes a phenylene group, a substituted phenylene group, a naphthylene group and a substituted naphthylene group.

Examples of the substituent for the divalent aromatic group include an alkyl group in addition to the substituents described for the divalent aliphatic group described above.

Of L1 to L21 described above, L1, L2, L9 and L10 are preferable.

Q in formula (A2) represents a functional group (hereinafter, also abbreviated as a specific functional group) capable of interacting with a surface of the support. The specific functional group includes, for example, a group capable of making interaction, for example, a covalent bond, an ionic bond, a hydrogen bond, polar interaction or van der Waals interaction with metal, metal oxide, a hydroxy group or the like present on the support subjected to an anodizing treatment or a hydrophilizing treatment.

Specific examples of the specific functional group are set forth below.

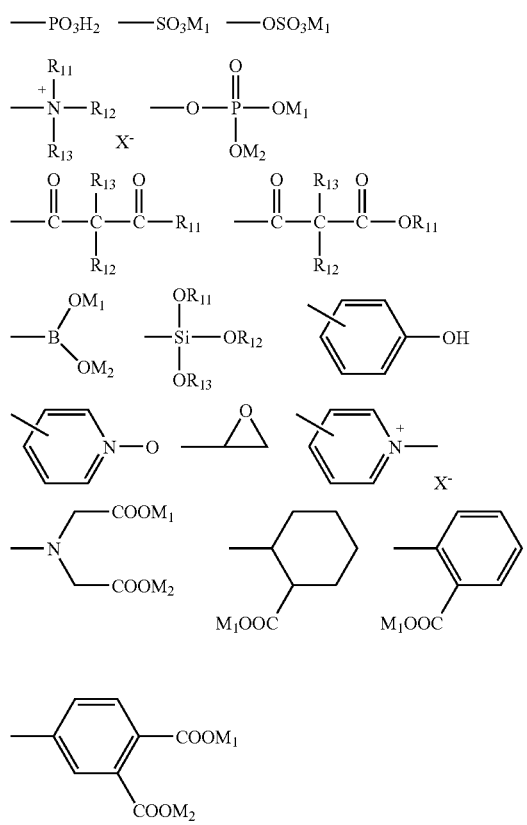

In the above formulae, $R_{11}$ to $R_{13}$ each independently represents a hydrogen atom, an alkyl group, an aryl group, an alynyl group or an alkenyl group; $M_1$ and $M_2$ each independently represents a hydrogen atom, a metal atom or an ammonium group; and $X^-$ represents a counter anion.

Of the specific functional groups, an ammonium groups a sulfonic acid group or a salt thereof, a phosphoric acid ester group or a salt thereof, a phosphonic acid group or a salt thereon a boric acid group, a β-diketone group, for example, an acetylacetone group, and an onium salt group, for example, a pyridinium group are preferable.

A sulfonic acid group or a salt thereof, a phosphoric acid ester group or a salt thereof and a phosphonic acid group or a salt thereof are more preferable.

The repeating unit (a3) having at least one hydrophilic group other than the repeating unit (a1) represented by $A_3$ is preferably includes a repeating unit represented by the following formula (A3):

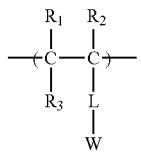

In formula (A3), $R_1$ to $R_3$ and L have the same meanings as those defined in formula (A2) respectively. W represents a group shown below.

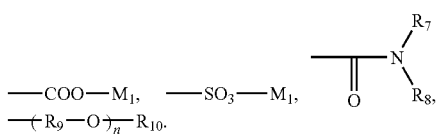

In the above formulae, $M_1$ has the same meaning as that defined in formula (A2).

$R_7$ and $R_8$ each independently represents a hydrogen atom or a straight-chin or branched alkyl group having from 1 to 6 carbon atoms.

$R_9$ represents a straight-chin or branched alkylene group having from 1 to 6 carbon atoms, and is preferably an ethylene group.

$R_{10}$ represents a hydrogen atom or an allyl group having from 1 to 12 carbon atoms.

n represents an integer of 1 to 100, and is preferably integer of 1 to 30.

Of the groups represented by W, a group containing a carboxylic acid (salt) group or a sulfonic acid (salt) group is more preferable, and a group containing a sulfonic acid (salt) group is particularly preferable in view of the stain resistance.

The copolymer (D) according to the invention may be a copolymer containing one or more repeating units derived from other monomers described below in addition to the above-described repeating units represented by $A_1$, $A_2$ and $A_3$ as long as the effects of the invention are not damaged.

(Other Monomers)

(1) Acrylic acid ester or methacrylic acid ester having an aliphatic hydroxy group, for example, 2-hydroxyethyl acrylate or 2-hydroxyethyl methacrylate.

(2) Acrylate, for example, methyl acrylate, ethyl acrylate, propyl acrylate, amyl acrylate, benzyl acrylate, 2-chloroethyl acrylate, glycidyl acylate, N-dimethyl on yl acrylate, polyethylene glycol monoacrylate or polypropylene glycol monoacrylate.

(3) Methacrylate, for example, methyl methacrylate, ethyl methacrylate, propyl methacrylate, amyl methacrylate, cyclohexyl methacrylate, benzyl methacrylate, 2-chloroethyl methacrylate, glycidyl methacrylate, N-dimethylaminoethyl methacrylate, polyethylene glycol monomethacrylate or polypropylene glycol monomethacrylate.

(4) Acrylamide or methacrylamide, for example, acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide or N-ethyl-N-phenylacrylamide.

(5) Vinyl ether, for example, ethyl vinyl ether, 2-chloroethyl vinyl ether, hydroxyethyl vinyl ether, propyl vinyl ether, butyl vinyl ether or phenyl vinyl ether.

(6) Vinyl ester, for example, vinyl acetate, vinyl chloroacetate, vinyl butyrate or vinyl benzoate.
(7) Styrene, for examples styrene, α-methylstyrene, methylstyrene or chloromethylstyrene.
(8) Vinyl ketone, for example, methyl vinyl ketone, ethyl vinyl ketone, propyl vinyl ketone or phenyl vinyl ketone.
(9) Olefin, for example, ethylene, propylene, isobutylene, butadiene or isoprene.
(10) N-vinylpyrrolidone, N-vinylcarbazole, 4 vinylpyridine, acrylonitrile or methacrylonitrile.
(11) Unsaturated imide, for example, maleimide, N-acryloylacrylamide, N-acetylmethacrylamide, N-propionylmethacrylamide or N-(p-chlorobenzoyl)methacrylamide.

The molecular weight of the copolymer (D) is preferably in a range of 500 to 100,000, more preferably in a mange of 700 to 50,000, in terms of weight average molecular weight. Further, the content of the repeating unit represented by $A_1$ is preferably from 1 to 80% by mole, more preferably from 2 to 50% by mole, based on the total copolymerization monomers. The content of the repeating unit represented by $A_2$ is preferably from 1 to 80% by mole, more preferably from 2 to 40% by mole, based on the total copolymerization monomers. The content of the repeating unit represented by $A_3$ is preferably from 10 to 95% by mole, more preferably from 20 to 90% by mole, based on the total copolymerization monomers.

Specific examples of the copolymer (D) are set forth below, but the invention should not be construed as being limited thereto.

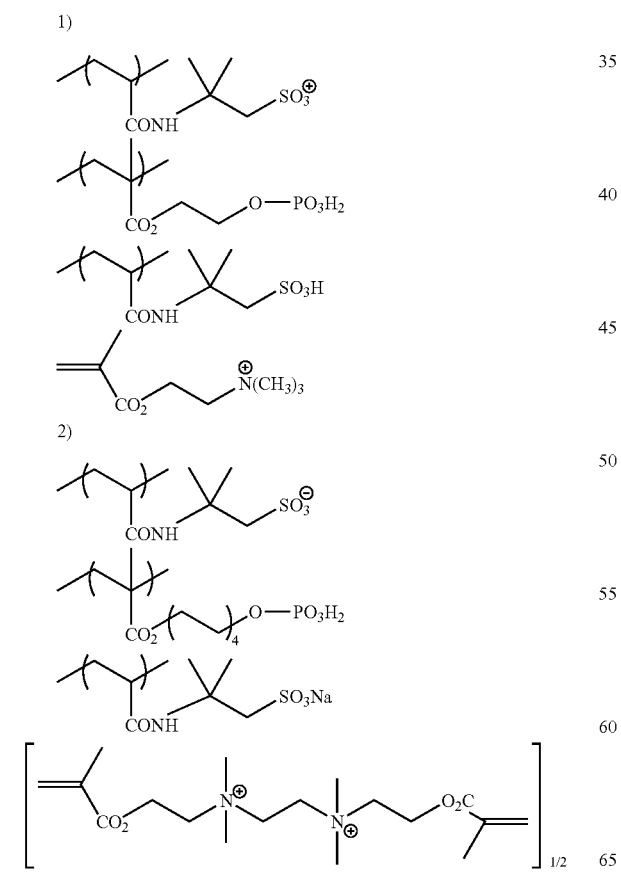

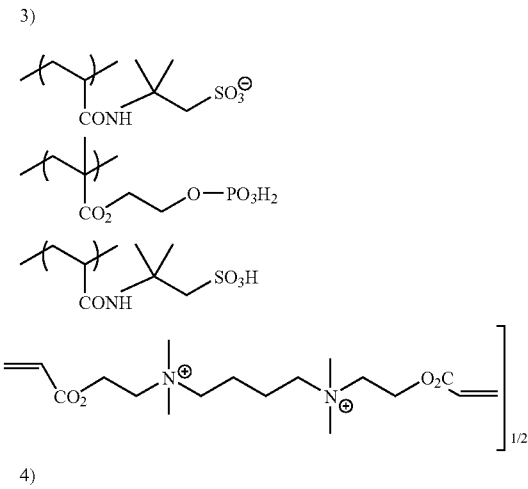

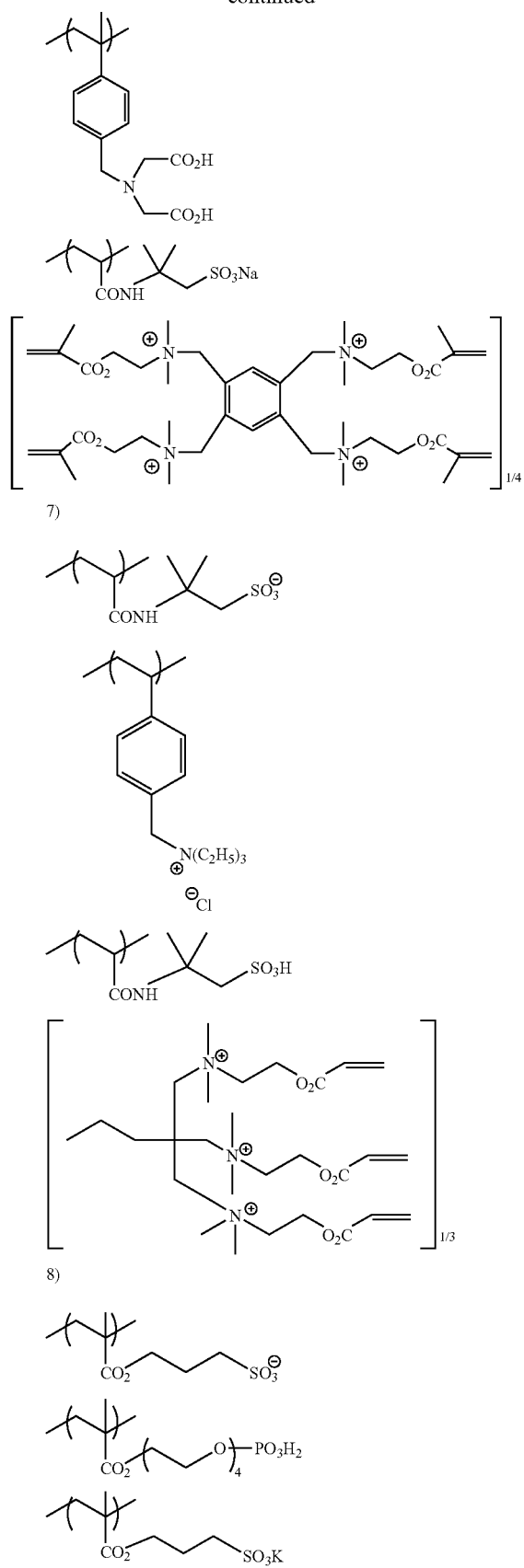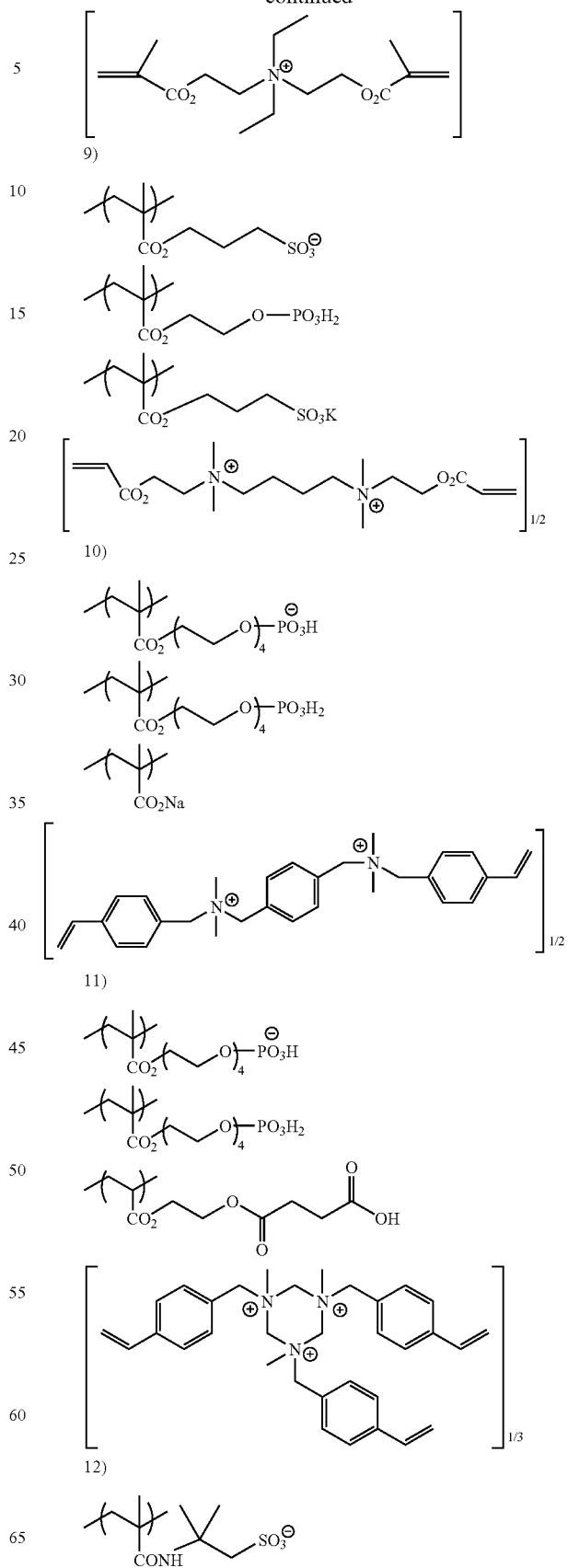

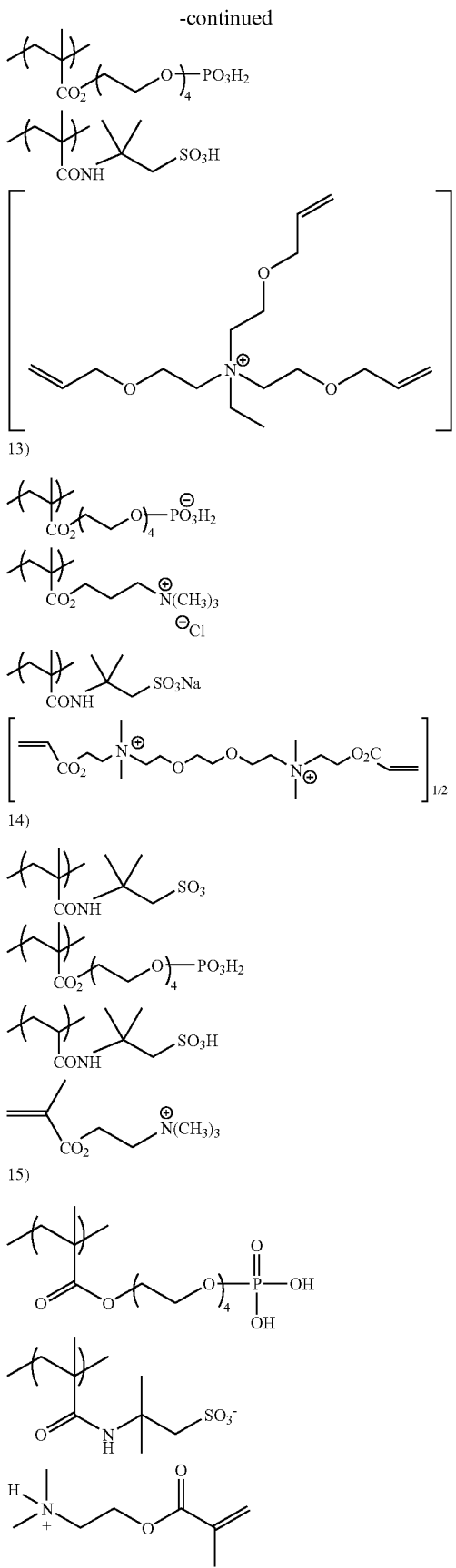

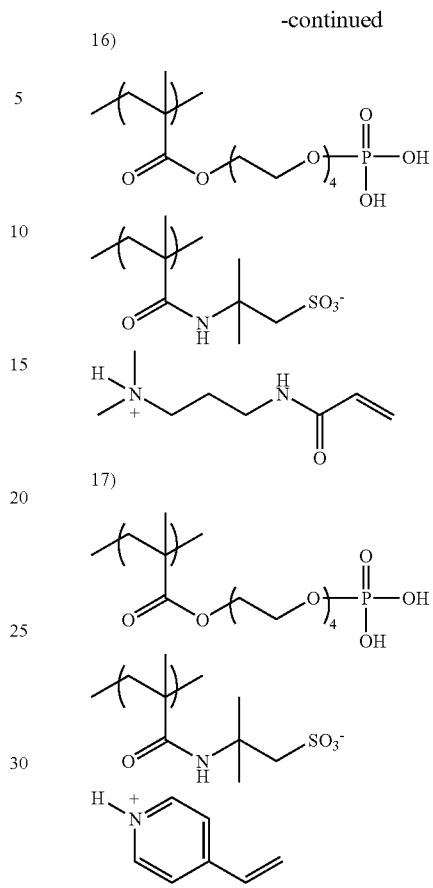

A production method of the copolymer (D) is nor particularly restricted and, for example, it can be synthesized by obtaining a polymer by a conventional radical polymerization and adding to the polymer, an amine compound having an ethylenically unsaturated bond or an ammonium salt having an ethylenically unsaturated bond. A structure of an anion contained in the ammonium salt added is preferably an anion of a compound having a lower acidity than that of an acid group of the polymer, for example, a hydroxy anion ($OH^-$) or a carboxylate anion ($CH_3CO_2^-$).

With respect to a type of usage of the copolymer (D), the copolymer can be contained in the photosensitive layer or other layer. The other layer is a layer adjacent to the support. Among others, the use of the copolymer in an undercoat layer (intermediate layer) provided between the support and the photosensitive layer is particularly preferable because the effects of the invention are sufficiently achieved. By using the copolymer in the undercoat layer, a stronger adhesion property between the support and the photosensitive layer is obtained in the exposed area and removal of the photosensitive layer from the support becomes easy in the unexposed area so at the developing property and stain resistance can be improved.

In the case of using the copolymer (D) in the undercoat layer according to the invention, the copolymer is ordinarily dissolved in a solvent for the use. Examples of the solvent include water and an organic solvent, for example, methanol, ethanol, propanol, isopropanol, ethylene glycol, hexylene glycol, tetrahydrofuran, dimethylformamide, 1-methoxy-2-propanol, dimethylacetamide or dimethylsolfoxide. Particularly water and an alcohol are preferably used. The organic solvents may be used as a mixture.

The concentration of the copolymer in a coating solution for undercoat layer is preferably from 0.001 to 10% by weight, more preferably from 0.01 to 5% by weight, and still more preferably from 0.05 to 1% by weight. To the undercoat layer is added a surfactant described hereinafter, if desired. In order to coat the coating solution for undercoat layer on the support, various known methods can be used Examples of the method include bar coater coating, spin coating, spray coating, curtain coating, dip coating, air knife coating, blade coating and roll coating.

The coating amount (solid content) of the undercoat layer is preferably from 0.1 to 200 mg/m$^2$, and more preferably from 1 to 50 mg/m$^2$.

(E) Sensitizing Dye

The photosensitive layer according to the invention preferably contains a sensing dye having an absorption maximum in a wavelength range of 350 to 450 nm responding to a wavelength of an exposure light source.

Examples of such sensitizing dye include merocyanine dyes represented by formula (V) shown below, benzopyranes or coumarins represented by formula (VI) shown below, aromatic ketones represented by formula (VII) shown below and anthracenes represented by formula (VIII) show below.

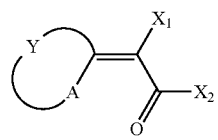
(V)

In formula (V), A represents a sulfur atom or $NR_6$, $R_6$ represents a monovalent non-metallic atomic group, Y represents a non-metallic atomic group necessary for forming a basic nucleus of the dye together with adjacent A and the adjacent carbon atom, and $X_1$ and $X_2$ each independently represents a monovalent non-metallic atomic group or $X_1$ and $X_2$ may be combined with each other to form an acidic nucleus of the dye.

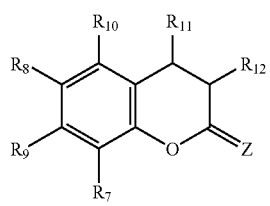
(VI)

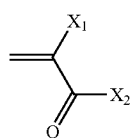
(1')

In formula (VI), =Z represents an oxo group, a thioxo group an imino group or an alkylidene group represented by the partial structural formula (1') described above, $X_1$ and $X_2$ have the same meanings as defined in formula (V) respectively, and $R_7$ to $R_{12}$ each independently represents a monovalent non-metallic atomic group.

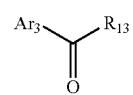
(VII)

In formula (VII), $Ar_3$ represents an aromatic group which may have a substituent or a heteroaromatic group which may have a substituent, and $R_{13}$ represents a monovalent nonmetallic atomic group. $R_{13}$ preferably represents an aromatic group or a heteroaromatic group. $Ar_3$ and $R_{13}$ may be combined with each other to form ring.

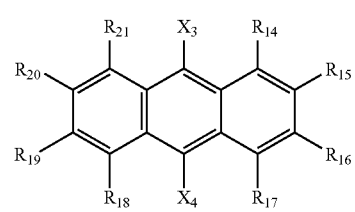
(VIII)

In formula (VIII), $X_3$, $X_4$ and $R_{14}$ to $R_{21}$, each independently represents a monovalent non-metallic atomic group. Preferably, $X_3$ and $X_4$ each independently represents an electron-donating group having a negative Hammett substituent constant.

In formulae (V) to (VIII), preferable examples of the monovalent non-metallic atomic group represented by any one of $X_1$ to $X_4$ and $R_6$ to $R_{21}$ include a hydrogen atom, an alkyl group (for example, a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a chloromethyl group, a bromomethyl group, a 2-chloroethyl group, a trifluoromethyl group, a methoxymethyl group, a methoxyethoxyethyl group, an allyloxyethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbornoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl, group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropyl sulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group or a 3-butynyl group), an aryl group (for example, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group or a phosphonatophenyl group), a heteroaryl group (for example, a group derived from a heteroaryl ring, for example, thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrine, acidine, perimidine, phenanthroline, phthalazine, phenarsazine, phenoxazine, furazane or phenoxazine), an alkenyl group (for example, a vinyl group, a 1-propenyl group, a 1-butenyl group, a cinnamyl group or a 2-chloro-1-ethenyl group), an alkynyl group (for example, an ethynyl group, a 1-propynyl group, a 1-butynyl group or a trimethylsilylethynyl group), a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-aryl-N-alkoxycarbonylamino group, an N-alkylN-aryloxycarbonylamino group, an N-aryl-N-alkoxycarbonylamino group, an N-aryl-N-aryloxycarbonylamino group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and its conjugated base group (hereinafter referred to as a "sulfonato group"), an alkoxysulfonyl group, an aryloxysulfonyl group, a sulfamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and its conjugated base group (hereinafter referred to as a "phosphonato group"), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and its conjugated base group (hereinafter referred to as an "alkylphosphonato group"), a monoarylphosphono group (—PO$_3$H(aryl)) and its conjugated base group (hereinafter referred to as an "arylphosphonato group"), a phosphonooxy group (—OPO$_3$H$_2$) and its conjugated base group (hereafter referred to as a "phosphonatooxy group"), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and its conjugated base group (hereinafter referred to as an "alkylphosphonatooxy group"), a monoarylphosphonooxy group (—OPO$_3$H(aryl)) and its conjugated base group (hereinafter referred to as an "arylphosphonatooxy group"), a cyano group and a nitro group. Among the above-described groups, a hydrogen atom, an alkyl group, an aryl group, a halogen atom, an alkoxy group and an acyl group are particularly preferred.

The basic nucleus of the dye formed by Y together with the adjacent A and the adjacent Carbon atom in formula (V) includes, for example, a 5-membered, 6-membered or 7-membered, nitrogen-containing or sulfur-containing heterocyclic ring, and is preferably a 5-membered or 6-membered heterocyclic ring.

As the nitrogen-containing heterocyclic ring, those which are known to constitute basic nuclei in merocyanine dyes described in L. G, Brooker et al, *J. Am. Chem. Soc.*, Vol. 73, pp. 5326 to 5358 (1951) and references cited therein can be preferably used. Specific examples thereof include thiazoles (for example, thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenyl)thiazole or 4-(2-thienyl)thiazole); benzothiazoles (for example, benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzodiazole, 5-hydroxybenzothiazole, 6-hydroxybenzothiazole, 6-dimethylaminobenzotriazole or 5-ethoxycarbonylbenzothiazole); naphthothiazole (for example, naphtho[1,2]thiazole, naphtho[2,1]thiazole, 5-methoxynaphtho[2,1]thiazole 5 ethoxynaphtho[2,1]thiazole, 8-methoxynaphtho[1,2]thiazole or 7-methoxynaphtho[1,2]thiazole); thianaphtheno-7',6', 4,5-thiazoles (for example, 4'-methoxythianaphtheno-7',6', 4,5-thiazole); oxazoles (for example, 4-methyloxazole, 5-methyloxazole, 4-phenyloxazole, 4,5-diphenyloxazole, 4-ethyloxazole, 4,5-dimethyloxazole or 5-phenyloxazole); benzoxazoles (for example, benzoxazole, 5-chlorobenzoxazole, 5-methylbenzoxazole, 5-phenylbenxazole, 6-methylbenzoxazole, 5,6-dimethylbenzoxazole, 4,6-dimethylbenzoxazole, 6-methoxybenioxazole, 5-methoxybenzxazole, 4-ethoxybenzoxazole, 5-chlorobenzoxazole, 6-methoxybenzoxazole, 5-hydroxybenzoxazole or 6-hydroxybenzoxole); naphthoxazoles (for example, naphth[1,2]oxazole or naphth [2,1]oxazole); selenazoles (for example, 4-methylselenazole or 4-phenylselenazole); benzoselenazoles (for example, benzoselenazole, 5-chlorobenzoselenazole, 5-methoxybenzoselenazole, 5-hydroxybenzselenazole or tetrahydrobenzoselenazole); naphthoselenazles (for example, naphtho[1,2]selenaole or naphtho[2,1]selenazole); thiazolines (for example, thiazoline or 4-methylthiazoline); quinolines (for example, quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline or 8-hydroxyquinoline); isoquinolines (for example, isoquinoline or 3,4-dihydroisoquinoline); benzimidazoles (for example, 1,3-diethylbenzimidazole or 1-ethyl-3-phenylbenzimidazole); 3,3-dialkylindolenines (for example, 3,3-dimethylindolenine, 3,3,5-trimethylindolenine or 3,3,7-trimethylindolenine); and pyridines (for example, pyridine or 5-methylpyridine).

Examples of the sulfur-containing heterocyclic ring include dithiol partial structures in dyes described in JP-A-3-296759.

Specific examples thereof include benzodithiols (for example, benzodithiol, 5-tert-butylbenzodithiol or 5-methylbenzodithiol); naphthodithiols (for example, naphtho[1,2] dithiol or naphtho[2,1]dithiol); and dithiols (for example, 4,5-dimethyldithiol, 4-phenyldithiol, 4-methoxycarbonyldithiol, 4,5-dimethoxycarbonyldithiol, 4,5-ditrifluoromethyldithiol, 4,5-dicyanodithiol, 4-methoxycarbonylmethyldithiol or 4-carboxymethyldithiol).

In the description with respect to the heterocyclic ring above, for convenience and by convention, the names of heterocyclic mother skeletons are used. In the case of constituting the basic nucleus partial structure in the sensitizing dye, the heterocyclic ring is introduced in the form of a substituent of alkylydene type where a degree of unsaturation is decreased one step. For example, a benzothiazole skeleton is introduced as a 3-substituted-2-(3H)-benzothiazolilydene group.

Of the sensitizing dyes having an absorption maximum in a wavelength range of 350 to 450 nm, dyes represented by formula (IX) shown below are more preferable in view of high sensitivity.

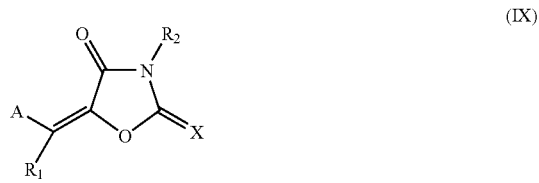

(IX)

In formula (IX), A represents an aromatic cyclic group which may have a substituent or a heterocyclic group which may have a substituent X represents an oxygen atom, a sulfur atom or =N(R$_3$), and R$_1$, R$_2$ and R$_3$ each independently represents a monovalent non-metallic atomic group, or A and R$_1$ or R$_2$ and R$_3$ may be combined with each other to form an aliphatic or aromatic ring.

The formula (Ix) will be described in more detail below. R$_1$, R$_2$ and R$_3$ each independently represents a monovalent non metallic atomic group, preferably a substituted or unsubstituted alkyl group, a substituted or unsubstituted alkenyl group, a substituted or unsubstituted aryl group, a substituted or unsubstituted aromatic heterocyclic residue, a substituted or unsubstituted alkoxy group, a substituted or unsubstituted alkylthio group, a hydroxy group or a halogen atom.

Preferable examples of R$_1$, R$_2$ and R$_3$ will be specifically described below. Preferable examples of the alkyl group include a straight chain, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among them, a straight chain alkyl group having from 1 to 12 carbon atoms, a branched alkyl group having from 3 to 12 carbon atoms and a cyclic alkyl group having from 5 to 10 carbon atoms are more preferable.

As the substituent for the substituted alkyl group, a monovalent non-metallic atomic group exclusive of a hydrogen atom is used. Preferable examples hereof include a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, a N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsufinyl group, an arylsulfinyl group, an alkylsulfonyl group, an arylsulfonyl group, a sulfo group (—SO$_3$H) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfamoyl group, an N,N-diarylsulfamoyl group, an N-alkyl-N-arylsulfamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and its conjugated base group (hereinafter referred to as a "phosphonato group"), a dialkylphosphono group (—PO$_3$(alkyl)$_2$), a diarylphosphono group (—PO$_3$(aryl)$_2$), an alkylarylphosphono group (—PO$_3$ (alkyl)(aryl)), a monoalkylphosphono group (—$PO_3H$(alkyl)) and its conjugated base group (hereinafter referred to as an "alkylphosphonato group"), a monoarylphosphono group (—$PO_3H$(aryl)) and its conjugated base group (hereinafter referred to as an "arylphosphonato group"), a phosphonatooxy group (—$OPO_3H_2$) and its conjugated base group (hereinafter referred to as a "phosphonatooxy group"), a dialkylphosphonooxy group (—$OPO_3$(alkyl)$_2$), a diarylphosphonooxy group (—$OPO_3$(aryl)$_2$), an alkylarylphosphonooxy group (—$OPO_3$(alkyl)(aryl)), a monoalkylphosphonooxy group (—$OPO_3H$(alkyl)) and its conjugated base group (hereinafter referred to as an "alkylphosphonatooxy group"), a monoarylphosphonooxy group (—$OPO_3H$(aryl)) and its conjugated base group (hereinafter referred to as an "arylphosphonatooxy group"), a cyano group, a nitro group, an aryl group, a heteroaryl group, an alkenyl group and an alkynyl group.

In the substituents, specific examples of the alkyl group include those described for the alkyl group above. Specific examples of the alkyl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxy phenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group and a phosphonatophenyl group.

Examples of the heteroaryl group for any one of $R_1$, $R_2$ and h preferably include a monocyclic or polycyclic aromatic cyclic group containing at least one of a nitrogen atom, an oxygen atom and a sulfur atom. Examples of especially preferable heteroaryl group include a group derived from a heteroaryl ring, for example, thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline pteridine, azole, carboline, phenanthrene, acridine, perimidine, phenanthroline, phthalazine, phenarsazine, phenoxazine, furazane or phenoxazine. These groups may be benzo-fused or may have a substituent.

Also, examples of the alkenyl group for any one of $R_1$, $R_2$ and $R_3$ preferably include a vinyl group, a 1-propenyl group, a 1-butenyl group, a cinnamyl group and a 2-chloro-1-ethenyl group. Examples of the alkynyl group include an ethynyl group, a 1-propynyl group, a 1-butynyl group and a trimethylsilylethynyl group. Examples of $G_1$ in the acyl group ($G_1$CO—) include a hydrogen atom and the above-described allyl group and aryl group. Of the substituents, a halogen atom (for example, —F, —Br, —Cl or —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, an acyl group, a carboxyl group, an alkoxycarbonyl group, an aryloxycarbonyl group, a carbamoyl group, an N-alkylcarbamoyl group, an N,N dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group and an alkenyl group are more preferable.

On the other hand, as an alkylene group in the substituted alkyl group, a divalent organic residue resulting from elimination of any one of hydrogen atoms on the above-described alkyl group having form 1 to 20 carbon atoms can be enumerated. Examples of preferable alkylene group include a straight chain alkylene group having from 1 to 12 carbon atoms, a branched alkylene group having from 3 to 12 carbon atoms and a cyclic alkylene group having from 5 to 10 carbon atoms.

Specific examples of the preferable substituted alkyl group represented by any one of $R_1$, $R_2$ and $R_3$, which is obtained by combining the above-described substituent with the alkylene group, include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropyl sulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

Preferable examples of the aryl group represented by any one of $R_1$, $R_2$ and $R_3$ include a fused ring formed from one to benzene rings and a fused ring formed from a benzene ring and a 5-membered unsaturated ring. Specific examples thereof include a phenyl group, a naphthyl group, an anthryl group, a phenanthryl group, an indenyl group, an acenaphthenyl group and a fluorenyl group. Among them, a phenyl group and a naphthyl group are more preferable.

Specific examples of the preferable substituted aryl group represented by any one of $R_1$, $R_2$ and $R_3$ include aryl groups having a monovalent non-metallic atomic group exclusive of a hydrogen atom as a substituent on the ring-forming carbon atom of the above-described aryl group. Preferable examples of the substituent include the above-described alkyl groups and substituted al groups, and the substituents described for the above-described substituted alkyl group. Specific examples of the preferable substituted aryl group include a biphenyl group, a tolyl group, a xylyl group a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamo-yloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylplenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group and a 3-butynylphenyl group.

Examples of the preferable substituted or unsubstituted alkenyl group and the preferable substituted or unsubstituted aromatic heterocyclic residue represented by any one of $R_1$, $R_2$ and $R_3$ include those described with respect to the alkenyl group and heteroaryl group above, respectively.

Next, A in formula (IX) will be described below. A represents an aromatic cyclic group which may have a substituent or heterocyclic group which may have a substituent. Specific examples of the aromatic cyclic group which may have a substituent or heterocyclic group which may have a substituent include those described for any one of $R_1$, $R_2$ and $R_3$ in formula (IX).

The sensitizing dye represented by formula (IX) is obtained by a condensation reaction of the above-described acidic nucleus or an active methyl group-containing acidic nucleus with a substituted or unsubstituted, aromatic ring or hetero ring and can be synthesized with reference to the description of JP-B-59-28329.

Preferable specific examples (D1) to (D75) of the compound represented by formula (IX) are set forth below. Further, when isomers with respect to a double bond connecting an acidic nucleus and a basic nucleus are present in each of the compounds, the invention should not be construed as being limited to any one of the isomers.

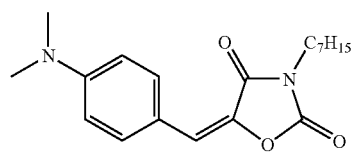
(D1)

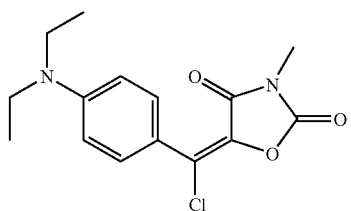
(D2)

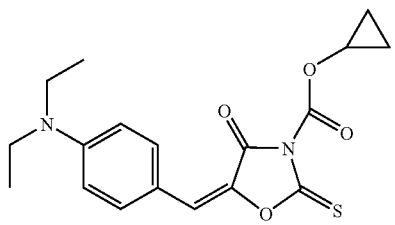
(D3)

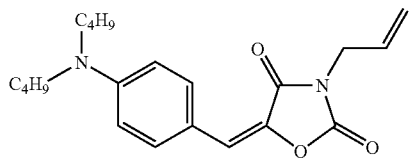
(D4)

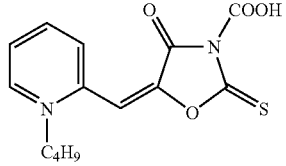
(D5)

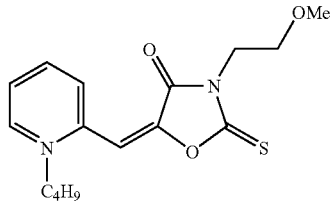
(D6)

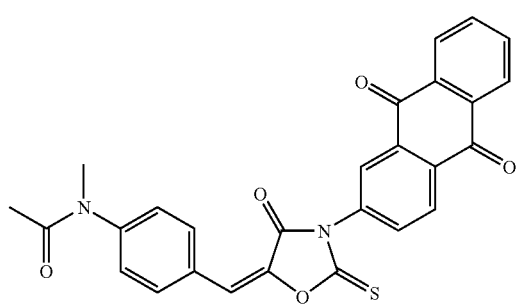
(D7)

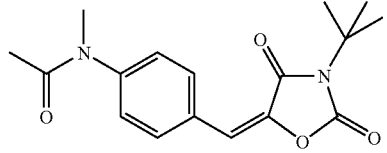
(D8)

-continued
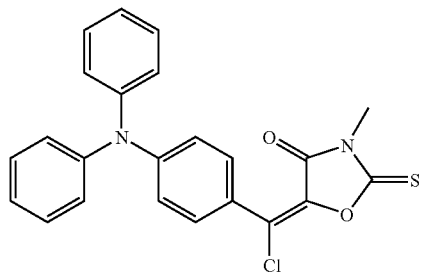 (D9)
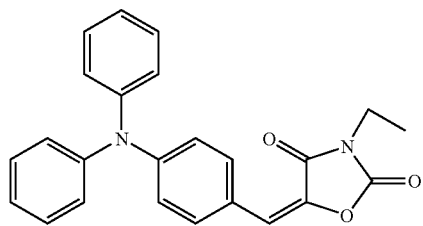 (D10)
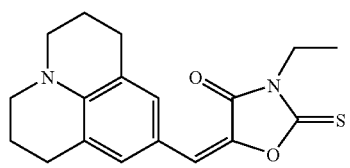 (D11)
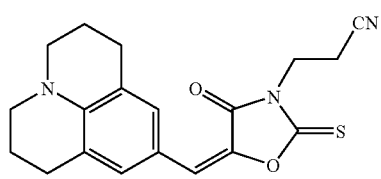 (D12)
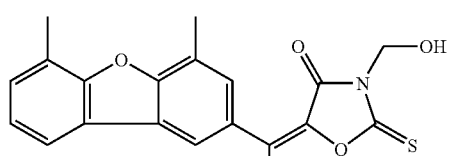 (D13)
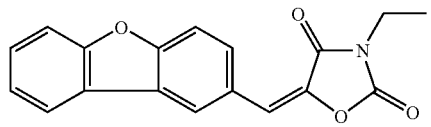 (D14)
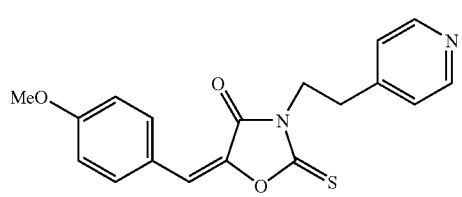 (D15)
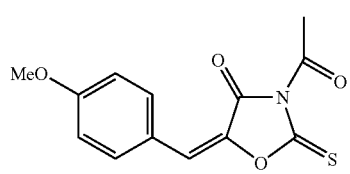 (D16)
-continued
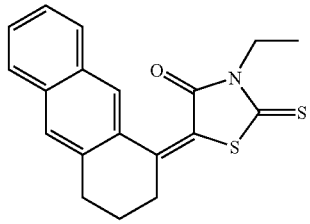 (D17)
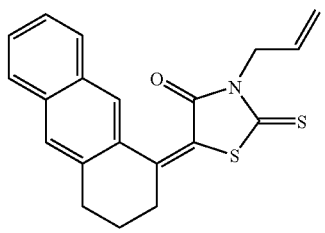 (D18)
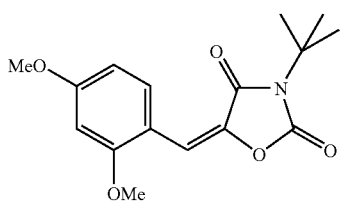 (D19)
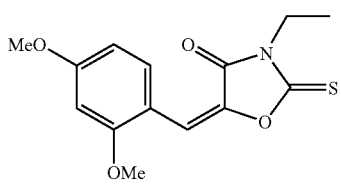 (D20)
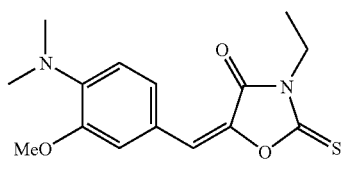 (D21)
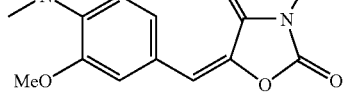 (D22)
 (D23)
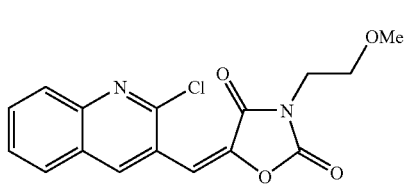 (D24)

-continued
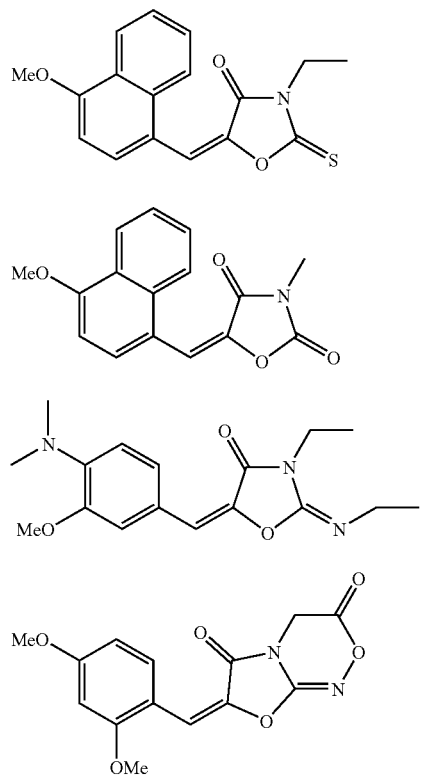
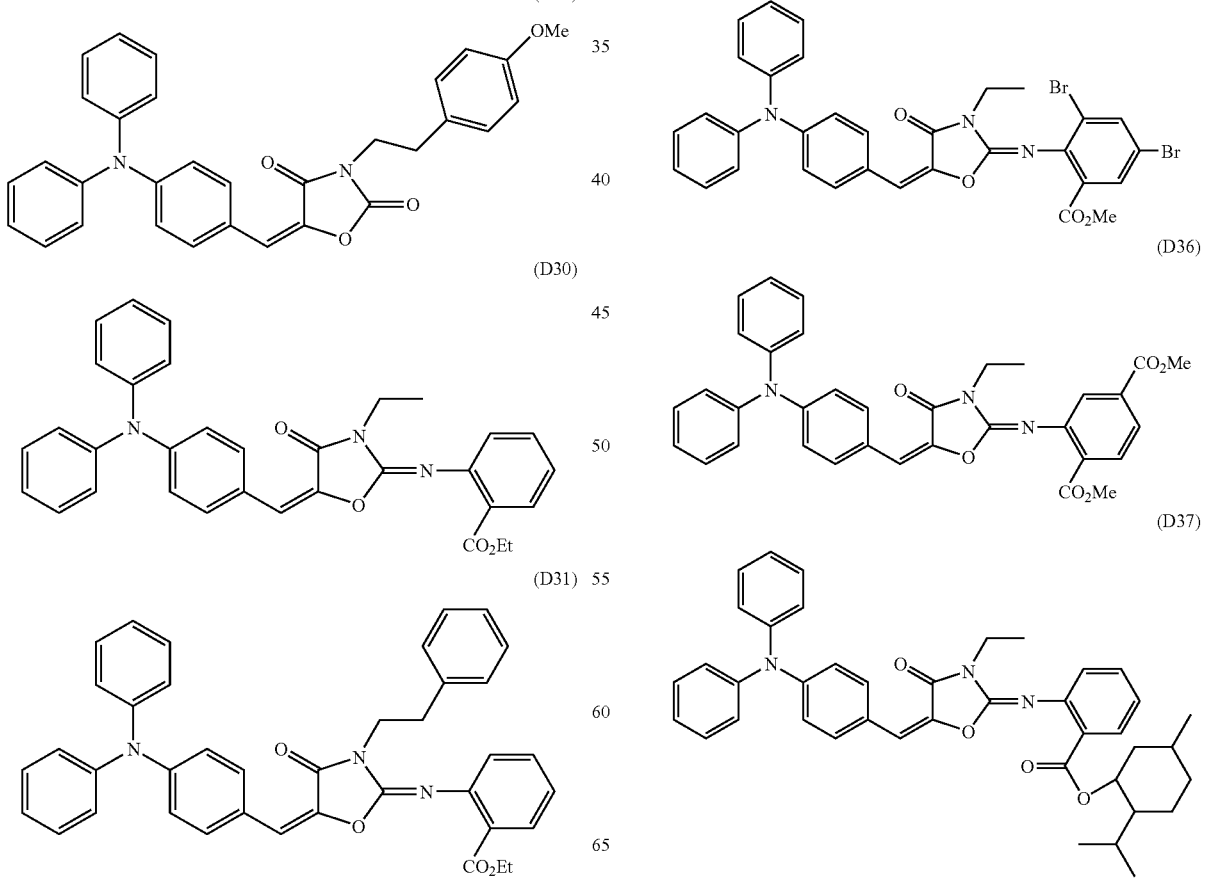

(D38)
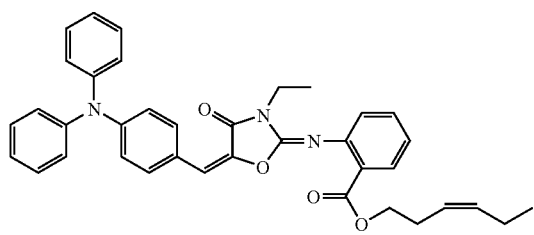
(D39)
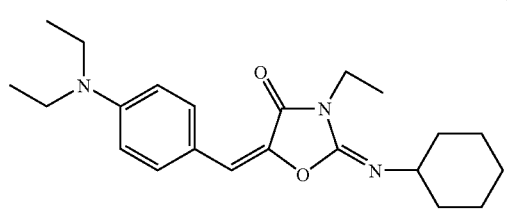
(D40)
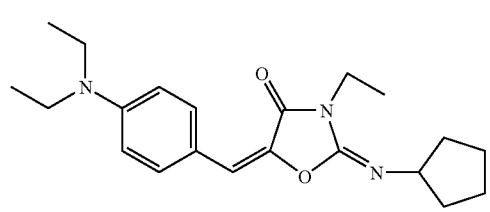
(D41)
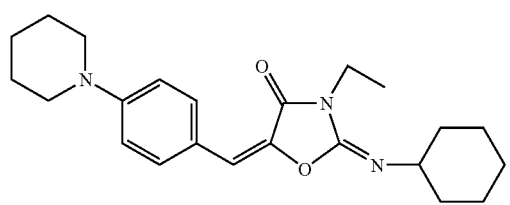
(D42)
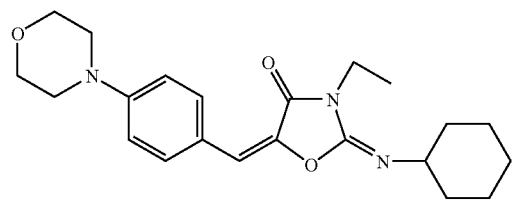
(D43)
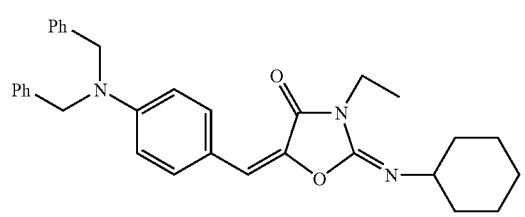
(D44)
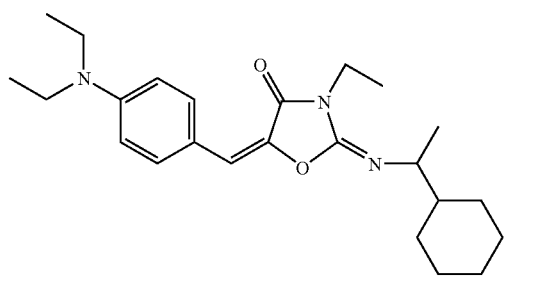
(D45)
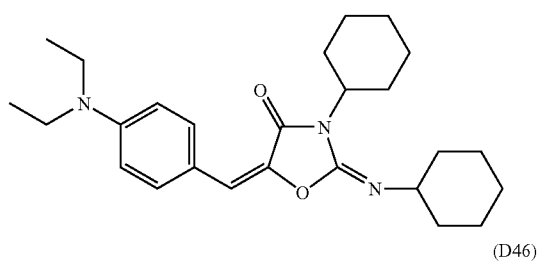
(D46)
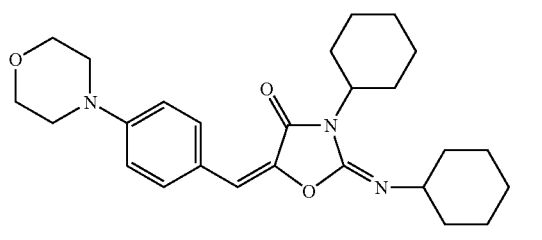
(D47)
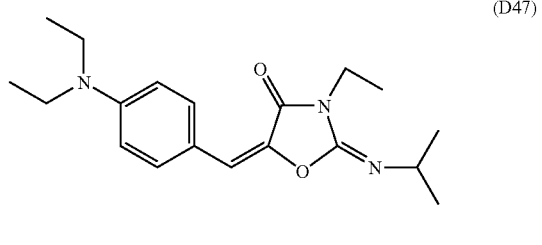
(D48)
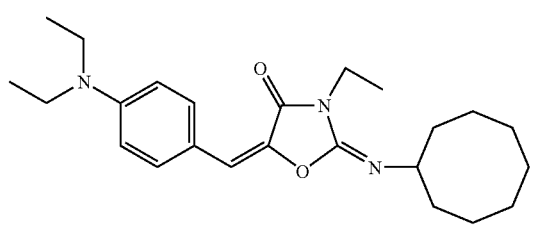
(D49)
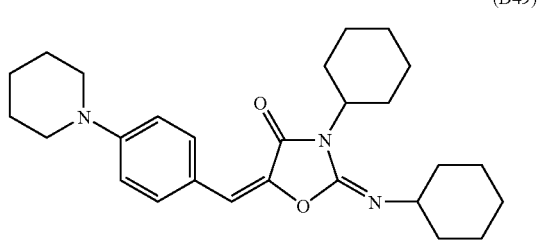

(D50)
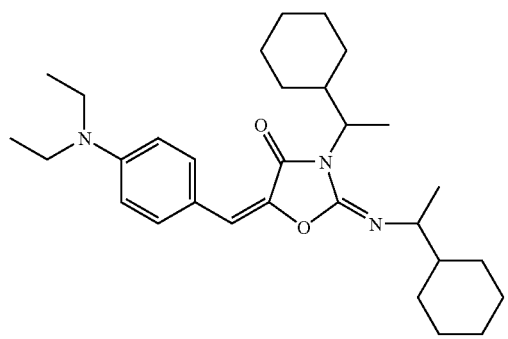
(D51)
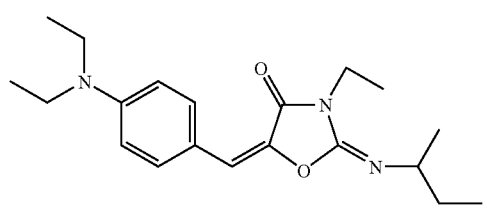
(D52)
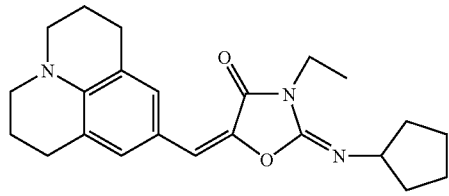
(D53)
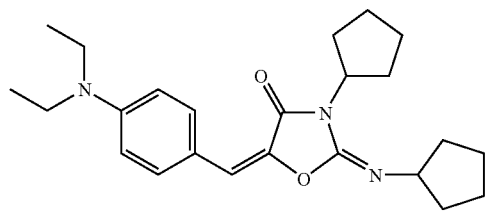
(D54)
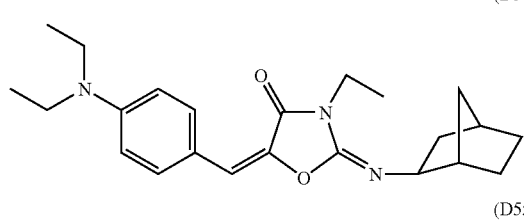
(D55)
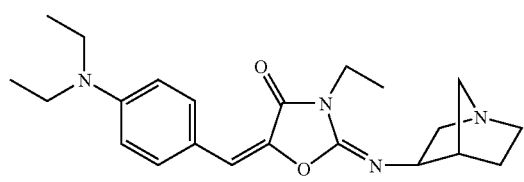
(D56)
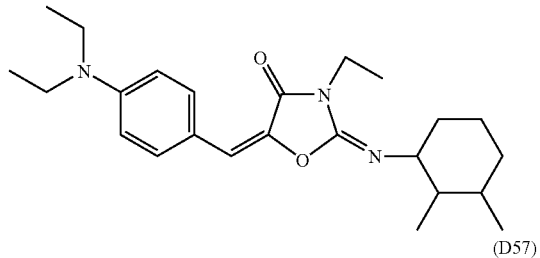
(D57)
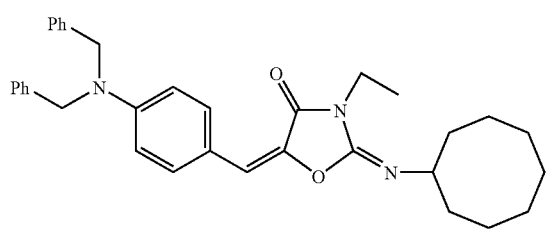
(D58)
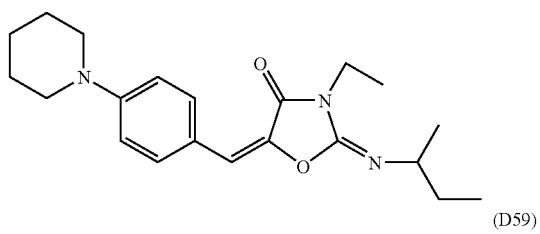
(D59)
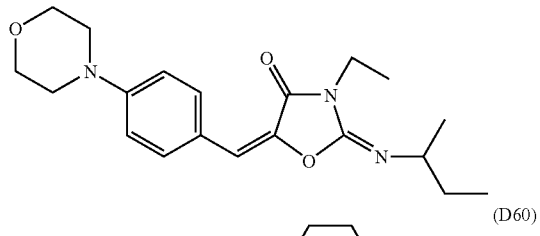
(D60)
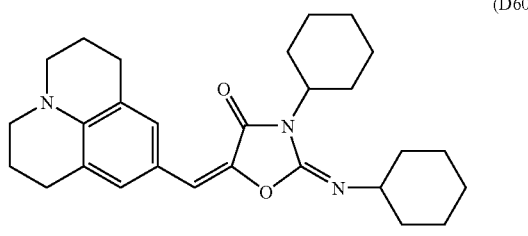
(D61)
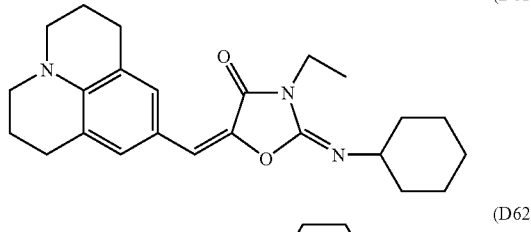
(D62)
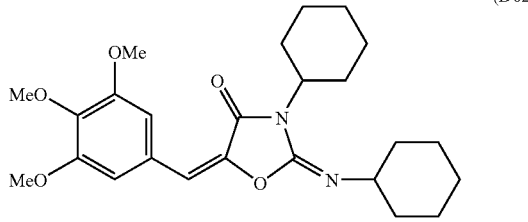

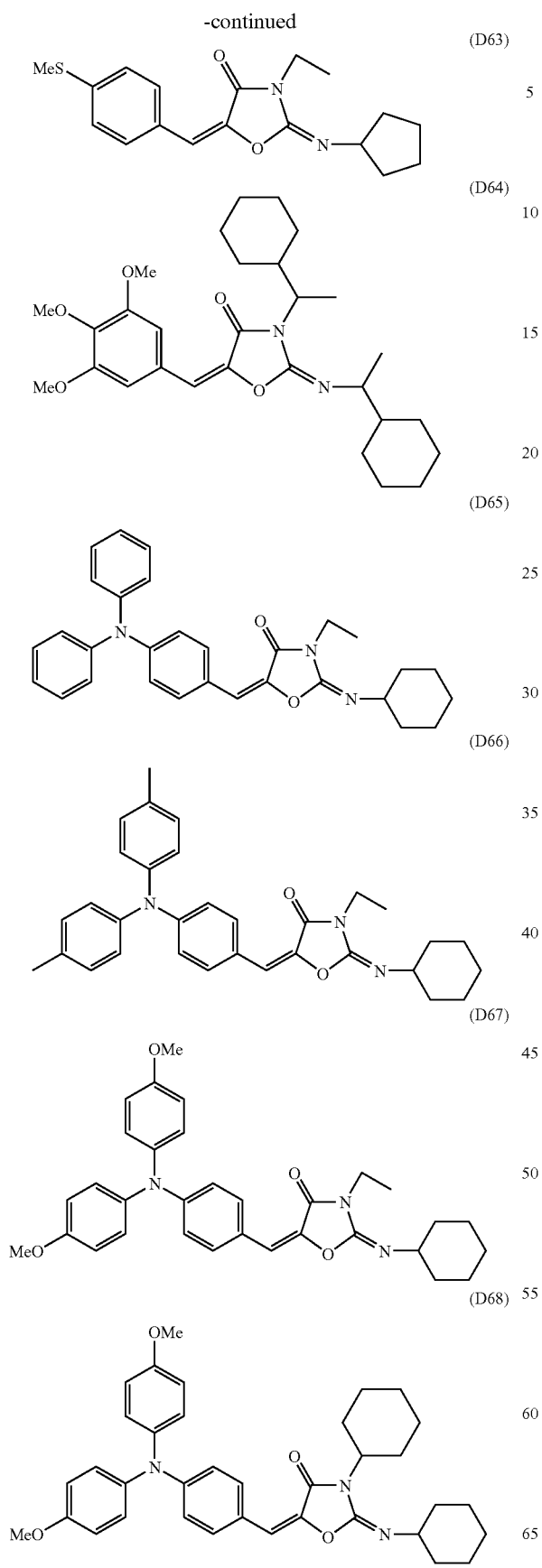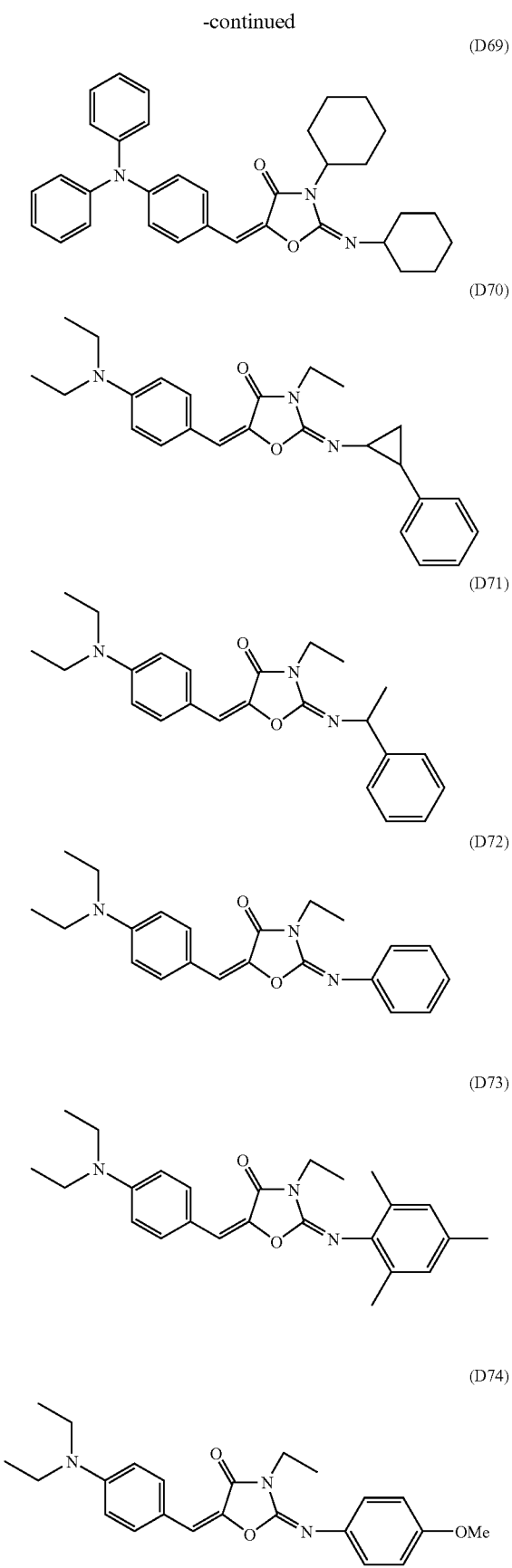

-continued

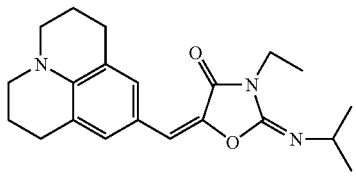
(D75)

Details of the method of using be sensitizing dye, for example, selection of the structure, individual or combination use or an amount added, can be appropriately determined in accordance with the characteristic design of the lithographic printing plate precursor.

For instance, when two or more sensitizing dyes are used in combination, the compatibility thereof in the photosensitive layer can be increased. For the selection of sensitizing dye, the molar absorption coefficient thereof at the emission wavelength of the light source used is an important factor in addition to the photosensitivity. Use of the dye having a large molar absorption coefficient is profitable, because the amount of dye added can be made relatively small. Also, in case of using in a lithographic printing plate precursor, the use of such a dye is advantageous in view of physical properties of the photosensitive layer. Since the photosensitivity and resolution of the photosensitive layer and the physical properties of the exposed area of the photosensitive layer are greatly influenced by the absorbance of sensitizing dye at the wavelength of light source, the amount of the sensitizing dye added is appropriately determined by taking account of these factors.

However, for the purpose of curing a layer having a large thickness, for example, of 5 μm or more, low absorbance is sometimes rather effective for increasing the curing degree. In the case of using in a lithographic printing plate precursor where the photosensitive layer has a relatively small thickness, the amount of the sensitizing dye added is preferably selected such that the photosensitive layer has an absorbance from 0.1 to 1.5, preferably from 0.25 to 1. Ordinarily, the amount of the sensitizing dye added is preferably from 0.05 to 30 parts by weight, more preferably from 0.1 to 20 parts by weight, and most preferably from 0.2 to 10 parts by weight, per 100 parts by weight of the total solid content of the photosensitive layer.

<Mcrocapsule>

In the invention, in order to incorporate die above-described constituting components of the photosensitive layer and other constituting components described hereinafter into the photosensitive layer, a part of the constituting components is encapsulated into microcapsules and added to the photosensitive layer as described, for example, in JP-A-2001-277740 and JP-A-2001-277742. In such a case, each constituting component may be present inside or outside the microcapsule in an appropriate ratio.

As a method of microencapsulating the constituting components of the photosensitive layer, known methods can be used. Methods for the production of microcapsules include, for example, a method of utilizing coacervation described in U.S. Pat. Nos. 2,800,457 and 2,800,458, a method of using interfacial polymerization described in U.S. Pat. No. 3,287, 154, JP-B-38-19574 and JP-B-42-446, a method of using deposition of polymer described in U.S. Pat. Nos. 3,418,250 and 3,660,304, a method of using an isocyanate polyol wall material described in U.S. Pat. No. 3,796,669, a method of using an isocyanate wall material described in U.S. Pat. No. 3,914,511, a method of using a urea-formaldehyde-type or urea-formaldehyde-resorcinol-type wall-forming material described in U.S. Pat. Nos. 4,001,140, 4,087,376 and 4,089, 802, a method of using a wall material, for example, a melamine-formaldehyde resin or hydroxycellulose described in U.S. Pat. No. 4,025,445, an in-situ method by polymerization of monomer described in JP-B-36-9163 and JP-B-51-9079, a spray drying method described in British Patent 930, 422 and U.S. Pat. No. 3,111,407, and an electrolytic dispersion cooling method described in British Patents 952, 807 and 967,074, but the invention should not be construed as being limited thereto.

A preferable microcapsule wall used in the invention has three-dimensional crossing and has a solvent-swellable property. From this point of view, a preferable wall material of the microcapsule includes polyurea, polyurethane, polyester, polycarbonate, polyamide and a mix thereof, and particularly polyurea and polyurethane are preferred. Further, a compound having a crosslinkable functional group, for example, an ethylenically unsaturated bond, capable of being introduced into the hydrophobic binder polymer described above may be introduced into the microcapsule wall.

An average particle size of the microcapsule is preferably from 0.01 to 3.0 more preferably from 0.05 to 2.0 μm, and particularly preferably from 0.10 to 1.0 μm. In the above-described range, preferable resolution and good preservation stability c be achieved.

<Other Constituting Components of Photosensitive Layer>

Into the photosensitive layer according to the invention, various additives can further be incorporated, if desired. Such additives are described in detail below.

<Surfactant>

In the invention, it is preferred to use a surfactant in the photosensitive layer in order to progress the developing property and to improve the state of surface coated. The surfactant includes, for example, a nonionic sac an anionic surfactant, a cationic surfactant, an amphoteric surfactant and a fluorine-based surfactant. The surfactants may be used individually or in combination of two or more thereof.

The nonionic surfactant used in the photosensitive layer of the invention is not particular restricted, and nonionic surfactants hitherto known can be used. Examples of the nonionic surfactant include polyoxyethylene alkyl ethers, polyoxyethylene alkyl phenyl ethers, polyoxyethylene polystryl phenyl ethers, polyoxyethylene polyoxypropylene alkyl ethers, glycerin fat acid partial esters, sorbitan fatty acid partial esters, pentaerythritol fatty acid partial esters, propylene glycol monofatty acid esters, sucrose fatty acid pa esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxyethylene alkylamines, triethanolamine fatty acid esters, trialylamine oxides, polyethylene glycols, and copolymers of polyethylene glycol and polypropylene glycol.

The anionic surfactant used in the photosensitive layer of the invention is not particularly restricted and anionic surfactants hitherto known can be used. Examples of the anionic surfactant include fatty acid salts, abietic acid salts, hydroxyalkanesulfonic acid salts, alkanesulfonic acid salts, dialkylsulfosuccinic ester salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkysulfophenyl ether salts, N-methyl-N-oleyltaurine sodium salt, N-alkylsulfosuccinic monoamide disodium salts, petroleum sulfonic acid salts, suited beef tallow oil, sulfate ester slits of fatty acid alkyl ester, alkyl sulfate ester salts, polyoxethylene alkyl ether sulfate ester salts, fatty acid monoglyceride sulfate ester salts, polyoxyethylene alkyl phenyl ether sulfate ester salts, polyoxyethylene styrylphenyl ether sulfate ester salts, alkyl phosphate ester salts, polyoxyethylene alkyl ether phosphate ester salts, polyoxyethylene alkyl phenyl ether phosphate ester salts, partial saponification products of styrene/maleic anhydride copolymer, partial saponification products of olefin/maleic anhydride copolymer and naphthalene sulfonate formalin condensates.

The cationic surfactant used in the photosensitive layer of the invention is not particularly restricted and cationic surfactants hitherto known can be used Examples of the cationic surfactant include alkylamine salts, quaternary ammonium salts, polyoxyethylene alkyl amine salts and polyethylene polyamine derivatives.

The amphoteric surfactant used in the photosensitive layer of the invention is not particularly restricted and amphoteric surfactants hitherto known can be used Examples of the amphoteric surfactant include carboxybetaines, aminocarboxylic acids, sulfobetaines, aminosulfuric esters and imidazolines.

In the surfactants described above, the term "polyoxyethylene" can be replaced with "polyoxyalkylene", for example, polyoxymethylene, polyoxypropylene or polyoxybutylene, and such surfactants can also be used in the invention.

Further, a preferred surfactant includes a fluorine-based surfactant containing a perfluoroalkyl group in its molecule. Examples of the fluorine-based surfactant include an anionic type, for example, perfluoroalkyl carboxylates, perfluoroalkyl sulfonates or perfluoroalkylphosphates; an amphoteric type, for example, perfluoroallyl betaines, a cationic type, for example, perfluoroalkyl trimethyl ammonium salts; and a nonionic type, for example, perfluoroalkyl amine oxides, perfluoroalkyl ethylene oxide adducts, oligomers having a perfluoroalkyl group and a hydrophilic group, oligomers having a perfluoroalkyl group and an oleophilic group, oligomers having a perfluoroalkyl group, a hydrophilic group and an oleophilic group or urethanes having a perfluoroalkyl group and an oleophilic group. Further, fluorine-based surfactants described in JP-A-62-170950, JP-A-2-226143 and JP-A-60-168144 are also preferably exemplified.

In the surfactants, the anionic surfactant and the cationic surfactant are preferably used, in view of the developing property. A content of the surfactant is preferably from 0.001 to 10% by weight, more preferably from 0.01 to 7% by weight, based on the total solid content of the photosensitive layer.

<Hydrophilic Polymer>

In the invention, a hydrophilic polymer may be incorporated into the photosensitive layer in order to improve the developing property and dispersion stability of microcapsule.

Preferable examples of the hydrophilic polymer include those having a hydrophilic group, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group and a phosphoric acid group.

Specific examples of the hydrophilic polymer include gum arabic, casein, gelatin, a starch derivative, carboxymethyl celluose or a sodium salt thereof, cellulose acetate, sodium alginate, a vinyl acetate-maleic acid copolymer, a styrene-maleic acid copolymer, polyacrylic acid or a salt thereof, polymethacrylic acid or a salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, polyethylene glycol, a hydroxypropylene polymer, polyvinyl alcohol, a hydrolyzed polyvinyl acetate having a hydrolysis degree of 60% by mole or more, preferably 80% by mole or more, polyvinyl formal, polyvinyl butyral, polyvinylpyrrolidone, a homopolymer or polymer of acrylamide, a homopolymer or copolymer of methacrylamide, a homopolymer or copolymer of N-methylolacrylamide, polyvinylpyrrolidone, an alcohol-soluble nylon, and a polyether of 2,2-bis(4-hydroxyphenyl)propane with epichlorohydrin.

The hydrophilic polymer preferably has a weight average molecular weight of 5,000 or more, more preferably from 10,000 to 300,000. The hydrophilic polymer may be any of a random polymer, a block polymer, a graft polymer or the like.

The content of the hydrophilic polymer in the photosensitive layer is preferably 20% by weight or less, more preferably 10% by weight or less, based on the total solid content of the photosensitive layer.

<Coloring Agent>

In the invention, a dye having large absorption in the visible light region can be used as a coloring agent for the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industry Co., Ltd.), Victoria Pure Blue, Crystal Violet (CI42555), Methyl Violet (CI42535), Ethyl Violet, Rhodamine B (CI45170B), Malachite Green (CI42000), Methylene Blue (CI52015), and dyes described in JP-A-62-293247. Also, a pigment, for example, phthalocyanine-based pigment, azo-based pigment, carbon black and titanium oxide can be preferably used.

It is preferable to add the coloring agent, because the image area and the non-image area after the image formation can be easily distinguished. The amount of the coloring agent added is preferably from 0.01 to 10% by weight based on the total solid content of the photosensitive layer.

<Print-Out Agent>

In the photosensitive layer according to the invention, a compound capable of undergoing discoloration by the effect of an acid or a radical can be added in order to form a printout image. As such a compound, for example, various dyes, e.g., diphenylmethane-based, triphenylmethane-based, thiazine-based, oxazine-based, xanthene-based, anthraquinone-based, iminoquione-based, azo-based and azomethine-based dyes are effectively used.

Specific examples thereof include dyes, for example, Brilliant Green, Ethyl Violet, Methyl Green, C Violet, Basic Fuchsine, Methyl Violet 2B, Quinaldine Red, Rose Bengale, Metanil Yellow, Thymolsulfophthalein, Xylenol Blue, Methyl Orange, Paramethyl Red, Congo Red, Benzopurpurine 4B, α-Naphthyl Red, Nile Blue 2B, Nile Blue A, Methyl Violet, Malachite Green, Parafuchsine, Victoria Pure Blue BOH produced by Hodogaya Chemical Co., Ltd.), Oil Blue #603 produced by Orient Chemical Industry Co., Ltd.), Oil Pink #312 (produced by Orient Chemical Industry Co., Ltd.), Oil Red 5B produced by Orient Chemical Industry Co., Ltd), Oil Scarlet #308 produced by Orient Chemical Industry Co., Ltd.), Oil Red OG (produced by Orient Chemical Industry Co., Ltd.), Oil Red RR produced by Orient Chemical Industry Co., Ltd.), Oil Green #502 (produced by Orient Chemical Industy Co., Ltd.), Spiron Red BEH Special (produced by Hodogaya Chemical Co., Ltd.), m-Cresol Purple, Cresol Red Rhodamine 1, Rhodamine 6G, Sulforhodamine B, Auramine, 4-p-diethylaminophenyliminonaphthoquinone, 2-carboxyanilino-4-p-diethylaminophenyliminonaphthoquinone, 2-carboxystearyl-amino-4-p-N,N-bis(hydroxyethyl)aminophenyliminonaphthoquinone, 1-phenyl-3-methyl p-diethylaminophenylimino-5-pyrazolone and 1-β-napthyl-4-p-diethylaminophenylimino-5-pryazolone, and leuco dyes, for example, p,p',p''-hexamethyltriaminiotriphenyl methane (leuco Crystal Violet) and Pergascript Blue SRB (produced by Ciba Geigy).

Other preferable examples include leuco dyes known as a material for heat-sensitive paper or pressure-sensitive paper. Specific examples thereof include Crystal Violet Lactone, Malachite Green Lactone, Benzoyl Leuco Methylene Blue, 2-(N-phenyl-N-methylamino)-6-N-p-tolyl-N-ethyl)aminofluorane, 2-anilino-3-methyl-6-(N-ethyl-p-toluidino)fluorane, 3,6-dimethoxyfluorane, 3-(N,N-diethylamino)-5-methyl-7-(N,N-dibenzylamino)fluorane, 3-N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidinofluorane, 3-N-diethylamino)-6-methyl-7-chlorofluorane, 3-(N,N-diethylamino)-6-methoxy-7-aminofluorane, 3-N,N-diethylamino-7-(4-chloroanilino)fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-aminofluorane, 3-(N,N-dibutylamino)-6-methyl-7-xylidinofluorane, 3-piperidino-methyl-7-anilinofluorane, 3-pyrrolidino-6-methyl-7-anilinofluorane, 3,3-bis(1-ethyl-2-methylindol-3-yl)phthalide, 3,3-bis(1-n-butyl-2-methylindol-3-yl)phthalide, 3,3-bis-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-1-methylindol-3-yl) phthalide.

The dye capable of undergoing discoloration by the effect of an acid or a radical is preferably added in an amount of 0.01 to 15% by weight based on the total solid content of the photosensitive layer.

<Polymerization Inhibitor>

In the photosensitive layer according to the invention, a small amount of a thermal polymerization inhibitor is preferably added in order to prevent the radical polymerizable compound from undergoing undesirable thermal polymerization during the preparation or preservation of the photosensitive layer.

Preferable examples of the thermal polymerization inhibitor include hydroquinone, p-methoxyphenol, di-tert-butyl-p-cresol, pyrogallol, text-butyl catechol, benzoquinone, 4,4'-thiobis(3-methyl-tert-butylphenol), 22-methylenebis(4-methyl-6-tert-butylphenol) and N-nitroso-N-phenylhydroxylamine aluminum salt.

The amount of the thermal polymerization inhibitor added is preferably from about 0.01 to about 5% by weight based on the total solid content of the photosensitive layer.

<Higher Fatty Acid Derivative>

In the photosensitive layer according to the invention, for example, a higher fatty acid derivative, e.g., behenic acid or behenic acid amide may be added and localized on the surface of the photosensitive layer during the process of drying after coating in order to avoid polymerization inhibition due to oxygen. The amount of the higher fatty acid derivative added is preferably from about 0.1 to about 10% by weight based on the total solid content of the photosensitive layer.

<Plasticizer>

The photosensitive layer according to the invention may contain a plasticizer. Preferable examples of the plasticizer include a phthalic acid ester, for example, dimethyl phthalate, diethyl phthalate, dibutyl phthalate, diisobutyl phthalate, diocyl phthalate, octyl capryl phthalate, dicyclohexyl phthalate, ditridecyl phthalate, butyl benzyl phthalate, diisodecyl phthalate or diallyl phthalate; a glycol ester, for example, dimethyl glycol phthalate, ethyl phthalylethyl glycolate, methyl phthalylethyl glycolate, butyl phthalylbutyl glycolate or triethylene glycol dicaprylic acid ester; a phosphoric acid ester, for example, tricresyl phosphate or triphenyl phosphate; an aliphatic dibasic acid ester, for example, diisobutyl adipate, dioctyl adipate, dimethyl sebacate, dibutyl sebacate, diocyl azelate or dibutyl maleate; polyglycidyl methacrylate, triethyl citrate, glycerin triacetyl ester and butyl laurate, The content of the plasticizer is preferably about 30% by weight or less based on the total solid content of the photosensitive layer.

<Fine Inorganic Particle>

The photosensitive layer according to the invention may contain fine inorganic particle in order to increase strength of the hardened layer in the image area. The fine inorganic particle preferably includes, for example, silica, alumina, magnesium oxide, titanium oxide, magnesium carbonate, calcium alginate and a mixture thereof. Even if the fine inorganic particle has no light to heat converting property, it can be used, for example, for strengthening the layer or enhancing interface adhesion property due to surface roughening. The fine inorganic particle preferably has an average particle size from 5 nm to 10 μm and more preferably from 0.5 to 3 μm. In the above-described range, it is stably dispersed in the photosensitive layer, sufficiently maintains the film strength of the photosensitive layer and can form the non-image area excellent in hydrophilicity and preventing from stain at the printing.

The fine inorganic particle described above is easily available as a commercial product, for example, colloidal silica dispersion.

The content of the fine inorganic particle is preferably 20% by weight or less, and more preferably 10% by weight or less based on the total solid content of the photosensitive layer.

<Hydrophilic Low Molecular Weight Compound>

The photosensitive layer according to the invention may contain a hydrophilic low molecular weight compound in order to improve the developing property. The hydrophilic low molecular weight compound includes a water-soluble organic compound, for example, a glycol compound, e.g., ethylene glycol, diethylene glycol, triethylene glycol, propylene glycol, dipropylene glycol or tripropylene glycol, or an ether or ester derivative thereof, a polyhydroxy compound, e.g., glycerine or pentaerythritol, an organic amine, e.g., triethanol amine, diethanol amine or monoethanol amine, or a salt thereof, an organic sulfonic acid, e.g., toluene sulfonic acid or benzene sulfonic acid, or a salt thereof, an organic phosphonic acid, e.g., phenyl phosphonic acid, or a salt thereof, an organic carboxylic acid, e.g., tartaric acid, oxalic acid, citric acid, maleic acid, lactic acid, gluconic acid or an amino acid, or a salt thereof, and an organic quaternary ammonium salt, e.g., tetraethyl ammonium hydrochloride, <Co-Sensitizer>

The sensitivity of the photosensitive layer can be further increased by using a certain additive. Such a compound is referred to as a co-sensitizer in the invention. The operation mechanism of the co-sensitizer is not quite clear but may be considered to be mostly based on the following chemical process. Specifically, the co-sensitizer reacts with various intermediate active species (for example, a radical, a peroxide, an oxidizing agent or a reducing agent) generated during the process of photo-reaction initiated by light absorption of the photopolymerization initiation system and subsequent addition-polymerization reaction to produce new active radicals. The co-sensitizers are roughly classified into (a) a compound which is reduced to produce an active radical (b) a compound which is oxidized to produce an active radical and (c) a compound which reacts with a radical having low activity to convert it into a more highly active radical or acts as a chain Per agent. However, in many cases, a common view about that an individual compound belongs to which type is not present.

(a) Compound which is Reduced to Produce an Active Radical

Compound Having Carbon-Halogen Bond:

An active radical is considered to be generated by the reductive cleavage of the carbon-halogen bond. Specific examples of the compound preferably used include a trihalomethyl-s-triazine and a trihalomethyloxadiazole.

Compound Having Nitrogen-Nitrogen Bond:

An active radical is considered to be generated by the reductive cleavage of the nitrogen-nitrogen bond. Specific examples of the compound preferably used include a hexaarylbiimidazole.

Compound Having Oxygen-Oxygen Bond:

An active radical is considered to be generated by the reductive cleavage of the oxygen-oxygen bond. Specific examples of the compound preferably used include an organic peroxide.

Onium compound:

An active radical is considered to be generated by the reductive cleavage of a carbon-hetero bond or oxygen-nitrogen bond. Specific examples of the compound preferably used include a diaryliodonium salt, a triarylsulfonium salt and an N-alkoxypyridinium (azinium) salt.

Ferrocene and Iron Allene Complexe:

An active radical can be reductively generated.

(b) Compound which is Oxidized to Produce an Active Radical

Alkylate Complex:

An active radial is considered to be generated by the oxidative cleavage of a carbon-hetero bond. Specific examples of the compound preferably used include a triaryl alkyl borate.

Alkylamine Compound:

An active radical is considered to be generated by the oxidative cleavage of a C—X bond on the carbon adjacent to nitrogen, wherein X is preferably a hydrogen atom, a carboxy group, a trimethylsilyl group or a benzyl group. Specific examples of the compound include an ethanolamine, an N-phenylglycine and an N-trimethylsilylmethylaniline.

Sulfur-Containing or Tin-Containing Compound:

A compound in which the nitrogen atom of the above-described amine is replaced by a sulfur atom or a tin atom is considered to generate an active radical in the same manner.

Also, a compound having an S—S bond is known to effect sensitization by the cleavage of the S—S bond.

α-Substituted Methylcarbonyl Compound:

An active radical can be generated by the oxidative cleavage of carbonyl-α-carbon bond. The compound in which the carbonyl is converted into an oxime ether also shows the similar function. Specific examples of the compound include an 2-alkyl-1-[4-(alkylthio)phenyl]-2-morpholinopronone-1 and an oxime ether obtained by a reaction of the 2-alkyl-1-[4-(alkylthio)phenyl]-2-morpholinopronone-1 with a hydroxyamine and subsequent etherification of the N—OH.

Sulfinic Acid Salt:

An active radical can be reductively generated. Specific examples of the compound include sodium arylsulfinate.

(c) Compound which Reacts with a Radical to Convert it into a More Highly Active Radical or Acts as a Chain Transfer Agent:

For example, a compound having SH, PH, SiH or GeH in its molecule is used as the compound which reacts with a radical to convert it into a more highly active radical or acts as a chain transfer agent. The compound donates hydrogen to a low active radical species to generate a radical or is oxidized and deprotonized to generate a radical. Specific examples of the compound include a 2-mercaptobenzimidazole.

A large number of examples of the co-sensitizer are more specifically described, for example, in JP-A-9-236913 as additives for the purpose of increasing sensitivity. Some of them are set forth below, but the invention should not be construed as being limited hereto.

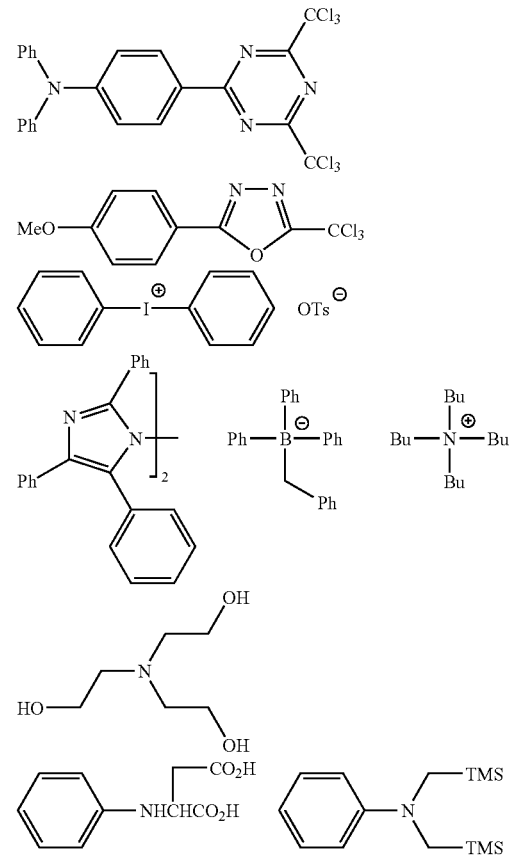

-continued

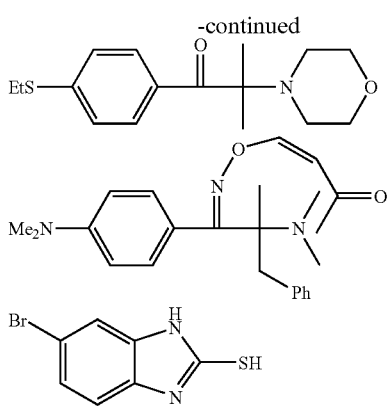

Similarly to the above-described sensitizing dye, the co-sensitizer can be subjected to various chemical modifications so as to improve the characteristics of the photosensitive layer of the lithographic printing plate precursor. For instance, methods, for example, binding to the sensitizing dye, polymerization initiator, addition-polymerizable unsaturated compound or other radical-generating part introduction of a hydrophilic site, introduction of a substituent for improving compatibility or inhibiting deposition of crystal, introduction of a substituent for improving an adhesion property, and formation of a polymer, may be used. The co-sensitizers may be used individually or in combination of two or more thereof. The amount of the co-sensitizer used is ordinarily from 0.05 to 100 parts by weight, preferably from 1 to 80 parts by weight, more preferably from 3 to 50 parts by weight, per 100 parts by weight of the polymerizable compound having an ethylenically unsaturated double bond.

<Formation of Photosensitive Layer>

The photosensitive layer according to the invention is formed by dispersing or dissolving each of the necessary constituting components described above to prepare a coating solution and coating the solution. The solvent used include, for example, ethylene dichloride, cyclohexanone, methyl ethyl ketone, methanol, ethanol, propanol, ethylene glycol monomethyl ether, 1-methoxy-2-propanol, 2-methxyethyl acetate, 1-methoxy-2-propyl acetate, dimethoxyethane, methyl lactate, ethyl lactate, N,N-dimethylacetamide, N,N-dimethylformamide, tetramethylurea. N-methylpyrrolidone, dimethylsulfoxide, sulfolane, γ-butyrolactone, toluene and water, but the invention should not be construed as being limited thereto. The solvents may be used individually or as a mixture. The solid concentration of the coating solution is preferably from 1 to 50% by weight.

The photosensitive layer according to the invention may also be formed by preparing plural coating solutions by dispersing or dissolving the same or different components described above into the same or different solvents and conducting repeatedly plural coating and drying.

The coating amount (solid content) of the photosensitive layer on the support after the coating and drying may be varied depending on the use, but ordinarily, it is preferably from 0.3 to 3.0 g/m². In the above-described range, the preferable sensitivity and good film property of the photosensitive layer can be obtained.

Various methods can be used for the coating. Examples of the method include bar coater coating, spin coating, spray coating, curtain coating, dip coating, air knife coating, blade coating and roll coating.

<Protective Layer>

In the lithographic printing plate precursor according to the invention, a protective layer (oxygen-blocking layer) is preferably provided on the photosensitive layer in order to prevent diffusion and penetration of oxygen which inhibits the polymerization reaction at the time of exposure. The protective layer for use in the invention preferably has oxygen permeability (A) at 25° C. under one atmosphere of $1.0 \leq (A) \leq 20$ (ml/m²·day). When the oxygen permeability (A) is extremely lower than 1.0 (ml/m²·day), problems may occur in that an undesirable polymerization reaction arises during the production or preservation before image exposure and in that undesirable fog or spread of image line occurs at the image exposure. On the cony, when the oxygen permeability (A) greatly exceeds 20 (ml/m²·day), decrease in sensitivity may be incurred. The oxygen permeability (A) is more preferably in a range of $1.5 \leq (A) \leq 12$ (ml/m²·day), and still more preferably in a range of $2.0 \leq (A) \leq 10.0$ (ml/m²·day). Besides the above described oxygen permeability, as for the characteristics required of the protective layers it is desired that the protective layer does not substantially hinder the transmission of light for the exposure, is excellent in adhesion to the photosensitive layer, and can be easily removed during a development step after the exposure. Contrivances on the protective layer have been heretofore made and described in detail in U.S. Pat. No. 3,458,311 and JP-B5549729.

As the material of the protective layer, a water-soluble polymer compound relatively excellent in crystallizability is preferably used. Specifically, a water-soluble polymer, for example, polyvinyl alcohol, vinyl alcohol/vinyl phthalate copolymer, vinyl acetate/vinyl alcohol/vinyl phthalate copolymer, vinyl acetate/crotonic acid copolymer, polyvinyl pyrrolidone, acidic cellulose, gelatin, gum arabic, polyacrylic acid or polyacrylamide is enumerated. The water-soluble polymer compounds may be used individually or as a mixture. Of the compounds, when polyvinyl alcohol is used as a main component, the best results can be obtained In the fundamental characteristics, for example, oxygen-blocking property and removability of the protective layer by development.

Polyvinyl alcohol for use in the protective layer may be partially substituted with ester, ether or acetal as long as it contains unsubstituted vinyl alcohol units for achieving the necessary oxygen-blocking property and water solubility. Also, a part of polyvinyl alcohol may have other copolymer component. As specific examples of polyvinyl alcohol, those having a hydrolyzing rate of 71 to 100% and a polymerization repeating unit number of 300 to 2,400 are exemplified. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224B, PVA-405, PVA-420, PVA-613 and L-8 (produced by Kuraray Co., Ltd.). They can be used individually or as a mixture. According to a preferred embodiment, the content of polyvinyl alcohol in the protective layer is from 20 to 95% by weight, more preferably from 30 to 90% by weight.

Also, known modified polyvinyl alcohol can be preferably used. For instance, polyvinyl alcohols of various polymerization on degrees having at random a various kind of hydrophilic modified cites, for example, an anion-modified cite modified with an anion, e.g., a carboxyl group or a sulfo group, a cation-modified cite modified with a cation, e.g., an amino group or an ammonium group, a silanol-modified cite or a thiol-modified cite, and polyvinyl alcohols of various polymerization degrees having at the terminal of the polymer a various kind of modified cites, for example, the above-described anion-modified cite, cation modified cite, silanol-modified cite or above-modified cite, an alkoxy-modified cite, a sulfide-modified cite, an ester modified cite of vinyl alcohol with a various kind of organic acids, an ester modified cite of the above-described anion-modified cite with an alcohol or an epoxy-modified cite are exemplified.

As a component used as a mixture with polyvinyl alcohol, polyvinyl pyrrolidone or a modified product thereof is preferable from Me viewpoint of the oxygen-blocking property and removability by development. The content thereof is ordinarily from 3.5 to 80% by weight, preferably from 10 to 60% by weight, and more preferably from 15 to 30% by weight, in the protective layer.

The components of the protective layer (selection of PVA and use of additives) and the coating amount are determined taking into consideration fogging property, adhesion property and scratch resistance besides the oxygen-blocking property and removability by development. In general, the higher the hydrolyzing rate of the PVA used (the higher the unsubstituted vinyl alcohol unit content in the protective layer) and the larger the layer thickness, the higher is the oxygen-blocking property, thus it is advantageous in the point of sensitivity. The molecular weight of the (co)polymer, for example, polyvinyl alcohol (PVA) is ordinarily from 2,000 to 10,000,000, and preferably from 20,000 to 3,000,000.

As other additive of the protective layer, glycerin, dipropylene glycol or the like can be added in an amount corresponding to several % by weight of the (co)polymer to provide flexibility. Further, an anionic surfactant, for example, sodium alkylsulfate or sodium alkylsulfonate; an amphoteric surfactant, for example, alkylaminocarboxylate and alkylaminodicarboxylate; or a nonionic surfactant, for example, polyoxyethylene alkyl enyl ether can be added in an amount corresponding to several % by weight of the (co)polymer.

The adhesion property of the protective layer to the photosensitive layer and scratch resistance are also extremely important in view of handling of the printing plate precursor. Specifically, when a hydrophilic layer comprising a water-soluble polymer is laminated on a oleophilic photosensitive layer, layer peeling due to insufficient adhesion is liable to occur, and the peeled portion causes such a defect as failure in hardening of the photosensitive layer due to polymer ton inhibition by oxygen. Various proposals have been made for improving the adhesion between the photosensitive layer and the protective layer. For example, it is described in U.S. patent Application Nos. 292,501 and 44,563 that a sufficient adhesion property can be obtained by mixing from 20 to 60% by weight of an acryl-based emulsion or a water-insoluble vinyl pyrrolidone/vinyl acetate copolymer with a hydrophilic polymer mainly comprising polyvinyl alcohol and laminating the resulting mixture on the photosensitive layer. Any of these known techniques can be applied to the protective layer according to the invention. Coating methods of the protective layer are described in detail, for example, in U.S. Pat. No. 3,458,311 and JP-B-55-49729.

Further, it is also preferred to incorporate an inorganic stratiform compound into the protective layer of the lithographic printing plate precursor according to the invention for the purpose of improving the oxygen-blocking property and property for protecting the surface of photosensitive layer.

The inorganic stratiform compound used here is a panicle having a thin tabular shape and includes, for instance, mica, for example, natural mica represented by the following formula: A (B, C)$_{2-5}$D$_4$O$_{10}$(OH, F, O)$_2$, (wherein A represents any one of; Na and Ca, B and C each represents any one of Fe (II), Fe(III), Mn, Al, Mg and V, and D represents Si or Al) or synthetic mica; talc represented by the following formula: 3MgO.4SiO.H$_2$O; teniolite; montmorillonite; saponite; hectolite; and zirconium phosphate.

Of the micas, examples of the natural mica include muscovite, paragonite, phlogopite, biotite and lepidolite. Examples of the synthetic mica include non-swellable mica, for example, fluorphlogopite KMg$_3$(AlSi$_3$O$_{10}$)F$_2$ or potassium tetrasilic mica KMg$_{2.5}$(Si$_4$O$_{10}$)F$_2$, and swellable mica, for example, Na tetrasilic mica NOaMg$_{2.5}$(Si$_4$O$_{10}$)F$_2$, Na or Li teniolite (Na, Li)Mg$_2$Li(Si$_4$O$_{10}$)F$_2$, or montmorillonite based Na or Li hectolite (Na, Li)$_{1/8}$Mg$_{2/5}$Li$_{1/8}$(Si$_4$O$_{10}$)F$_2$. Synthetic smectite is also useful.

Of the inorganic stratiform compounds, fluorine based swellable mica, which is a synthetic inorganic stratiform compound, is particularly useful in the invention. Specifically, the swellable synthetic mica and an swellable clay mineral, for example, montmorillonite, saponite, hectolite or bentonite have a stratiform structure comprising a unit crystal lattice layer having thickness of approximately 10 to 15 angstroms, and metallic atom substitution in the lattices thereof is remarkably large in comparison with other clay minerals. As a result, the lattice layer rets in lack of positive charge and to compensate it, a cation, for example, Na$^+$, Ca$^{2+}$ or Mg$^{2+}$, is adsorbed between the lattice layers. The cation existing between the lattice layers is referred to as an exchangeable cation and is exchangeable with various cations, In particular, in the case where the cation between the lattice layers is Li+ or Na$^+$, because of a small ionic radius, a bond between the stratiform crystal lattices is week, and the inorganic stratiform compound greatly swells upon contact with water. When share is applied under such condition, the stratiform crystal lattices are easily cleaved to form a stable sol in water. The bentnite and swellable synthetic mica have strongly such tendency and are useful in the invention. Particularly, the swellable synthetic mica is preferably used.

With respect to the shape of the inorganic stratiform compound used in the invention, the thinner the thickness or the larger the plain size as long as smoothness of coated surface and transmission of actinic radiation are not damaged, the better from the standpoint of control of diffusion. Therefore, an aspect ratio of the inorganic stratiform compound is ordinarily 20 or more, preferably 100 or more, and particularly preferably 200 or more. The aspect ratio is a ratio of thickness to major axis of particle and can be determined, for example, from a projection drawing of particle by a microphotography. The larger the aspect ratio, the greater the effect obtained.

As for the particle size of the inorganic stratiform compound used in the invention, an average major axis is ordinarily from 0.3 to 20 µm, preferably from 0.5 to 10 µm, and particularly preferably from 1 to 5 µm. An average thickness of the particle is ordinarily 0.1 µm or less, preferably 0.05 µm or less, and particularly preferably 0.01 µm or less. For example, in the swellable synthetic mica that is the representative compound of the inorganic stratiform compounds, thickness is approximately from 1 to 50 nm and plain size is approximately from 1 to 20 µm.

When such an inorganic stratiform compound particle having a large aspect ratio is incorporated into the protective layer, strength of coated layer increases and penetration of oxygen or moisture can be effectively inhibited so that the protective layer can be prevented from deterioration due to deformation, and even when the lithographic printing plate precursor is preserved for a long period of time under a high humidity condition, it is prevented from decrease in the image-forming property thereof due to the change of humidity and exhibits excellent preservation stability.

The content of the inorganic stratiform compound in the protective layer is preferably from 5/1 to 1/00 in terms of weight ratio to the amount of binder used in the protective layer. When a plurality of inorganic stratiform compounds is used in combination, it is also preferred that the total amount of the inorganic stratiform compounds fulfills the above-described weight ratio.

An example of common dispersing method for the inorganic stratiform compound used in the protective layer is described below. Specifically, from 5 to 10 parts by weight of a swellable stratiform compound that is exemplified as a preferred inorganic stratiform compound is added to 100 parts by weight of water to adapt the compound to water and to be swollen, followed by dispersing using a dispersing machine. The dispersing machine used include, for example, a variety of mills conducting dispersion by directly applying mechanical power, a high-speed agitation type dispersing machine providing a large shear force and a dispersion machine providing ultrasonic energy of high intensity. Specific examples thereof include a ball mill, a sand a grinder mill, a visco mill, a colloid mill, a homogenizer, a dissolver, a polytron, a homomixer, a homoblender, a keddy mill, a jet agitor, a capillary type emulsifying device, a liquid siren, an electromagnetic stain type ultrasonic generator and an emulsifying device having a Polman whistle. A dispersion containing from 5 to 10% by weight of the inorganic stratiform compound thus prepared is highly viscous or gelled and exhibits extremely good preservation stability. In the formation of a coating solution for protective layer using the dispersion, it is preferred that the dispersion is diluted with water, sufficiently stirred and then mixed with a binder solution.

To the coating solution for protective layer can be added known additives, for example, a surfactant for improving coating property or a water-soluble plasticizer for improving physical property of coated layer in addition to the inorganic stratiform compound. Examples of the water-soluble plasticizer include propionamide, cyclohexanediol, glycerin or sorbitol. Also, a water-soluble (meth)acrylic polymer can be added. Further, to the coating solution may be added known additives for increasing adhesion to the photosensitive layer or for improving preservation stability of the coating solution.

The coating solution for protective layer thus-prepared is coated on the photosensitive layer provided on the support and then dried to form a protective layer. The coating solvent may be appropriately selected in view of the binder used, and when a water-soluble polymer is used, distilled water or purified water is preferably used as the solvent. A coating method of the protective layer is not particularly limited, and known methods, for example, methods described in U.S. Pat. No. 3,458,311 and JP-B-55-49729 can be utilized. Specific examples of the coating method for the protective layer include a blade coating method, an air knife coating method, a gravure coating method, a roll coating method, a spray coating method, a dip coating method and a bar coating method.

A coating amount of the protective layer is preferably in a range from 0.05 to 10 g/m$^2$ in terms of the coating amount after drying. When the protective layer contains the inorganic stratiform compound, it is more preferably in a range from 0.1 to 0.5 g/m$^2$, and when the protective layer does not contain the inorganic stratiform compound, it is more preferably in a range from 0.5 to 5 g/m$^2$.

[Support]

The support for use in the lithographic printing plate precursor according to the invention is not particularly restricted as long as it is a dimensionally stable plate-like hydrophilic support. The support includes, for example, paper, paper laminated with plastic (for example, polyethylene, polypropylene or polystyrene), a metal plate (for example, aluminum, zinc or copper plate), a plastic film (for example, cellulose diacetate, cellulose triacetate, cellulose propionate, cellulose butyrate, cellulose acetatebutyrate, cellulose nitrate, polyethylene terephtlalate, polyethylene, polystyrene, polypropylene, polycarbonate or polyvinyl acetyl film) and paper or a plastic film laminated or deposited with the metal described above. Preferable examples of the support include a polyester film and an aluminum plate. Among them, the aluminum plate is preferred since it has good dimensional stability and is relatively inexpensive.

The aluminum plate includes a pure aluminum plate, an alloy plate comprising aluminum as a main component and containing a trace amount of hetero elements and a thin film of aluminum or aluminum alloy laminated with plastic. The hetero element contained in the aluminum alloy includes, for example, silicon, iron, manganese, copper, magnesium, chromium, zinc, bismuth, nickel and titanium. The content of the hetero element in the aluminum alloy is preferably 10% by weight or less. Although a pure aluminum plate is preferred in the invention, since completely pure aluminum is difficult to be produced in view of the refining technique, the aluminum plate may slightly contain the hetero element. The composition is not specified for the aluminum plate and those materials known and used conventionally can be appropriately utilized.

The thickness of the support is preferably from 0.1 to 0.6 mm, more preferably from 0.15 to 0.4 mm and still more preferably from 0.2 to 0.3 mm.

Prior to the use of alumina plate, a surface treatment, for examples roughening treatment or anodizing treatment is preferably performed. The surface treatment facilitates improvement in the hydrophilic property and ensures adhesion between the photosensitive layer and the support. In advance of the roughening treatment of the aluminum plate, a degreasing treatment, for example, with a surfactant, an organic solvent or an aqueous alkaline solution is conducted for removing rolling oil on the surface thereon if desired.

The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively).

As the method of the mechanical roughening treatment, a known method, for example, a ball grinding method, a brush grinding method, a blast g method or a buff grinding method can be used.

The electrochemical roughening treatment method includes, for example, a method of conducting it by passing alternating current or direct current in an electrolyte containing an acid, for example, hydrochloric acid or nitric acid. Also, a method of using a mixed acid described in JP-A-54-63902 can be used.

The aluminum plate after the roughening treatment is then subjected, if desired, to an alkali etching treatment using an aqueous solution, for example, of potassium hydroxide or sodium hydroxide and further subjected to a neutralizing treatment, and then subjected to an anodizing treatment in order to enhance the abrasion resistance, if desired.

As the electrolyte used for the anodizing treatment of the aluminum plate, various electrolytes capable of forming porous oxide film can be used. Ordinarily, sulfuric acid, hydrochloric acid, oxalic acid, chromic acid or a mixed acid thereof is used. The concentration of the electrolyte can be appropriately determined depending on the kind of the electrolyte.

Since the conditions of the anodizing treatment are varied depending on the electrolyte used, they cannot be defined generally. However, it is ordinarily preferred that electrolyte concentration in the solution is from 1 to 80% by weight, liquid temperature is from 5 to 70° C., current density is from 5 to 60 A/dm$^2$, voltage is from 1 to 100 V, and electrolysis time is from 10 seconds to 5 minutes. The amount of the anodized film formed is preferably from 1.0 to 5.0 g/m$^2$ and more preferably from 1.5 to 4.0 g/m$^2$. In the above-described range, good printing durability and favorable scratch resistance in the non-image area of lithographic printing plate can be achieved.

The aluminum plate subjected to the surface treatment and having the anodized film is used as it is as the support in the invention. However, in order to more improve adhesion to a layer provided thereon, hydrophilicity, resistance to sa heat insulating property or the like, other treatment, for example, a treatment for enlarging micropores or a sealing treatment of micropores of the anodized film described in JP-A-2001-253181 and JP-A-2001-322365, or a surface hydrophilizing treatment by immersing in an aqueous solution containing a hydrophilic compound, may be appropriately conducted. Needless to say, the enlarging treatment and sealing treatment are not limited to those described in the above-described patents and any conventionally known method may be employed.

As the sealing treatment, as well as a sealing treatment with steam, a sealing treatment with an aqueous solution containing an inorganic fluorine compound, for example, fluorozirconic acid alone or sodium fluoride, a sealing treatment with steam having added thereto lithium chloride or a sealing treatment with hot water may be employed.

Among them, the sealing treatment with an aqueous solution containing an inorganic fluorine compound, the sealing treatment with water vapor and a sealing treatment with hot water are preferred.

The hydrophilizing treatment includes an alkali metal silicate method described in U.S. Pat. Nos. 2,734,066, 3,181,461, 3,280,734 and 3,902,734. In the method, the support is subjected to an immersion treatment or an electrolytic treatment in an aqueous solution, for example, of sodium silicate. In addition, the hydrophilizing treatment includes, for example, a method of treating with potassium fluorozirconate described in JP-B-36-22063 and a method of treating with polyvinylphosphonic acid described in U.S. Pat. Nos. 3,276,868, 4,153,461, and 4,689,272.

In the case of using a support having a surface of insufficient hydrophilicity, for example, a polyester film, in the invention, it is desirable to coat a hydrophilic layer thereon to make the surface sufficiently hydrophilic. Examples of the hydrophilic layer preferably includes a hydrophilic layer formed by coating a coating solution containing a colloid of oxide or hydroxide of at least one element selected from beryllium, magnesium, aluminum, silicon, titanium, boron, germanium, tin, zirconium, iron, vanadium, antimony and a transition metal described in JP-A-2001-199175, a hydrophilic layer containing an organic hydrophilic matrix obtained by crosslinking or pseudo-crosslinking of an organic hydrophilic polymer described in JP-A-2002-79772, a hydrophilic layer containing an inorganic hydrophilic matrix obtained by sol-gel conversion comprising hydrolysis and condensation reaction of polyalkoxysilane and titanate, zirconate or aluminate, and a hydrophilic layer comprising an inorganic thin layer having a surface containing metal oxide. Among then, the hydrophilic layer formed by coating a coating solution containing a colloid of oxide or hydroxide of silicon is preferred.

Further, in the case of using, for example, a polyester film as the support in the invention, it is preferred to provide an antistatic layer on the hydrophilic layer side, opposite side to the hydrophilic layer or both sides. When the antistatic layer is provided between the support and the hydrophilic layer, it also contributes to improve the adhesion of the hydrophilic layer to the support. As the antistatic layer, a polymer layer having fine particles of metal oxide or a malting agent dispersed therein described in JP-A-2002-79772 can be used.

The support preferably has a center line average roughness of 0.10 to 1.2 μm. In the above-described range, good adhesion to the photosensitive layer, good printing durability, and good stain resistance can be achieve.

The color density of the support is preferably from 0.15 to 0.65 in terms of the reflection density value. In the above-described range, good image-forming property by preventing halation at the image exposure and good aptitude for plate inspection after development can be achieved.

[Backcoat Layer]

After applying the surface treatment to the support or forming the undercoat layer on the supports a backcoat layer can be provided on the back surface of the support if desired.

The back coat layer preferably includes, for example, a coating layer comprising an organic polymer compound described in JP-A-5-45885, and a coating layer comprising a metal oxide obtained by hydrolysis and polycondensation of an organic metal compound or an inorganic metal compound described in JP-A-6-35174, Among them, use of an alkoxy compound of silicon, for example, $Si(OCH_3)_4$, $Si(OC_2H5)_4$, $Si(OC_3H_7)_4$ or $Si(OCH_9)_4$ is preferred since the starting material is inexpensive and easily available.

[Plate-Making Method]

In the case wherein the binder (C) in the photosensitive layer has an acid value of 0.3 meq/g or less, after imagewise exposure of the lithographic printing plate precursor according to the invention by a light source having an oscillation wavelength of 350 to 450 nm, the unexposed area of the photosensitive layer are removed by rubbing a surface of the exposed lithographic printing plate precursor with a rubbing member in the presence of a developer having pH of 2 to 10 in an automatic processor, whereby an image can be formed on the surface of support.

Specifically, after removing the unexposed area of the photosensitive layer, the resulting lithographic printing plate can be immediately mounted on a printing machine to perform printing.

The processing by the automatic processor in such a manner is advantageous in view of being free from the measures against development scum resulting from the protective layer and photosensitive layer encountered in case of on-machine development.

The developer for use in the invention is an aqueous solution having pH of 2 to 10. For example, water alone or an aqueous solution containing water as a main component (containing 60% by weight or more of water) is preferable. Particularly, an aqueous solution having the same composition as conventionally known dampening water, an aqueous solution containing a surfactant (for example, an anionic, nonionic or cationic surfactant), or an aqueous solution containing a water-soluble polymer compound is preferable. An aqueous solution containing both a surfactant and a water-soluble polymer compound is especially preferable. The pH of the developer is preferably from 3 to 8, and more preferably from 4 to 7.

In the case of using an acidic to neutral developer, it is preferred that the developer contains any of an organic acid and an inorganic acid. By incorporating the organic acid or inorganic acid into the developer, the developing property can be improved at the plate-making and the occurrence of stain in the non-image area of die painting plate obtained by the plate-making can be prevented.

The anionic surfactant for use in the developer according to the invention includes, for example, fatty acid salts, abietic acid salts, hydroxyalkanesulfonic acid salts, alkanesulfonic acid salts, dialkylsulfosuccinic acid salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-meth yl-N-oleyltaurine sodium salt, N-alkylsulfosuccinic acid monoamide disodium salts, petroleum sulfonic acid salts, sulfated castor oil, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene yl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymer, partially saponified products of olefin-maleic anhydride copolymer and naphthalene sulfonate formalin condensates. Of the compounds, dialkylsulfosuccinic acid salts, alkyl sulfate ester salts and alkylnaphthalenesulfonic acid salts are particularly preferably used.

The cationic surfactant for use in the developer according to the invention is not particularly limited and conventionally known cationic surfactants can be used. Examples of the cationic surfactant include alkylamine salts, quaternary ammonium salts, polyoxyethylene alkyl amine salts and polyethylene polyamine derivatives.

The nonionic surfactant for use in the developer according to the invention includes, for example, polyethylene glycol type higher alcohol ethylene oxide addacts, alkylphenol ethylene oxide addacts, fatty acid ethylene oxide addacts, polyhydric alcohol fatty acid ester ethylene oxide addacts, higher alkylamine ethylene oxide addacts, fatty acid amide ethylene oxide addacts, ethylene oxide addacts of fat, polypropylene glycol ethylene oxide addacts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols aid fatty acid amides of alkanolamines.

The nonionic surfactants may be used individually or as a mixture of two or more thereof. In the invention, ethylene oxide addacts of sorbitol and/or sorbitan fatty acid esters, polypropylene glycol ethylene oxide addacts of dimethylsiloxane-ethylene oxide block copolymer, dimethylsiloxane-(propylene oxide-ethylene oxide) block copolymers and fatty acid esters of polyhydric alcohols are more preferable.

Further, from the standpoint of stable solubility in water or opacity, with respect to the nonionic surfactant used in the developer according to the invention, the HLB (hydrophile-lipophile balance) value thereof is preferably 6 or more, and more preferably 8 or more. Moreover, an amount of the nonionic surfactant contained in the developer is preferably from 0.01 to 10% by weight, and more preferably from 0.01 to 5% by weight.

Furthermore, an oxyethylene adduct of acetylene glycol type or acetylene alcohol type or a surfactant, for example, a fluorine-based surfactant or a silicon-based surfactant can also be used.

Of the surfactants used in the developer according to the invention, the nonionic surfactant is particularly preferred in view of foam depressing property.

The water-soluble polymer compound for use in the developer according to the invention includes, for example, soybean polysaccharide, modified starch, gum arabic, dextrin, a cellulose derivative (for example, carboxymethyl cellulose, carboxyethyl cellulose or methyl cellulose) or a modified product thereon pllulan, polyvinyl alcohol or a derivative thereof, polyvinyl pyrolidone, polyacrylamide, an acrylamide copolymer, a vinyl methyl ether/maleic anhydride copolymer, a vinyl acetate/maleic anhydride copolymer and a styrene/maleic anhydride copolymer.

As the soybean polysaccharide, those known can be used. For example, as a commercial product, Soyafive (trade name, produced by Fuji Oil Co., Ltd.) is available and various grade products can be used. The soybean polysaccharide preferably used has viscosity in a range from 10 to 100 mPa/sec in a 10% by weight aqueous solution thereof.

As the modified starch, known modified starch can be used. The modified starch can be prepared, for example, by a method wherein starch, for example, of corn, potato, tapioca, rice or wheat is decomposed, for example, with an acid or an enzyme to an extent that the number of glucose residue per molecule is from 5 to 30 and then oxypropylene is added thereto in alkali.

Two or more of the water-soluble polymer compounds may be used in combination. The content of the water-soluble polymer compound is preferably from 0.1 to 20% by weight, and more preferably from 0.5 to 10% by weight, in the developer.

The developer for use in the invention may contain an organic solvent. The organic solvent that can be contained in the developer include, for example, an aliphatic hydrocarbon (e.g., hexane, heptane, Isopar E, Isopar HK Isopar G (produced by Esso Chemical Co., Ltd.), gasoline or kerosene), an aromatic hydrocarbon (e.g., toluene or xylene), a halogenated hydrocarbon (methylene dichloride, ethylene dichloride, trichlene or nomochlorobenzene) and a polar solvent.

Examples of the polar solvent include an alcohol (e.g., methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl other, polypropylene glycol tetraethylene glycol, ethylene glycol monobutyl ether, ethylene glycol monobenzyl ether, ethylene glycol monophenyl ether, methyl phenyl carbinol, n-amyl alcohol or methylamyl alcohol), a ketone (e.g., acetone, methyl ethyl ketone, ethyl butyl ketone, methyl isobutyl ketone or cyclohexanone), an ester (e.g., ethyl acetate propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl phosphate, tricresyl phosphate, N-phenylethanolamine or N-phenyldiethanolamine), Further, when the organic solvent is insoluble in water, it may be employed by being solubilized in water using a surfactant or the like in the case where the developer contains the organic solvent, the concentration of the organic solvent is desirably less than 40% by weight in view of safety and inflammability.

Into the developer for use in the invention, an antiseptic agent, a chelating agent, a defoaming agent an organic acid, an inorganic acid, an inorganic salt or the like can be incorporated in addition to the above components.

As the antiseptic agent, for example, phenol or a derivative thereof, formalin, an imidazole derivative, sodium dehydroacetate, a 4-isothiazolin-3-one derivative, benzisotiazolin-3-one, a benzotriazole derivative, an amidine guanidine derivative, a quaternary ammonium salt, a pyridine derivative, a quinoline derivative, a guanidine derivative, diazine, a triazole derivative, oxazole, an oxazine derivative and a nitro bromo alcohol, e.g., 2-bromo-2-nitropropane-1,3-diol, 1,1,1-dibromo-1-nitro-2-ethanol or 1,1-dibromo-1-nitro-2-propanol are preferably used.

As the chelating agent, for example, ethylenediaminetetraacetic acid, potassium salt thereof, sodium salt thereof, diethylenetriaminepentaacetic acid, potassium salt thereof, sodium salt thereof, triethylenetetraminehexaacetic acid, potassium salt thereof, sodium salt thereof; hydroxyethylethylenediaminetriacetic acid, potassium salt thereof, sodium salt thereof; nitrilotriacetic acid, sodium salt thereof; organic phosphonic acids, for example, 1-hydroxyethane-1,1-diphosphonic add, potassium salt thereof, sodium salt thereof; aminotri(methylenephosphonic acid), potassium salt thereof, sodium salt thereof; and phophonoalkanetricarboxylic acids are illustrated. A salt of an organic amine is also effectively used in place of the sodium salt or potassium salt in the chelating agents.

As the defoaming agent, for example a conventional silicone-based self-emulsifying type or emulsifying type defoaming agent, and a nonionic surfactant having HLB of 5 or less are used. The silicone defoaming agent is preferably used. Any of emulsifying dispersing type and solubilizing type an be used.

As the organic acid, for example, citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid and an organic phosphonic acid are illustrated. The organic acid can also be used in the form of an alkali metal salt or an ammonium salt.

As the inorganic acid and inorganic salt, for example, phosphoric acid, methaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexamethaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate and nickel sulfate are illustrated.

The developer described above can be used as a developer and a development replenisher for an exposed negative-working lithographic printing plate precursor, and it is preferably applied to an automatic processor described hereinafter. In the case of conducting the development processing using an automatic processor, the developer becomes fatigued in accordance with the processing amount, and hence the processing ability may be restored using a replenisher or a fresh developer. Such a replenishment system can be preferably applied to the plate-making method of the lithographic printing plate precursor according to the invention.

The development processing using the aqueous solution having pH of 2 to 10 according to the invention is preferably performed by an automatic processor equipped with a supplying means for a developer and a rubbing member. As the automatic processor, there are illustrated an automatic processor in which a lithographic printing plate precursor after image-recording is subjected to a rubbing treatment while it is transporting described in JP-A-2-220061 and JP-A-60-59351, and an automatic processor in which a lithographic printing plate precursor after image-recording placed on a cylinder is subjected to a rubbing treatment while rotating the cylinder described in U.S. Pat. Nos. 5,148,746 and 5,568,768 and British Patent 2,297,719. Among them, the automatic processor using a rotating brush roll as the rubbing member is particularly preferred.

The rotating brush roller which can be preferably used in the invention can be appropriately selected by taking account, for example, of scratch resistance of the image area and nerve strength of the support of the lithographic printing plate precursor. As for the rotating brush roller, a known rotating brush roller produced by implanting a brush material in a plastic or metal roller can be used. For example, a rotating brush roller described in JP-A-58-159533 and JP-A-3-100554, or a brush roller described in JP-U-B62-167253 (the term "JP-UM-B" as used herein means an "examined Japanese utility model publication"), in which a metal or plastic groove-type member having implanted therein in rows a brush material is closely radially wound around a plastic or metal roller acting as a core, can be used.

As the brush material, a plastic fiber (for example, a polyester-based synthetic fiber, e.g., polyethylene terephthalate or polybutylene terephthalate; a polyamide-based synthetic fiber, e.g., nylon 6.6 or nylon 6.10; a polyacrylic synthetic fiber, e.g., polyacrylonitrile or polyalkyl (meth)acrylate; and a polyolefin-based synthetic fiber, e.g., polypropylene or polystyrene) can be used. For instance, a brush material having a fiber bristle diameter of 20 to 400 μm and a bristle length of 5 to 30 mm can be preferably used.

The outer diameter of the rotating brush roller is preferably from 30 to 200 mm, and the peripheral velocity at the tip of the brush rubbing the plate surface is preferably from 0.1 to 5 m/sec.

Further, it is preferred to use a plurality, that is, two or more of the rotating brush rollers.

The rotary direction of the rotating brush roller for use in the invention may be the same direction or the opposite direction with respect to the transporting direction of the lithographic printing plate precursor of the invention, but when two or more rotating brush rollers are used in an automatic processor as shown in FIG. 1, it is preferred that at least one rotating brush roller rotates in the sane direction and at least one rotating brush roller rotates in the opposite direction with respect to the transporting direction. By such arrangement, the photosensitive layer in the non-image area can be more steadily removed. Further, a technique of rocking the rotating brush roller in the rotation axis direction of the brush roller is also effective.

The developer can be used at an appropriate temperature, and the developer temperature is preferably from 10 to 50° C.

In the invention, the lithographic printing plate after the rubbing treatment may be subsequently subjected to water washing, a drying treatment and an oil-desensitization treatment, if desired. In the oil-desensitization treatment a known oil-desensitizing solution can be used.

Further, in a plate-making process of the lithographic printing plate precursor to prepare a lithographic printing plate according to the invention, the entire surface of the lithographic printing plate precursor may be heated, if desired, before or during the exposure or between the exposure and the development. By the heating, the image-forming reaction in the photosensitive layer is accelerated and advantages, for example, improvement in the sensitivity and printing durability and stabilization of the sensitivity are achieved. For the purpose of increasing the image strength and printing durability, it is also effective to perform entire after-beating or entire exposure of the image after the development. Ordinarily the heating before the development is preferably performed under a mild condition of 150° C. or lower. When the temperature is too high, a problem may arise in that undesirable fog occurs in the non-image area. On the other hand, the heating after the development can be performed using a very strong condition. Ordinarily, the heat treatment is carried out in a temperature range of 100 to 500° C. When the temperature is too low, a sufficient effect of strengthening the image may not be obtained, whereas when it is excessively high, problems of deterioration of the support and thermal decomposition of the image area may occur.

In advance of the above-described development processing, the lithographic printing plate precursor is laser exposed through a transparent original laving a line image, a halftone dot image or the like, or imagewise exposed, for example, by scanning of laser beam based on digital data.

The desirable wavelength of V=e light source is from 350 to 450 nm, and specifically, an InGaN semiconductor laser is preferably used. The exposure mechanism may be any of an internal drum system, an external drum system and a flat bed system.

As for the available laser light source of 350 to 450 nm, the followings can be used.

A gas laser, for example, Ar ion laser (364 nm, 351 nm, 10 mW to 1 W), Kr ion laser (356 nm, 351 nm, 10 mW to 1 W) and He—Cd laser (441 nm, 325 nm, 1 mW to 100 mW); a solid laser, for example, a combination of Nd:YAG ($YVO_4$) with SHG crystals×twice (355 nm, 5 mW to 1 W) and a combination of Cr:LiSAF with SHG crystal (430 nm, 10 mW); a semiconductor laser system, for example, a $KNbO_3$ ring resonator (430 nm, 30 mW), a combination of a waveguide-type wavelength conversion element with an AlGaAs or InGaAs semiconductor (380 nm to 450 nm, 5 mW to 100 mW), a combination of a waveguide-type wavelength conversion element with an AlGaInP or AlaAs semiconductor (300 nm to 350 nm, 5 mW to 100 mW), and AlGaInp (350 nm to 450 nm, 5 mW to 30 mW); a pulse laser, for example, $N_2$ laser (337 nm-4 pulse 0.1 to 10 mJ) and XeF (351 nm, pulse 10 to 250 mJ) can be used. Among the light sources, the AlGaInN semiconductor laser (commercially available InGaN semiconductor laser, 400 to 410 nm, 5 to 30 mW) is particularly preferable in view of the wavelength characteristics and cost.

As for the exposure apparatus for the lithographic printing plate precursor of scanning exposure system, the exposure mechanism includes an internal drum system, an external drum system and a flat bed system. As the light source, among the light sources described above, those capable of conducting continuous oscillation can be preferably utilized. In practice, the exposure apparatuses described below are particularly preferable in view of the relationship between the sensitivity of photosensitive material and the time for plate-making.

A single beam to triple beam exposure apparatus of internal drum system, using one or more gas or solid laser light sources so as to provide a semiconductor laser having a total output of 20 mW or more A multi-beam (from 1 to 10 beams) exposure apparatus of flat bed system, using one or more semiconductor, gas or solid lasers so as to provide a total output of 20 mW or more A multi-beam (from 1 to 9 beams) exposure apparatus of external drum system using one or more semiconductor, gas or solid lasers so as to provide a total output of 20 mW or more A multi-beam (10 or more beams) exposure apparatus of external drum system, using one or more semiconductor or solid lasers so as to provide a total output of 20 mW or more In the laser direct drawing-type lithographic printing plate precursor, the following equation (eq 1) is ordinarily established among the sensitivity X ($J/cm^2$) of photosensitive material the exposure area S ($cm^2$) of photosensitive material the power q W) of one laser light source, the number n of lasers and the total exposure time t (s):

$$X \cdot S = n \cdot q \cdot t \quad (eq\ 1)$$

i) In the case of the internal drum (single beam) system

The following equation (eq 2) is ordinarily established among the laser revolution number f (radian/s), the sub-scanning length Lx (cm) of photosensitive material, the resolution Z (dot/cm) and the total exposure time t (s):

$$f \cdot Z \cdot t = Lx \quad (eq\ 2)$$

ii) In the case of the external drum (multi-beam) system

The following equation (eq 3) is ordinarily established among the drum revolution number F (radian/s), the sub-scanning length Lx (cm) of photosensitive material, the resolution Z (dot/cm), the total exposure time t (s) and the number (n) of beams:

$$F \cdot Z \cdot n \cdot t = Lx \quad (eq\ 3)$$

iii) In the case of the flat bed (multi-beam) system

The following equation (eq 4) is ordinarily established among the revolution number H (radian/s) of polygon mirror, the sub-scanning length Lx (cm) of photosensitive material, the resolution Z (dot/cm), the total exposure time t(s) and the number (n) of beams:

$$H \cdot Z \cdot n \cdot t = Lx \quad (eq\ 4)$$

When the resolution (2,560 dpi) required for a practical printing plate, the plate size (A1/B1, sub-scanning length: 42 inch), the exposure condition of about 20 sheets/hour and the photosensitive characteristics (photosensitive wavelength, sensitivity: about 0.1 $mJ/cm^2$) of the lithographic printing plate precursor according to the invention are substituted for the above equations, it can be understood that the lithographic printing plate precursor according to the invention is preferably combined with a multi-beam exposure system using a laser having a total output of 20 mW or more, and on taking account of operability, cost and the like, most preferably combined with an external drum system semiconductor laser multi-beam (10 or more beams) exposure apparatus.

EXAMPLES

The present invention will be described in more detail with reference to the following examples, but the invention should not be construed as being toted thereto.

[Preparation of Support]

An aluminum plate (material: 1050) having a thickness of 0.3 mm was subjected to a degrease treatment with an aqueous 10% by weight sodium aluminate solution at 50° C. for 30 seconds in order to remove rolling oil on the surface thereof, Thereafter, the aluminum plate surface was grained using ee nylon brushes implanted with bundled bristles having a diameter of 0.3 mm and an aqueous tension (specific gravity: 1.1 $g/cm^3$) of pumice having a median diameter of 25 μm and then thoroughly washed with water. The plate was etched by dipping it in an aqueous 25% by weight sodium hydroxide solution at 45° C. for 9 seconds and after washing with water, dipped in an aqueous 20% by weight nitric acid solution at 60° C. for 20 seconds, followed by washing with water. The etching amount of the grained surface was about 3 $g/m^2$.

Subsequently, the aluminum plate was subjected to a continuous electrochemical surface roughening treatment using alternate current voltage of 60 Hz. The electrolytic solution used was an aqueous 1% by weight nitric acid solution (containing 0.5% by weight of aluminum ion) at a liquid temperature of 50° C. The electrochemical surface roughening treatment was performed using a rectangular wave alternate current having a trapezoidal waveform such that the time TP necessary for the current value to reach the peak from zero was 0.8 msec and the duty ratio was 1:1, and disposing a carbon electrode as the counter electrode. The auxiliary anode used was ferrite. The current density was 30 $A/dm^2$ in terms of the peak value of current, and 5% of the current flowing from the power source was divided to the auxiliary anode. The quantity of electricity at file nitric acid electrolysis was 175 $C/dm^2$ when the aluminum plate was serving as the anode. Then, the aluminum plate was washed with water by spraying.

Subsequently, the aluminum plate was subjected to an electrochemical surface roughening treatment in the same manner as in the nitric acid electrolysis above using, as the electrolytic solution, an aqueous 0.5% by weight hydrochloric acid solution (containing 0.5% by weight of aluminum ion) at a liquid temperature of 50° C. under the conditions that the quantity of electricity was 50 C/dm² when the aluminium plate was serving as the anode, and then washed with water by spraying. The plate was then treated in an aqueous 15% by weight sulfuric acid solution (containing 0.5% by weight of aluminum ion) as the electrolytic solution at a current density of 15 A/dm² to provide a direct current anodic oxide film of 2.5 g/m², thereafter washed with water and dried.

The center line average roughness Ral (JIS B0601) of the thus-treated aluminum plate was measured using a stylus having a diameter of 2 μM and found to be 0.51 μm.

Further, Undercoat Solution (1) shown below was coated using a bar and dried in an oven at 80° C. for 10 seconds to prepare a support having an undercoat layer having a dry coating amount of 10 mg/m².

| <Undercoat Solution (1)> | |
|---|---|
| Undercoat Compound (1) shown below | 0.017 g |
| Methanol | 9.00 g |
| Water | 1.00 g |

Undercoat Compound (1):

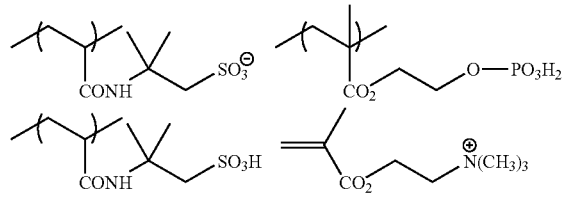

Undercoat Compound (1)

Composition ratio (molar ratio): the left repeating unit/central reating unit/right repeating unit=30/30/40; Weight average molecular weight: 40,000

[Preparation of Lithographic Printing Plate Precursor (1)]

On the support having the undercoat layer provided above, Coating Solution for Photosensitive Layer (1) having the composition shown below was coated using a bar and dried in an oven at 70° C. for 60 seconds to form a photosensitive layer having a dry coating amount of 1.1 g/m². On the photosensitive layer, Coating Solution (1) for Protective Layer having the composition shown below was coated using a bar to have a dry coating amount of 0.75 g/m² and dried at 125° C. for 70 seconds to prepare Lithographic Printing Plate Precursor (1).

| <Coating Solution for Photosensitive Layer (1)> | |
|---|---|
| Binder polymer (1) shown below (average molecular weight: 80,000, acid value: 0 meq/g) | 0.54 g |
| Polymerizable compound Isocyanuric acid EO-modified triacrylate (Aronics M-315, produced by Toa Gosei Co., Ltd.) | 0.40 g |
| Polymerizable compound Ethoxylated trimethylolpropane triacrylate (SR9035, EO addition molar number: 15, molecular weight: 1,000, produced by Nippon Kayaku Co., Ltd.) | 0.08 g |
| Sensitizing dye (1) shown below | 0.06 g |
| Polymerization initiator (1) shown below | 0.18 g |
| Chain transfer agent (1) shown below | 0.07 g |
| Dispersion of ε-phthalocyanine pigment: (pigment: 15 parts by weight; dispersing agent (Binder polymer (1)): 10 parts by weight; solvent (cyclohexanone/methoxypropyl acetate/1-methoxy-2-propanol = 15 parts by weight/20 parts by weight/40 parts by weight)) | 0.40 g |
| Thermal polymerization inhibitor N-nitrosophenylhydroxylamine aluminum salt | 0.01 g |
| Fluorine-based surfactant (1) shown below | 0.001 g |

-continued

| <Coating Solution for Photosensitive Layer (1)> | |
|---|---|
| Polyoxyethylene-polyoxypropylene condensate (Pluronic L44, produced by ADEKA Corp.) | 0.04 g |
| Tetraethylamine hydrochloride | 0.01 g |
| 1-Methoxy-2-propanol | 3.5 g |
| Methyl ethyl ketone | 8.0 g |

Binder polymer (1):

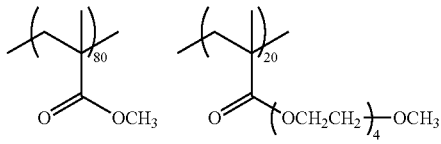

Sensitizing dye (1):

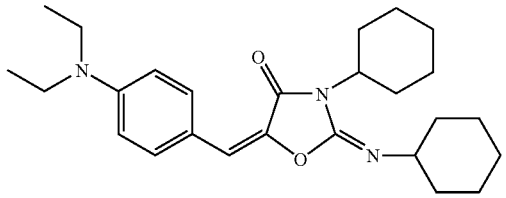

Polymerization initiator (1):

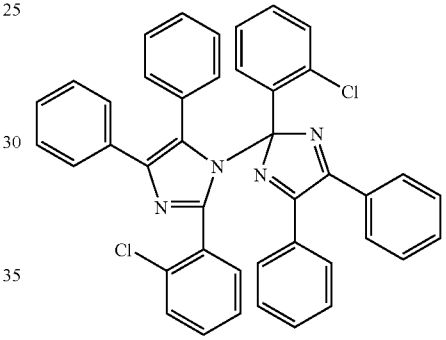

Chain transfer agent (1):

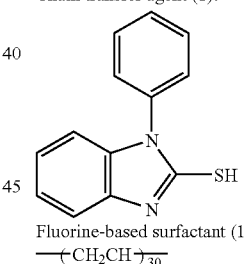

Fluorine-based surfactant (1):

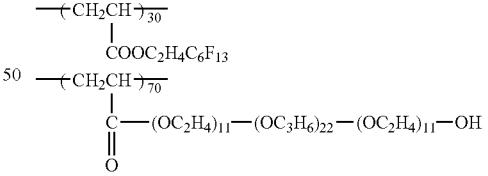

| <Coating Solution (1) for Protective Layer> | |
|---|---|
| Polyvinyl alcohol (saponification degree: 98% by mole; polymerization degree: 500) | 40 g |
| Polyvinyl pyrrolidone (molecular weight: 50,000) | 5 g |
| Vinyl pyrrolidone/vinyl acetate (1/1) copolymer (molecular weight: 70,000) | 0.5 g |
| Surfactant (Emalex 710, produced by Nihon-Emulsion Co., Ltd.) | 0.5 g |
| Water | 950 g |

[Preparation of Lithographic Printing Plate Precursors (2) to (14)]

Lithographic Printing Plate Precursors (2) to (14) were prepared in the same manner as in Lithographic Printing Plate Precursor (1) except for changing Undercoat Compound (1) in Undercoat Solution (1) for Lithographic Printing Plate Precursor (1) to Copolymer 2) to 14) set forth hereinbefore with respect to the copolymer (D), respectively. Composition ratio (molar ratio) and weight average molecular weight of the Copolymer 2) to 14) is as follows.

Copolymer 2)
Composition ratio (molar ratio): the left repeating unit/central reating unit/right repeating unit=30/40/40; Weight average molecular weight: 50,000

Copolymer 3)
Composition ratio (molar ratio): the left repeating unit/cent reating unit/right repeating unit=25/30/45; Weight average molecular weight: 50,000

Copolymer 4)
Composition ratio (molar ratio): the left repeating unit/central reating unit/right repeating unit=35/40/25; Weight average molecular weight: 35,000

Copolymer 5)
Composition ratio (molar ratio): the left repeating unit/central reating unit/right repeating unit=30/40/40; Weight average molecular weight: 50,000

Copolymer 6)
Composition ratio (molar ratio): the left repeating unit/central reating unit/right repeating unit=25/40/35; Weight average mole weight: 35,000

Copolymer 7)
Composition ratio (molar ratio); the left repeating unit/central reating unit/right repeating unit=35/20/45; Weight average molecular weight: 25,000

Copolymer 8)
Composition ratio (molar ratio): the left repeating unit/central reating unit/right repeating unit=30/40/40; Weight average molecular weight: 50,000

Copolymer 9)
Composition ratio (molar ratio); the left repeating unit/central reating unit/right repeating unit=40/30/30; Weight average molecular weight: 30,000

Copolymer 10)
Composition ratio (molar ratio): the left repeating unit/central reating unit/right repeating unit=40/25/35; Weight average molecular weight: 55,000

Copolymer 11)
Composition ratio (molar ratio): the left repeating unit/central reating unit/right repeating unit=30/40/40; Weight average molecular weight: 40,000

Copolymer 12)
Composition ratio (molar ratio): the left repeating unit/central reating unit/right repeating unit=30/30/40; Weight average molecular weight: 30,000

Copolymer 13)
Composition ratio (molar ratio): the left repeating unit/central reating unit/right repeating unit=25/35/40; Weight average molecular weight: 20,000

Copolymer 14)
Composition ratio (molar ratio): the left repeating unit/central reating unit/right repeating unit=30/40/40; Weight average molecular weight: 40,000

[Preparation of Comparative Lithographic Printing Plate Precursor (1)]

Comparative Lithographic Printing Plate Precursor (1) vas prepared in the same manner as in Lithographic Printing Plate Precursor (1) except for changing Undercoat Compound (1) in Undercoat Solution (1) for Lithographic Printing Plate Precursor (1) to Comparative Undercoat Compound (1) shown below.

Comparative Undercoat Compound (I):

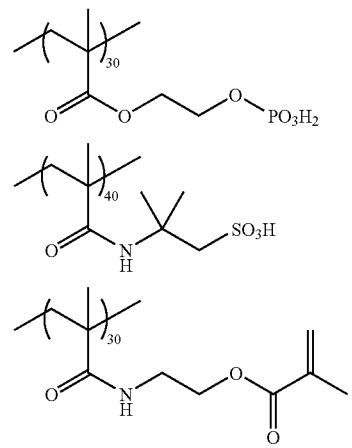

Examples 1 to 14 and Comparative Example 1

(1) Exposure, Development and Printing

Each of Lithographic Printing Plate Precursors (1) to (14) and Comparative Lithographic Printing Plate Precursor (1) was subjected to imagewise exposure using a semiconductor laser of 405 nm having an output of 100 mW while changing energy density.

Then, development processing was performed in an automatic development processor having a structure shown in FIG. 1 using Developer (1) having the composition shown below. The automatic development processor was an automatic processor having two rotating brush rollers. As for the rotating brush rollers used the first brush roller was a brush roller having an outer diameter of 90 mm and being implanted with fiber of polybutylene terephthalate (bristle diameter: 200 μm bristle length: 17 mm), and the brush roller was rotated at 200 rpm in the same direction as the transporting direction (peripheral velocity at the tip of brush: 0.94 m/sec). The second brush roller was a brush roller having an outer diameter of 60 mm and being implanted with fiber of polybutylene terephthalate (bristle diameter: 200 μm, bristle length: 17 mm), and the brush roller was rowed at 200 rpm in the opposite direction to the transporting direction (peripheral velocity at the tip of brush: 0.63 m/sec). The transportation of the lithographic printing plate precursor was performed at a transporting speed of 100 cm/min.

The developer was supplied on the surface of the lithographic printing plate precursor by showering from a spray pipe using a circulation pump. The tank volume for the developer was 10 liters. The pH of the developer for use in the development processing was adjusted to 5.5 by using phosphoric acid and sodium hydroxide.

| Developer (1) | |
|---|---|
| Water | 100 g |
| Sodium alkylnaphthalenesulfonate (Pelex NB-L, produced by Kao Corp.) | 5 g |
| Gum arabic | 1 g |
| Ammonium primary phosphate | 0.05 g |
| 2-Hydroxypropyl starch | 1 g |
| Citric acid | 0.05 g |
| Tetrasodium salt of ethylenediaminetetraacetate | 0.05 g |

The lithographic printing plate after development was mounted on a printing machine, SOR-M, produced by Heidelberg, and printing was performed at a printing speed of 6,000 sheets per hour using dampening water (EU-3 (etching solution, produced by Fuji Photo Film Co., Ltd.))/water/isopropyl alcohol=1/89/10 (by volume ratio)) and TANS-G(N) black ink (produced by Dai-Nippon Ink & Chemicals, Inc.).

(2) Evaluation

With respect to the lithographic printing plate precursors, developing property, stain resistance, printing durability and stain-preventing property after being left were evaluated in the manner described below.

<Developing Property>

The lithographic printing plate precursor was subjected to the image exposure and development processing in the same manner as described above, and then the non-image area of the resulting lithographic printing plate was visually observed to evaluate the presence or absence of the residue of the photosensitive layer according to the following criteria:

O: residual layer was not observed

Δ: residual layer was faintly observed x: residual layer was distinctly observed <Stain Resistance and Printing Durability>

As the increase in the number of printing sheets when the printing was performed under the above-described printing conditions, the image area of the lithographic printing plate was gradually abraded to cause decrease in the ink receptivity, resulting in decrease of ink density of the image on printing paper. The number of printed materials obtained until the ink density (reflection density) decreased by 0.1 from that at the initiation of printing was determined to evaluate the printing durability. Also, the presence or absence of stain in the non-age area was also visually observed according to the following criteria:

OO: stain was not observed at all

O: stain was hardly observed

Δ: stain was faintly observed x: stain was distinctly observed

<Stain-Preventing Property after being Left>

After printing of 10,000 sheets under the above-described printing conditions, the printing was stopped and the printing plate was left on the printing machine for one hour. Then, the printing was restarted and stain on the blanket in the non-image area was visually evaluated. The stain-preventing property after being left was evaluated on 4 grades of OO, O, Δ and x in the order of increasing the on the blanket OO: stain was not observed at all O: stain was hardly observed Δ: stain was faintly observed x: stain was distinctly observed The results obtained are shown in Table 1.

TABLE 1

| | Developing Property | Stain Resistance | Printing Durability | Stain-Preventing Property After Being Left |
|---|---|---|---|---|
| Example 1 | O | OO | 30,000 | OO |
| Example 2 | O | OO | 40,000 | OO |
| Example 3 | O | OO | 45,000 | OO |
| Example 4 | O | OO | 40,000 | OO |
| Example 5 | O | OO | 35,000 | OO |
| Example 6 | O | O | 50,000 | O |
| Example 7 | O | OO | 40,000 | OO |
| Example 8 | O | OO | 45,000 | OO |
| Example 9 | O | OO | 40,000 | OO |
| Example 10 | O | O | 50,000 | O |
| Example 11 | O | OO | 45,000 | OO |
| Example 12 | O | OO | 50,000 | OO |
| Example 13 | O | OO | 50,000 | OO |
| Example 14 | O | OO | 43,000 | OO |
| Comparative Example 1 | Δ | Δ | 25,000 | X |

As is apparent from the results shown in Table 1, the lithographic printing plate precursors using the specific copolymer (D) according to the invention are excellent in the developing property, stain resistance, printing durability and stain-preventing property after being left in comparison with the comparative example.

This application is based on Japanese Patent application JP 2006-229244, filed Aug. 25, 2006, the entire content of which is hereby incorporated by reference, the same as if fully set forth herein.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A lithographic printing plate precursor comprising: a support; and a photosensitive layer comprising (A) an initiator compound, (B) a polymerizable compound and (C) a binder, wherein the photosensitive layer or other layer in contact with the support comprises as (D) a component different from the component (C), a copolymer comprising (a1) a repeating unit having at least one ethylenically unsaturated bond introduced through an ion pair, wherein the repeating unit (a1) includes a repeating unit represented by Formula (A1):

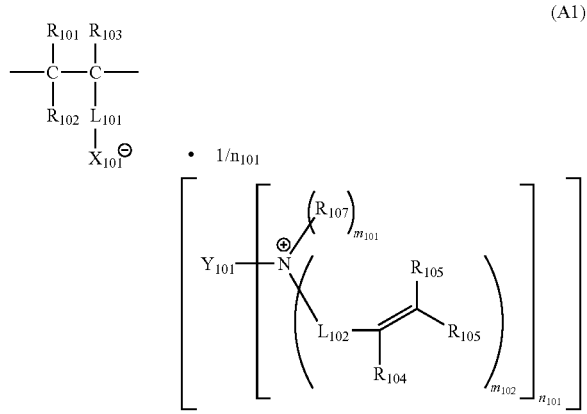

wherein $R_{101}$ to $R_{103}$ each independently represents a hydrogen atom, an alkyl group having from 1 to 6 carbon atoms, —$CH_2$—OH, —$CH_2$—$OR_{112}$, —$CH_2$—O—CO—$R_{112}$ or a halogen atom;

$R_{104}$ to $R_{106}$ each independently represents a hydrogen atom, an alkyl group having from 1 to 6 carbon atoms, a halogen atom, —$CH_2$—OH, —$CH_2$—$OR_{108}$, —$CO_2$—O—CO—$R_{108}$, —CO—$R_{108}$, —O—CO—$R_{108}$ or —CO—N($R_{109}$)—$R_{108}$, wherein —$R_{104}$ and $R_{105}$ or $R_{105}$ and $R_{106}$ may be combined with each other to form a ring;

$R_{107}$ represents a methyl group, an ethyl group or a benzyl group;

$R_{108}$ represents an alkyl group having from 1 to 10 carbon atoms or an aryl group having from 6 to 10 carbon atoms;

$R_{109}$ represents a hydrogen atom, an alkyl group having from 1 to 10 carbon atoms or an aryl group having from 6 to 10 carbon atoms;

$R_{112}$ represents an alkyl group having from 1 to 10 carbon atoms, an aryl group having from 6 to 10 carbon atoms or an aralkyl group having from 7 to 20 carbon atoms;

$L_{101}$ represents a divalent connecting group selected from the group consisting of —CO—, —O—, —S—, —N($R_{109}$)—, —$SO_2$—, a divalent aliphatic group, a divalent aromatic group and a combination thereof;

$L_{102}$ represents a divalent connecting group selected from the group consisting of —CO—, —O—, —N($R_{109}$)—, a divalent aliphatic group, a divalent aromatic group and a combination thereof;

$m_{101}$ represents an integer of 0 to 2;

$m_{102}$ represents an integer of 1 to 3;

$m_{101}+m_{102}=3$;

when $m_{101}$ is 2 or more, plural $R_{107}$ groups may be the same or different from each other, when $m_{102}$ is 2 or more, plural $R_{104}$, $R_{105}$, $R_{106}$ and $L_{102}$ groups may be the same or different from each other, respectively;

$X_{101}^-$ represents —$CO_2^-$, —$PO_3H^-$, —O—$PO_3H^-$, —$SO_3^-$ or —O—$SO_3^-$;

$Y_{101}$ represents an $n_{101}$-valent connecting group; and $n_{101}$ represents an integer of 1 to 10;

and (a2) a repeating unit having at least one functional group capable of interacting with a surface of the support.

2. The lithographic printing plate precursor as claimed in claim 1, wherein the other layer is an undercoat layer provided between the support and the photosensitive layer.

3. The lithographic printing plate precursor as claimed in claim 1, wherein at least one of structures including the ethylenically unsaturated bond in the repeating unit (a1) is a (meth)acrylic acid ester group, a (meth)acrylic amido group, an aromatic vinyl group or an allyl group.

4. The lithographic printing plate precursor as claimed in claim 1, wherein at least one of the functional groups capable of interacting with a surface of the support is a sulfonic acid group or a salt thereof, a phosphoric ester group or a salt thereof or a phosphonic acid group or a salt thereof.

5. The lithographic printing plate precursor as claimed in claim 1, wherein at least one of the ion pairs in the repeating unit (a1) is a combination of an anion of a group selected from a sulfonic acid group, a phosphoric acid group and a phosphonic acid group with an ammonium cation.

6. The lithographic printing plate precursor as claimed in claim 1, wherein the component (D) further comprises (a3) a repeating unit having at least one hydrophilic group other than the repeating unit (a1).

7. The lithographic printing plate precursor as claimed in claim 1, wherein the photosensitive layer further comprises (E) a sensitizing dye having an absorption maximum in a wavelength range of from 350 to 450 nm.

8. The lithographic printing plate precursor as claimed in claim 1, wherein an acid value of the binder (C) is 0.3 meq/g or less.

9. A method for preparation of a lithographic printing plate comprising exposing the lithographic printing plate precursor as claimed in claim 8 using an exposure apparatus equipped with a light source having an oscillation wavelength in a range of from 350 to 450 nm and rubbing a surface of the exposed lithographic printing plate precursor with a rubbing member in the presence of a developer having pH of from 2 to 10 in an automatic processor equipped with the rubbing member to remove an unexposed area of the photosensitive layer.

10. The lithographic printing plate precursor of claim 1, wherein in Formula (A1), $R_{101}$ and $R_{102}$ each independently represents a hydrogen atom, a methyl group or an ethyl group;

$R_{103}$ represents a hydrogen atom, a methyl group, —$CH_2$—OH or —$CH_2$—O—CO—(C1 to C4 alkyl);

$R_{104}$ represents a hydrogen atom, a methyl group, —$CH_2$—OH, —$CH_2$—O—CO—(C1 to C4 alkyl), —CO—O—(C1 to C4 alkyl) or —CO—NH—(C1 to C4 alkyl);

$R_{105}$ and $R_{106}$ each independently represents a hydrogen atom, a methyl group or an ethyl group;

$R_{107}$ represents a methyl group, an ethyl group or a benzyl group;

$R_{108}$ represents a methyl group, an ethyl group, an n-propyl group, an isopropyl group, an n-butyl group or a phenyl group;

$R_{109}$ represents a hydrogen atom, a methyl group, an ethyl group, an n-propyl group, an isopropyl group, an n-butyl group or a phenyl group;

$L_{101}$ represents —CO—O-L0, —CO—NH-L0—, —CO—NH-L0-, -divalent aromatic group-or -divalent aromatic group-L0-;

L0 represents a divalent aliphatic group, a divalent aromatic group or a combination thereof;

$L_{102}$ represents any one of La to Lr shown below (L0 has the same meaning as defined above):

La: -L0—O—CO—
Lb: -L0—NH—CO—
Lc: -L0—O—
Ld: -L0—CO—O—
Le: -L0—O—CO—O—
Lf: -L0—O—$CH_2$—
Lg: -L0—CO—O—$CH_2$—
Lh: -L0—O—CO—O—$CH_2$—
Li: -L0—O—CO—NH-L0-O—CO—
Lj: -L0—O—CO-L0-O—CO—
Lk: -L0—O—CO-L0-NH—CO—
Ll: -L0—CO—O-L0-O—CO—
Lm: -L0—CO—O-L0-NH—CO—
Ln: -L0-divalent aromatic group-
Lo: —O—CO-divalent aromatic group-
Lp: —O—CO-L0-divalent aromatic group-
Lq: —CO—O-divalent aromatic group-
Lr: —CO—O-L0-divalent aromatic group-;

$m_{101}$ represents an integer of from 0 to 3 and $m_{102}$, represents an integer of from 1 to 3 provided that $m_{101}+m_{102}=3$;

the numeric number of $m_{102} \times n_{101}$ is from 1 to 6;

when $m_{101}$ is 2 or more, the plural $R_{107}$ groups may be the same or different from each other, when $m_{102}$ is 2 or more, the plural $R_{104}$, $R_{105}$, $R_{106}$ and $L_{102}$ groups may be the same or different from each other, respectively;

$X_{101}^-$ represents $-CO_2^-$, $-PO_3H^-$, $-O-PO_3H^-$ or $-SO_3^-$;

$Y_{101}$ represents an $n_{101}$-valent hydrocarbon residue, which may include any of aliphatic and aromatic structures and straight-chain, branched and cyclic structures, wherein the cyclic structure may be any of monocyclic and polycyclic structures, and wherein the carbon—carbon linkage constituting the hydrocarbon residue may be interrupted with a structure selected from $-CO-$, $-O-$, $-S-$, $-N(R_{109})-$, $-SO_2-$ and a combination thereof; and $n_{101}$ represents an integer of from 1 to 6, provided that $m_{102} \times n_{101}$ is not 0.

\* \* \* \* \*